(12) United States Patent
Yoshida

(10) Patent No.: US 9,396,676 B2
(45) Date of Patent: Jul. 19, 2016

(54) SEMICONDUCTOR DEVICE, DISPLAY DEVICE AND ELECTRONIC DEVICE

(71) Applicant: Semiconductor Energy Laboratory Co., Ltd., Atsugi-shi, Kanagawa-ken (JP)

(72) Inventor: Yasunori Yoshida, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/927,705

(22) Filed: Oct. 30, 2015

(65) Prior Publication Data

US 2016/0117966 A1    Apr. 28, 2016

Related U.S. Application Data

(60) Continuation of application No. 14/170,704, filed on Feb. 3, 2014, now Pat. No. 9,177,667, which is a continuation of application No. 13/443,968, filed on Apr. 11, 2012, now Pat. No. 8,643,400, which is a (Continued)

(30) Foreign Application Priority Data

Dec. 28, 2005    (JP) ................. 2005-378262

(51) Int. Cl.
  H03K 19/177    (2006.01)
  G09G 3/20      (2006.01)
  G09G 3/36      (2006.01)

(52) U.S. Cl.
  CPC ............... *G09G 3/20* (2013.01); *G09G 3/3688* (2013.01); *G09G 2310/0286* (2013.01); *G09G 2330/021* (2013.01)

(58) Field of Classification Search
  CPC .......... G09G 3/3688; G09G 2330/021; G09G 2310/0286
  USPC ............................................. 345/100; 326/46
  See application file for complete search history.

(56) References Cited

U.S. PATENT DOCUMENTS 4,295,055 A    10/1981    Takemoto et al.
5,859,630 A    1/1999     Huq (Continued)

FOREIGN PATENT DOCUMENTS

CN    001378193 A    11/2002
CN    001438706 A    8/2003

(Continued)

OTHER PUBLICATIONS

Miyazawa.T et al., "21.3: An Improved Dynamic Ratio Less Shift Register Circuit Suitable for LTPS-TFT LCD Panels", SID Digest '05 : SID International Symposium Digest of Technical Papers, May 24, 2005, vol. 36, pp. 1050-1053.

(Continued)

*Primary Examiner* — Don Le
(74) *Attorney, Agent, or Firm* — Fish & Richardson P.C.

(57) ABSTRACT

To provide a semiconductor device which operates stably with few malfunctions due to noise, with low power consumption, and little variation in characteristics; a display device including the semiconductor device; and an electronic device including the display device. An output terminal is connected to a power supply line, thereby reducing variation in electric potential of the output terminal. In addition, a gate electrode potential which turns ON a transistor is maintained due to the capacitance of the transistor. Further, change in characteristics of the transistor is reduced by a signal line for reverse bias.

13 Claims, 38 Drawing Sheets

Related U.S. Application Data continuation of application No. 12/960,709, filed on Dec. 6, 2010, now Pat. No. 8,159,267, which is a division of application No. 12/244,348, filed on Oct. 2, 2008, now Pat. No. 7,847,593, which is a division of application No. 11/612,217, filed on Dec. 18, 2006, now Pat. No. 7,432,737.

(56) References Cited

U.S. PATENT DOCUMENTS

| | | |
|---|---|---|
| 6,295,046 B1 | 9/2001 | Hebiguchi |
| 6,339,631 B1 | 1/2002 | Yeo et al. |
| 6,621,886 B2 | 9/2003 | Kawahata |
| 6,661,397 B2 | 12/2003 | Mikami et al. |
| 6,690,347 B2 | 2/2004 | Jeon et al. |
| 6,781,805 B1 | 8/2004 | Urakawa |
| 6,788,231 B1 | 9/2004 | Hsueh |
| 6,801,194 B2 | 10/2004 | Miyazawa et al. |
| 6,891,422 B2 | 5/2005 | Shin |
| 6,928,135 B2 | 8/2005 | Sasaki et al. |
| 6,975,142 B2 | 12/2005 | Azami et al. |
| 7,005,909 B2 | 2/2006 | Shin |
| 7,038,653 B2 | 5/2006 | Moon |
| 7,081,786 B2 | 7/2006 | Shin |
| 7,098,882 B2 | 8/2006 | Kitani et al. |
| 7,116,298 B2 | 10/2006 | Miyazawa et al. |
| 7,202,863 B2 | 4/2007 | Kimura et al. |
| 7,206,057 B2 | 4/2007 | Yoo et al. |
| 7,268,760 B2 | 9/2007 | Mikami et al. |
| 7,432,737 B2 | 10/2008 | Yoshida |
| 7,470,932 B2 | 12/2008 | Yoo et al. |
| 7,742,019 B2 | 6/2010 | Takahara |
| 7,777,698 B2 | 8/2010 | Takahara |
| 7,786,985 B2 | 8/2010 | Kimura et al. |
| 7,924,248 B2 | 4/2011 | Takahara |
| 7,932,880 B2 | 4/2011 | Takahara |
| 8,044,906 B2 | 10/2011 | Kimura et al. |
| 8,059,078 B2 | 11/2011 | Kimura et al. |
| 8,063,855 B2 | 11/2011 | Takahara et al. |
| 8,456,402 B2 | 6/2013 | Kimura et al. |
| 8,564,523 B2 | 10/2013 | Moon |
| 8,643,400 B2 | 2/2014 | Yoshida |
| 2002/0047836 A1 | 4/2002 | Miyazawa et al. |
| 2003/0067434 A1 | 4/2003 | Haga et al. |
| 2003/0128180 A1 | 7/2003 | Kim et al. |
| 2003/0151865 A1 | 8/2003 | Maio |
| 2004/0100436 A1 | 5/2004 | Maeda et al. |
| 2004/0217933 A1 | 11/2004 | Miyazawa et al. |
| 2004/0246227 A1 | 12/2004 | Miyazawa et al. |
| 2004/0253781 A1* | 12/2004 | Kimura ............... H01L 27/1255 438/222 |
| 2004/0263506 A1 | 12/2004 | Koyama et al. |
| 2005/0168491 A1 | 8/2005 | Takahara et al. |
| 2005/0170565 A1 | 8/2005 | Fujii et al. |
| 2005/0180083 A1 | 8/2005 | Takahara et al. |
| 2005/0184946 A1 | 8/2005 | Pyoun et al. |
| 2007/0080905 A1 | 4/2007 | Takahara |
| 2007/0132686 A1 | 6/2007 | Kimura et al. |
| 2007/0195920 A1* | 8/2007 | Tobita .................... G11C 19/28 377/64 |
| 2009/0184984 A1 | 7/2009 | Takahara |
| 2010/0111245 A1* | 5/2010 | Tobita .................... G11C 19/28 377/64 |

FOREIGN PATENT DOCUMENTS

| | | |
|---|---|---|
| CN | 001472717 A | 2/2004 |
| CN | 001523547 A | 8/2004 |
| EP | 1087441 A | 3/2001 |
| EP | 1246157 A | 10/2002 |
| EP | 1387491 A | 2/2004 |
| EP | 1624435 A | 2/2006 |
| JP | 11-086586 A | 3/1999 |
| JP | 2001-160615 A | 6/2001 |
| JP | 2002-133890 A | 5/2002 |
| JP | 2002-215118 A | 7/2002 |
| JP | 2003-032096 A | 1/2003 |
| JP | 2004-222256 A | 8/2004 |
| JP | 2005-234580 A | 9/2005 |
| KR | 10-0413872 | 1/2004 |
| KR | 10-0430099 | 5/2004 |
| KR | 2005-0121357 A | 12/2005 |
| TW | 200307896 | 12/2003 |
| TW | 200405235 | 4/2004 |
| TW | 200416653 | 9/2004 |
| TW | 200424995 | 11/2004 |
| TW | 200516539 | 5/2005 |

OTHER PUBLICATIONS

Office Action (Application No. 200610064339.3) Dated Jun. 10, 2010.

Taiwanese Office Action (Application No. 95147927) Dated Jan. 18, 2013.

Korean Office Action (Application No. 2006-0131838) Dated Mar. 5, 2013.

Chinese Office Action (Application No. 201110374123.8) Dated Feb. 17, 2014.

Chinese Office Action (Application No. 201110374123.8) Dated Oct. 22, 2014.

Taiwanese Office Action (Application No. 102136758) Dated Apr. 10, 2015.

* cited by examiner

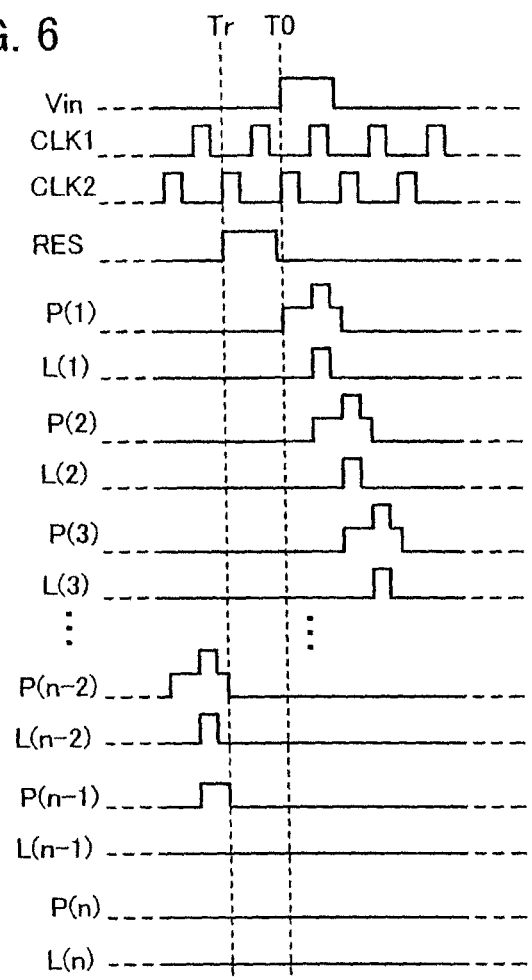

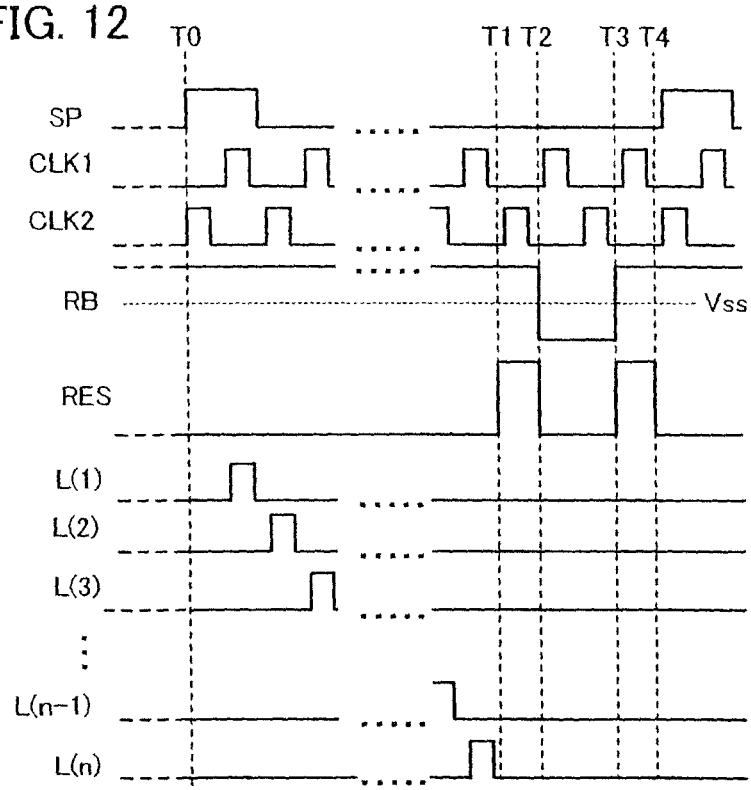

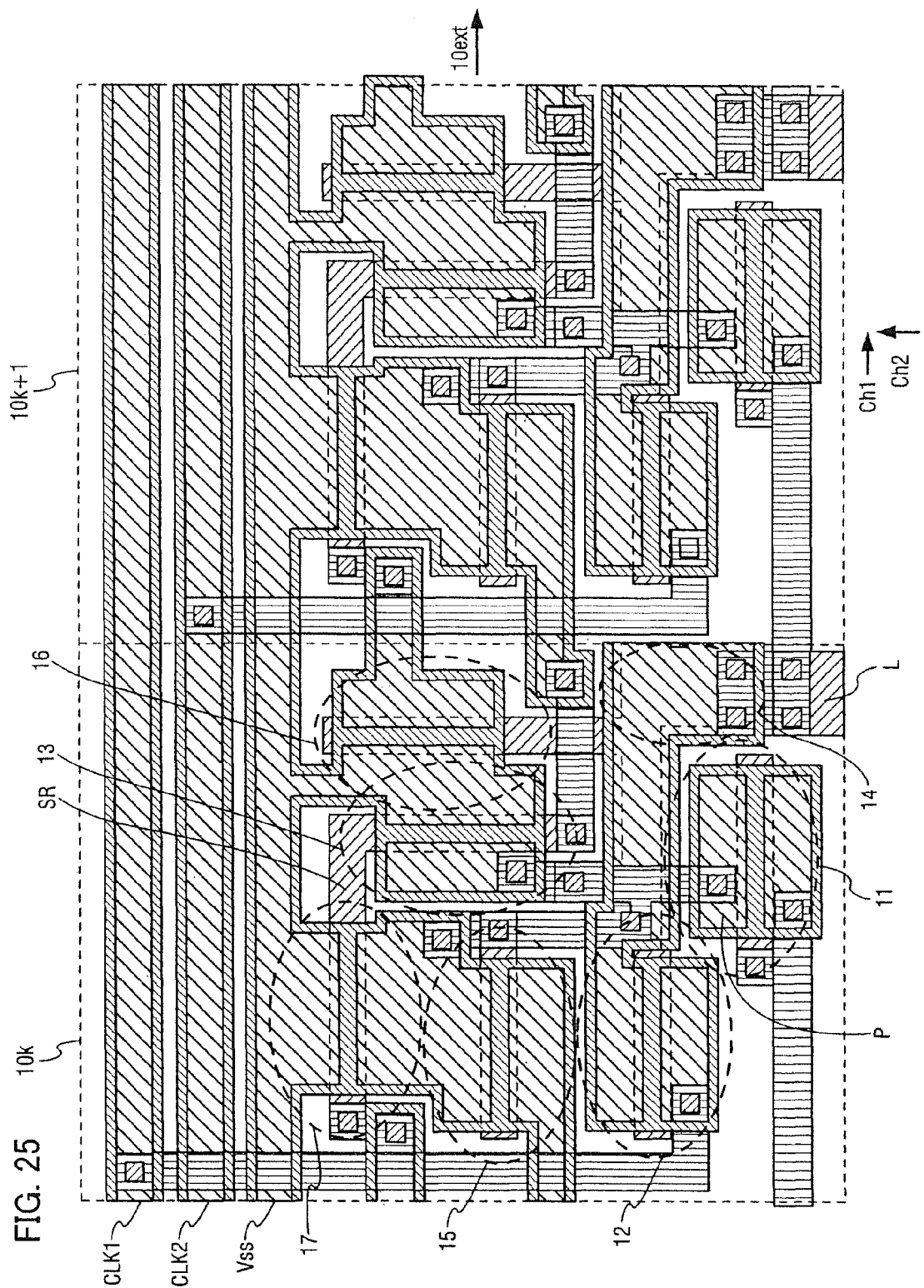

SEMICONDUCTOR DEVICE, DISPLAY DEVICE AND ELECTRONIC DEVICE

CROSS-REFERENCE TO RELATED APPLICATIONS

This application is a continuation of U.S. application Ser. No. 14/170,704, filed Feb. 3, 2014, now allowed, which is a continuation of U.S. application Ser. No. 13/443,968, filed Apr. 11, 2012, now U.S. Pat. No. 8,643,400, which is a continuation of U.S. application Ser. No. 12/960,709, filed Dec. 6, 2010, now U.S. Pat. No. 8,159,267, which is a divisional of U.S. application Ser. No. 12/244,348, filed Oct. 2, 2008, now U.S. Pat. No. 7,847,593, which is a divisional of U.S. application Ser. No. 11/612,217, filed Dec. 18, 2006, now U.S. Pat. No. 7,432,737, which claims the benefit of a foreign priority application filed in Japan as Serial No. 2005-378262 on Dec. 28, 2005, all of which are incorporated by reference.

BACKGROUND OF THE INVENTION

1. Field of the Invention

The present invention relates to a semiconductor device, a display device, and an electronic device.

2. Description of the Related Art

A shift register circuit is a circuit which operates such that content thereof is shifted by one stage each time a pulse is applied. Utilizing this property, shift registers are used in circuits for mutual conversion of serial signals and parallel signals. Such circuits which convert serial signals to parallel signals, or convert parallel signals to serial signals are mainly used for networks having circuits connected to each other. The number of transmission paths for connecting circuits to each other and transmitting signals in a network is often small relative to the amount of data to be transmitted. In such cases, parallel signals are converted into serial signals in a transmitter circuit and are sequentially sent to a transmission path, and serial signals that have been sequentially sent are converted into parallel signals in a receiver circuit. Thus, signals can be exchanged using a small number of transmission paths.

A display device display images by controlling the luminance of each pixel in accordance with image signals inputted from the outside. Here, since it is difficult to use a number of transmission paths of image signals from the outside that is equivalent to the number of pixels, it is necessary to subject the image signals to serial-parallel conversion. Therefore, shift registers are used in both a circuit which transmits image signals to the display device and a circuit for driving the display device which receives the image signals.

A CMOS circuit combining an n-channel transistor and a p-channel transistor is usually used in the above-described shift register circuit. However, in order to form a CMOS circuit combining an n-channel transistor and a p-channel transistor over the same substrate, it is necessary to form transistors having conductivity types opposite to each other over the same substrate, so the manufacturing process inevitably becomes complex. Consequently, increase in cost or decrease in yield of semiconductor devices results.

Therefore, a circuit having transistors which all have the same polarity (also referred to as a unipolar circuit) has been devised. A unipolar circuit makes it possible to omit some of the steps in the manufacturing process, such as the step of adding an impurity element. Thereby, increase in cost and decrease in yield can be suppressed.

For example, consider the case of forming a logic circuit in which all the transistors have n-channel polarity. This circuit has a problem in that when a potential with a high potential power supply is outputted, in accordance with the threshold of the n-channel transistors, voltage of an output signal is attenuated compared to voltage of an input signal. Therefore, a circuit called a bootstrap circuit is widely used so that the voltage of an output signal is not attenuated. A bootstrap circuit is realized when the gate electrode of a transistor capacitively coupled with an output terminal is floated after a transistor connected to the high potential power supply is turned ON so that current begins flowing through a channel. Thus, the electric potential of the output terminal rises and the electric potential of the gate electrode of the transistor also rises correspondingly, so as to eventually exceed the potential of the high potential power supply plus the threshold voltage of the transistor. Thereby, the potential of the output terminal can be made almost equivalent to the potential of the high potential power supply.

Using such a bootstrap circuit, a semiconductor device in which output potential is not attenuated even in the case of using a unipolar transistor can be realized. Further, a shift register circuit can be formed using the bootstrap circuit (for example, Reference 1: Japanese Published Patent Application No. 2002-215118 and Reference 2: SID2005, p. 1050, "An Improved Dynamic Ratio Less Shift Register Circuit Suitable for LTPS-TFT LCD Panels").

SUMMARY OF THE INVENTION

A conventional example in Reference 2 is shown in FIGS. 37A and 37B (note that reference codes and the like have been changed). In a shift register circuit shown in FIGS. 37A and 37B, when an input signal is inputted to Vin, the electric potential of a terminal P1 rises and a transistor connected to a signal line V1 is turned ON. After that, the transistor bootstraps in response to the rise of the electric potential of the signal line V1, so electric potential of the signal line V1 is transmitted to the next stage without attenuation of the potential of the signal line V1. FIG. 37A shows a circuit diagram of the first four stages of the shift register circuit, and so as to aid understanding of the circuit configuration, FIG. 37B shows the part of FIG. 37A which is surrounded by a broken line. FIG. 37B shows the minimum unit for forming the circuit shown in FIG. 37A, and one circuit in FIG. 37B corresponds to one of the output terminals (OUT1 to OUT4) of the circuit in FIG. 37A. In this specification, a structural unit of a circuit, such as that shown in FIG. 37B with respect to FIG. 37A, is referred to as a single stage circuit. Here, a transistor for controlling ON/OFF of the connection between a terminal P1 and a power supply line Vss is turned ON in response to the output in the next stage; however, since the time while the transistor is ON is limited to the period during which the output of the next stage has a higher electric potential (H level), the terminal P1 and the terminal OUT1 are floated during most of the period when a lower electric potential (L level) should be outputted to the terminal OUT1 (also referred to as a non-selection period). This also applies to terminals Px and terminals OUTx in later stages. Accordingly, there has been a problem in that malfunction is caused due to noise generated by a clock signal 1 and a clock signal 2 or noise caused by an electromagnetic wave from outside the circuit.

To counter these problems, in Reference 2, the configuration shown in FIGS. 38A and 38B is used. Note that FIG. 38A is a circuit diagram of the first six stages of a shift register circuit. So as to aid understanding of the circuit configuration, FIG. 38B shows the single stage circuit of FIG. 38A which is surrounded by a broken line in FIG. 38A. In the configuration illustrated in FIGS. 38A and 38B, a period during which a transistor that resets the terminal P1 and terminals Px in later stages to an L level is ON, takes up most of a non-selection period. With this configuration, in the non-selection period, variation in electric potential of the terminal P1 and the terminals Px in later stages can be suppressed to some extent.

However, in the configurations shown in FIGS. 38A and 38B, in the non-selection period, the terminal OUT1 and terminals OUTx in the following stages are floated. Therefore, there is a problem in that a terminal OUT malfunctions due to noise generated by the clock signal 1 and the clock signal 2, or noise caused by an electromagnetic wave from outside the circuit. Further, since a capacitor element is provided between an electrode connected to a gate electrode of the transistor for resetting terminals Px in each stage and the input terminal Vin in the configuration shown in FIGS. 38A and 38B; a load for driving the input terminal Vin is heavy. Therefore, there are also the problems of distortion of waveforms of signals and heavy power consumption. Since the transistor for resetting the terminals Px in each stage is ON during most of the non-selection period, there is also a problem in that voltage stress is heavily biased on the gate electrode and characteristics vary easily.

In view of the above problems, it is an object of the present invention to provide a semiconductor device which operates stably with few malfunctions due to noise, low power consumption, and little variation in characteristics; a display device including the semiconductor device; and an electronic device including the display device.

In the present invention, the term 'display panel' includes a liquid crystal display panel constructed using a liquid crystal element, and a display panel having a light emitting element typified by an electroluminescent (EL) element. Further, the display device includes a display device having the display panel and a peripheral circuit for driving the display panel.

A semiconductor device in accordance with a mode of the present invention includes an input terminal, an output terminal, a first terminal, a second terminal, a third terminal, and a fourth terminal; a first transistor for transmitting electric potential of the first terminal to the output terminal; a rectifying element which turns ON the first transistor in accordance with electric potential of the input terminal; a second transistor which fixes electric potential of the output terminal by conducting electricity the output terminal and the second terminal in accordance with electric potential of the fourth terminal; and a third transistor which fixes electric potential of the third terminal by conducting electricity the third terminal and the second terminal in accordance with the electric potential of the fourth terminal.

A semiconductor device in accordance with another mode of the present invention includes an input terminal, an output terminal, a first terminal, a second terminal, a third terminal, a fourth terminal, and a fifth terminal; a first transistor for transmitting electric potential of the first terminal to the output terminal; a rectifying element which turns ON the first transistor in accordance with electric potential of the input terminal; a second transistor which fixes electric potential of the output terminal by conducting electricity the output terminal and the second terminal in accordance with electric potential of the fifth terminal; a third transistor which fixes electric potential of the third terminal by conducting electricity g the third terminal and the second terminal in accordance with electric potential of the fourth terminal; and a circuit which reverses the electric potential of the third terminal and outputs the electrical potential to the fifth terminal.

A semiconductor device in accordance with another mode of the present invention includes an input terminal, an output terminal, a first terminal, a second terminal, a third terminal, a fourth terminal, a fifth terminal, and a sixth terminal; a first transistor for transmitting electric potential of the first terminal to the output terminal; a first rectifying element which turns ON the first transistor in accordance with electric potential of the input terminal; a second transistor which fixes electric potential of the output terminal by conducting electricity the output terminal and the second terminal in accordance with electric potential of the fourth terminal; a third transistor which fixes electric potential of the third terminal by conducting electricity the third terminal and the second terminal in accordance with the electric potential of the fourth terminal; a second rectifying element for increasing electric potential of the fifth terminal in accordance with the electric potential of the output terminal; and a fourth transistor for connecting lowering electric potential of the sixth terminal by conducting electricity the second terminal the third terminal.

A semiconductor device in accordance with another mode of the present invention includes an input terminal, an output terminal, a first terminal, a second terminal, a third terminal, a fourth terminal, a fifth terminal, a sixth terminal, and a seventh terminal; a first transistor for transmitting electric potential of the first terminal to the output terminal; a first rectifying element which turns ON the first transistor in accordance with electric potential of the input terminal; a second transistor which fixes electric potential of the output terminal by conducting electricity the output terminal and the second terminal in accordance with electric potentials of the seventh terminal; a third transistor which fixes electric potential of the third terminal by conducting electricity the third terminal and the second terminal in accordance with the electric potential of the fourth terminal; a second rectifying element for increasing electric potential of the fifth terminal in accordance with the electric potential of the output terminal; a fourth transistor for connecting lowering electric potential of the sixth terminal by conducting electricity the second terminal the third terminal; and a circuit which reverses the electric potential of the third terminal and outputs the electrical potential to the seventh terminal.

A semiconductor device in accordance with another mode of the present invention includes an input terminal, an output terminal, a first terminal, a second terminal, a third terminal, a fourth terminal, a rectifying element, a first transistor, a second transistor, and a third transistor. One of electrodes of the rectifying element is electrically connected to the input terminal, and the other electrode of the rectifying element is electrically connected to the third terminal; a gate electrode of the first transistor is electrically connected to the third terminal, one of a source electrode and a drain electrode of the first transistor is electrically connected to the first terminal, and the other of the source electrode and the drain electrode of the first transistor is electrically connected to the output terminal, a gate electrode of the second transistor is electrically connected to the fourth terminal, one of a source electrode and a drain electrode of the second transistor is electrically connected to the second terminal, and the other of the source electrode and the drain electrode of the second transistor is electrically connected to the output terminal; and a gate electrode of the third transistor is electrically connected to the fourth terminal, one of a source electrode and a drain electrode of the third transistor is electrically connected to the second terminal, and the other of the source electrode and the drain electrode of the third transistor is electrically connected to the third terminal.

A semiconductor device in accordance with another mode of the present invention includes an input terminal, an output terminal, a first terminal, a second terminal, a third terminal, a fourth terminal, a fifth terminal, a rectifying element, a first transistor, a second transistor, a third transistor, and a potential reversing circuit. One of electrodes of the rectifying element is electrically connected to the input terminal, and the other electrode of the rectifying element is electrically connected to the third terminal; a gate electrode of the first transistor is electrically connected to the third terminal, one of a source electrode and a drain electrode of the first transistor is electrically connected to the first terminal, and the other of the source electrode and the drain electrode of the first transistor is electrically connected to the output terminal; a gate electrode of the second transistor is electrically connected to the fifth terminal, one of a source electrode and a drain electrode of the second transistor is electrically connected to the second terminal, and the other of the source electrode and the drain electrode of the second transistor is electrically connected to the output terminal; a gate electrode of the third transistor is electrically connected to the fourth terminal, one of a source electrode and a drain electrode of the third transistor is electrically connected to the second terminal, and the other of the source electrode and the drain electrode of the third transistor is electrically connected to the third terminal; and one of electrodes of the potential reversing circuit is electrically connected to the third terminal, the other electrode of the potential reversing circuit is electrically connected to the fifth terminal.

A semiconductor device in accordance with another mode of the present invention includes an input terminal, an output terminal, a first terminal, a second terminal, a third terminal, a fourth terminal, a fifth terminal, a sixth terminal, a first rectifying element, a second rectifying element, a first transistor, a second transistor, a third transistor, and a fourth transistor. One of electrodes of the first rectifying element is electrically connected to the input terminal, and the other electrode of the first rectifying element is electrically connected to the third terminal; a gate electrode of the first transistor is electrically connected to the third terminal, one of a source electrode and a drain electrode of the first transistor is electrically connected to the first terminal, and the other of the source electrode and the drain electrode of the first transistor is electrically connected to the output terminal; a gate electrode of the second transistor is electrically connected to the fourth terminal, one of a source electrode and a drain electrode of the second transistor is electrically connected to the second terminal, and the other of the source electrode and the drain electrode of the second transistor is electrically connected to the output terminal; a gate electrode of the third transistor is electrically connected to the fourth terminal, one of a source electrode and a drain electrode of the third transistor is electrically connected to the second terminal, and the other of the source electrode and the drain electrode of the third transistor is electrically connected to the third terminal; one of electrodes of the second rectifying element is electrically connected to the output terminal, and the other electrode of the second rectifying element is electrically connected to the fifth terminal; and a gate electrode of the fourth transistor is electrically connected to the third terminal, one of a source electrode and a drain electrode of the fourth transistor is electrically connected to the second terminal, and the other of the source electrode and the drain electrode of the fourth transistor is electrically connected to the sixth terminal.

A semiconductor device in accordance with another mode of the present invention includes an input terminal, an output terminal, a first terminal, a second terminal, a third terminal, a fourth terminal, a fifth terminal, a sixth terminal, a seventh terminal, a first rectifying element, a second rectifying element, a first transistor, a second transistor, a third transistor, a fourth transistor, and a potential reversing circuit. One of electrodes of the first rectifying element is electrically connected to the input terminal, and the other electrode of the first rectifying element is electrically connected to the third terminal; a gate electrode of the first transistor is electrically connected to the third terminal, one of a source electrode and a drain electrode of the first transistor is electrically connected to the first terminal, and the other of the source electrode and the drain electrode of the first transistor is electrically connected to the output terminal; a gate electrode of the second transistor is electrically connected to the seventh terminal, one of a source electrode and a drain electrode of the second transistor is electrically connected to the second terminal, and the other of the source electrode and the drain electrode of the second transistor is electrically connected to the output terminal; a gate electrode of the third transistor is electrically connected to the fourth terminal, one of a source electrode and a drain electrode of the third transistor is electrically connected to the second terminal, and the other of the source electrode and the drain electrode of the third transistor is electrically connected to the third terminal; one of electrodes of the second rectifying element is electrically connected to the output terminal, and the other electrode of the second rectifying element is electrically connected to the fifth terminal; a gate electrode of the fourth transistor is electrically connected to the third terminal, one of a source electrode and a drain electrode of the fourth transistor is electrically connected to the second terminal, and the other of the source electrode and the drain electrode of the fourth transistor is electrically connected to the sixth terminal; and one of electrodes of the potential reversing circuit is electrically connected to the third terminal, the other electrode of the potential reversing circuit is electrically connected to the seventh terminal.

With the structure of the present invention described above, a shift register circuit which operates stably with little malfunction due to noise can be provided.

Further, in a semiconductor device in accordance with the present invention, the rectifying element may be a diode-connected transistor. In this case, the number of kinds of elements fabricated on the substrate can be reduced; thus, a manufacturing process can be simplified.

Further, a semiconductor device in accordance with the present invention may have a signal line which can turn ON the third transistor and the second transistor. In this case, a shift register circuit of which operation can be stopped at arbitrary timing and can be initialized can be provided.

Further, a semiconductor device in accordance with the present invention may have a signal line which can reverse bias the third transistor and the second transistor. In this case, a shift register circuit which operates stably with less characteristic variation can be provided.

Further, in a semiconductor device in accordance with the present invention, it is preferable that a signals inputted to the first clock signal line and the second clock signal line each have a duty ratio of less than 50%. Further, it is more preferable that a difference between the middle of a period in which a signal inputted to one of them is at the Low level and the middle of a period in which a signal inputted to the other of them is at the High level may be in a range of 10% of the period of time of the clock signals. Thus, intervals between output signals outputted from respective output terminals, and highly sophisticated shift register circuit can be provided.

Further, in a semiconductor device in accordance with the present invention, it is preferable that the average of the area of the gate electrode in the third transistor and the area of the gate electrode in the second transistor is larger than the gate electrode in the first transistor. With this structure, electric potential of an output terminal can be fixed stably, thereby providing a shift register circuit with little malfunction due to noise.

Further, in a semiconductor device in accordance with the present invention, the power supply line, the first clock signal line, and the second clock signal line may be arranged on the opposite side of the output terminal with respect to the first transistor, the third transistor, and the second transistor. With this structure, electric potential of an output terminal can be fixed stably, thereby providing a shift register circuit with little malfunction due to noise.

Further, semiconductor device of the present invention comprises a first wiring layer, a second wiring layer, a third wiring layer, an insulating film, and an interlayer insulating film. The insulating film is formed between the first wiring layer and the second wiring layer. The interlayer insulating film is formed between the second wiring layer and the third wiring layer. The interlayer insulating film is thicker than the insulating film. An electrode electrically connected to the first electrode is formed of at least the second wiring layer. An electrode electrically connected to the output terminal is formed of at least the first wiring layer and the third wiring layer. At a region where the electrode electrically connected to the output terminal and the electrode electrically connected to the first terminal are crossed, the electrode electrically connected to the output terminal may be formed of the third wiring layer. With this structure, electric potential of an output terminal can be fixed stably, thereby providing a shift register circuit with little malfunction due to noise.

Further, in a semiconductor device in accordance with the present invention, the shift register circuit is formed over the substrate provided with the pixel area. With this structure, manufacturing cost of the display panel can be reduced.

Further, in another mode of a semiconductor device in accordance with the present invention, the shift register circuit is provided as an IC over the substrate provided with the pixel area, and is connected to a wiring on the substrate by COG (Chip On Glass). Thus, low power consumption display panel with little characteristic variation can be provided.

Further, in another mode of a semiconductor device in accordance with the present invention, the shift register circuit is provided as an IC over a connection wiring substrate connected to the substrate provided with the pixel area, and connected to a wiring on the substrate by TAB (Tape Automated Bonding). Thus, low power consumption display panel with high reliability and little characteristic variation can be provided.

A semiconductor device in accordance with another mode of the present invention includes a first electrode, a second electrode, a third electrode, a transistor, and a rectifying element. A gate electrode of the transistor is electrically connected to the second electrode, one of a source electrode and a drain electrode of the transistor is electrically connected to the first electrode, and the other of the source electrode and the drain electrode of the transistor is electrically connected to the third electrode; and one of electrodes of the rectifying element is electrically connected to the third electrode, the other electrode of the rectifying element is electrically connected to the second electrode. Thus, a display panel which operates stably with little characteristic variation can be provided.

A semiconductor device in accordance with another mode of the present invention includes a first electrode, a second electrode, a third electrode, a fourth electrode, a first transistor, and a second transistor. A gate electrode of the first transistor is electrically connected to the second electrode, one of a source electrode and a drain electrode of the first transistor is electrically connected to the first electrode, and the other of the source electrode and the drain electrode of the first transistor is connected to the third electrode; and a gate electrode of the second transistor is electrically connected to the fourth electrode, one of a source electrode and a drain electrode of the second transistor is electrically connected to the second electrode, and the other of the source electrode and the drain electrode of the second transistor is electrically connected to the third electrode. Thus, a display panel which operates stably with little characteristic variation can be provided.

Further, a display device in accordance with a mode of the present invention includes the above semiconductor device, an external driver circuit, and a connection wiring substrate; a display panel and the external driver circuit are connected to each other with one connection wiring substrate. Thus, a highly reliable display device with less connection points can be provided.

Further, a display device in accordance with another mode of the present invention includes the above semiconductor device, an external driver circuit, and a plurality of connection wiring substrates; a display panel and the external driver circuit are connected to each other with connection wiring substrate of a number of two or more and the number of division of drivers (a data line driver and a source line driver) or less. Thus, since excellent performance is not required for the driver, even a large display panel with high reliability can be provided.

Further, an electronic device in accordance with the present invention uses the display device as a display portion.

Note that the switch in this specification may be either an electrical switch or a mechanical switch. Any type of switch may be used, as long as it can control the flow of current. A transistor, a diode (a PN diode, a PIN diode, a Schottky diode, a diode-connected transistor, or the like), or a logic circuit in which such diodes are combined may be used. Accordingly, when a transistor is used as a switch, the transistor is operated as simply a switch; therefore, there is no particular limitation on the polarity (conductivity type) of the transistor. However, when low OFF current is desirable, a transistor having a polarity with less OFF current is preferably used. As the transistor with less OFF current, a transistor having an LDD region, a transistor having a multigate structure, or the like can be used. Further, an n-channel transistor is preferably used when the electric potential of a source terminal of the transistor operating as a switch is close to the potential of a lower potential power supply (Vss, GND, or 0 V), whereas a p-channel transistor is preferably used when the transistor operates with the electric potential of the source terminal being close to the potential of a higher potential power supply (Vdd or the like). This helps a transistor easily operate as a switch because the absolute value of the gate-source voltage of the transistor can be increased. Note that a CMOS switch can also be applied, by using both n-channel and p-channel transistors.

The display element is not limited, and for example, a display medium in which contrast is changed by electromagnetic force can be applied, such as an EL element (an organic EL element, an inorganic EL element, or an EL element containing an organic material and an inorganic material), an electron emissive element, a liquid crystal element, an electronic ink, a grating light valve (GLV), a plasma display (PDP), a digital micro mirror device (DMD), a piezoelectric ceramic display, a carbon nanotube, or the like. Note that as display device using an EL element, an EL display can be used; as a display device using an electron emissive element, a field emission display (FED), an SED flat panel display (Surface-conduction Electron-emitter Display), or the like can be used; as a display device using a liquid crystal element, a liquid crystal display can be used; and as a display device using an electronic ink, electronic paper can be used.

There is no limit on the kind of transistor that can be applied to the invention. Transistors which are applicable to the invention include a thin film transistor (TFT) using a non-single crystalline semiconductor film typified by amorphous silicon and polycrystalline silicon, a MOS transistor which is formed using a semiconductor substrate or an SOI substrate, a junction transistor, a bipolar transistor, a transistor using an organic semiconductor or a carbon nanotube, and other kinds of transistors. There is no limit on the kind of substrate over which a transistor is provided, and a transistor can be provided over a single crystalline substrate, an SOI substrate, a glass substrate, or the like.

In the invention, "connected" means "electrically connected". Therefore, in the structures disclosed by the invention, in addition to a predetermined connection, another element which makes electrical connection possible (for example, another element (such as a transistor, a diode, a resistor, or a capacitor), a switch, or the like) may be provided between given connected portions.

There is no particular limitation on the configuration of a transistor. For example, a multigate structure in which the number of gate electrodes is two or more, a structure in which gate electrodes are disposed above and below a channel, a structure in which a gate electrode is disposed above a channel, a structure in which a gate electrode is disposed below a channel, a staggered structure, or an inverted staggered structure may be used. Further, a channel region may be divided into a plurality of regions, and the regions may be connected in parallel or connected in series; a source electrode or a drain electrode may overlap a channel (or a part of a channel); or an LDD region may be provided.

Note that in this specification, a semiconductor device corresponds to a device including a circuit having a semiconductor element (such as a transistor or a diode). In addition, a semiconductor device may be a device in general which can operate utilizing semiconductor characteristics. Further, the term 'display device' may include not only a main body of a display panel in which a plurality of pixels, including display elements such as a liquid crystal element or an EL element, and a peripheral driver circuit for driving the pixels are formed over a substrate, but also a display panel provided with a flexible printed circuit (FPC) or a printed wiring board (PWB). A light emitting device refers in particular to a display device using a self-light emitting display element such as an element used in an EL element or an FED.

Further, among transistors in the present invention, a transistor in which a gate electrode is connected to either a source electrode or a drain electrode is occasionally referred to as a diode-connected transistor. All diode-connected transistors in the present invention can be replaced with another rectifying element such as a PN junction diode, a PIN diode, or a light-emitting diode.

As described above, by utilizing the present invention, a semiconductor device in which a terminal OUT is connected to a power supply line by a second transistor during at least half of a period of time, which operates stably with few malfunctions due to noise; a display device including the semiconductor device; and an electronic device including the display device can be provided.

Further, when the average of the gate area of a third transistor and the gate area of a second transistor is made larger than the gate area of a first transistor, since it is not necessary to connect a capacitor element to an input terminal, load on the input terminal can be minimized. Thus, a semiconductor device with little waveform distortion and low power consumption; a display device including the semiconductor device; and an electronic device including the display device can be provided.

When a diode element or a diode-connected transistor is connected to a gate electrode of a transistor which is ON for a long period, sufficient reverse bias can be applied to the gate electrode of the transistor which is ON for a long period. Thus, a semiconductor device which operates stably and has few variations in characteristics, a display device including the semiconductor device, and an electronic device including the display device can be provided.

BRIEF DESCRIPTION OF DRAWINGS

FIG. 6 illustrates a timechart of a shift register circuit of the present invention.

FIG. 12 illustrates a timechart of a shift register circuit of the present invention.

FIG. 25 is a top view of a shift register circuit of the present invention.

DETAILED DESCRIPTION OF THE INVENTION

Embodiment Modes

Figure 1A:
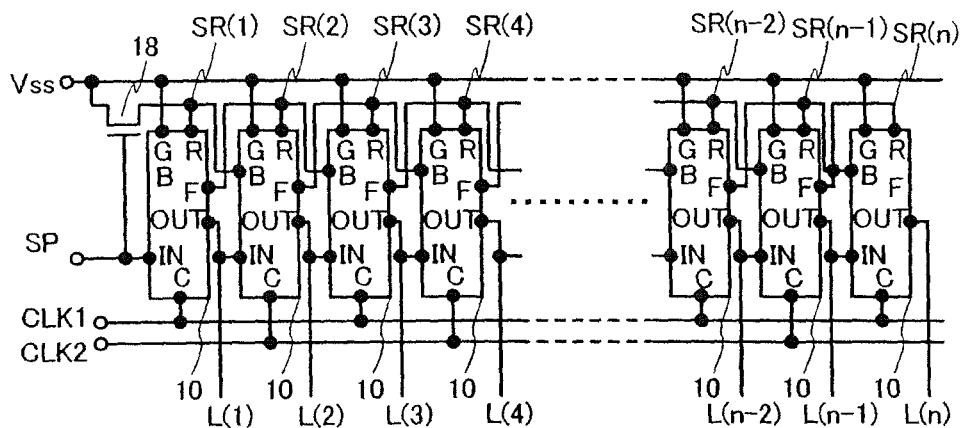
FIGS. 1A to 1C illustrate a shift register circuit of the present invention and a timechart thereof.

Embodiment Modes of the present invention will be described with reference to the drawings. Note that the present invention can be embodied with many different modes, and it is easily understood by those skilled in the art that the modes and details can be variously modified without departing from the spirit and scope of the present invention. Therefore, the present invention should not be construed as being limited to the description of the Embodiment Modes. In the structures of the invention described hereinafter, the same reference numerals are given to the same parts or parts having similar functions in different drawings, and the description of such parts will not be repeated.

Embodiment Mode 1

Figure 1B:
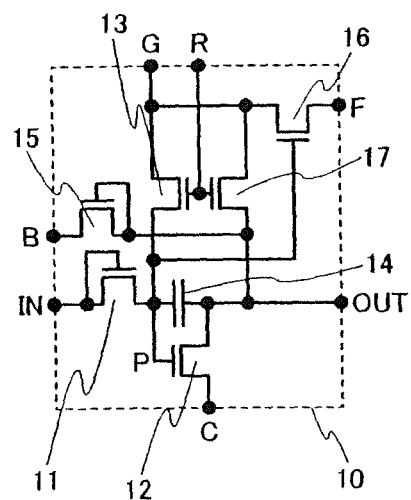
Figure 1C:
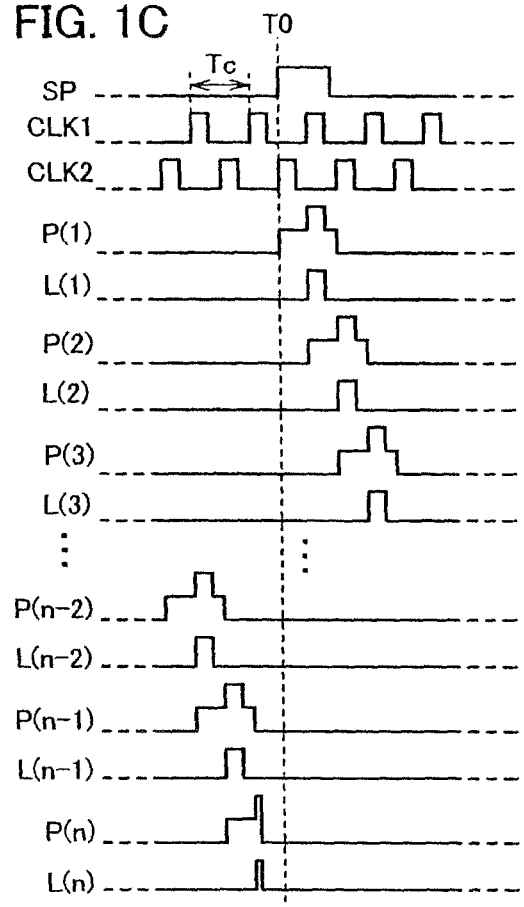

In this embodiment mode, a circuit configuration of a shift register where the electric potential of an output terminal is fixed to a non-selection period, thereby reducing the occurrence of malfunctions due to clock signals or noise, will be described. Circuit configuration examples of a shift register of the present invention are shown in FIGS. 1A to 1C. FIG. 1A shows the entire circuit configuration of a shift register circuit of the present invention. FIG. 1B shows a configuration example of a circuit 10 which shows a single stage circuit of a shift register of the present invention. Note that in this specification, a single stage circuit refers to a minimum unit for forming a circuit, which corresponds to an output terminal (L(1) to L(n)) of the circuit, as does FIG. 1B with respect to FIG. 1A. FIG. 1C shows waveforms of an input signal, an internal electrode, and an output signal in the circuit shown in FIGS. 1A and 1B.

The circuit shown in FIG. 1A is provided with a start pulse terminal SP, a first clock signal line CLK1 (also referred to as a first wiring), a second clock signal line CLK2 (also referred to as a second wiring), a power supply line Vss, a transistor 18, n number of circuits 10 (where n is an integer greater than or equal to two), and an output terminal L(k) (where k is an integer of greater than or equal to one and less than or equal to n) provided corresponding to the circuits 10. In FIGS. 1A to 1C (and all corresponding diagrams in this specification), a kth stage where k is an integer greater than or equal to one and less than or equal to n is not shown; however, the output terminal L(k) is provided between an output terminal L(1) and an output terminal L(n), and a terminal P(k) is provided between a terminal P(1) and a terminal P(n). The circuit 10 shown in FIG. 1B is provided with a terminal IN, a terminal OUT, a terminal G, a terminal R, a terminal F, a terminal B, a terminal C, transistors 11, 12, 13, 15, 16, and 17, a capacitor element 14, and a terminal P. Note that in this specification, a terminal is an electrode in a circuit which electrically connected to the external. Here, the transistor 11 may be another element having rectifying characteristics, and is used as a rectifying element for input (also referred to as a first rectifying element). Further, the transistor 15 may be another element having rectifying characteristics, and is used as a rectifying element for reset (also referred to as a second rectifying element). The transistor 12 is used as a transmission transistor (also referred to as a first transistor). The transistor 13 is used as an internal voltage clamp transistor (also referred to as a third transistor). The transistor 17 is used as an output voltage clamp transistor (also referred to as a second transistor). The transistor 16 is used as a set transistor (also referred to as fourth transistor).

Note that a terminal P of the circuit 10 at a kth stage is also referred to as a terminal P(k). Further, this embodiment mode specifies a capacitor element 14; however, functions of the capacitor element 14 can also be realized by parasitic capacitance formed between a gate electrode and a drain electrode (or a source electrode) of the transistor 12. Therefore, the present invention includes not only the case where the capacitor element 14 is formed as an independent electrical element, but also the case where the capacitor element 14 is a parasitic capacitor element which is associated with the transistor 12.

The gate electrode of transistor 11 of the circuit 10 shown in FIG. 1B is connected to a terminal IN, one of a source electrode and a drain electrode of the transistor 11 is connected to the terminal IN, and the other of the source electrode and the drain electrode of the transistor 11 is connected to the terminal P. The gate electrode of the transistor 12 is connected to the terminal P, one of the source electrode and the drain electrode of the transistor 12 is connected to the terminal C, the other of the source electrode and the drain electrode of the transistor 12 is connected to the terminal OUT.

Further, the gate electrode of the transistor 13 is connected to a terminal R, one of a source electrode and a drain electrode of the transistor 13 is connected to a terminal G, and the other of the source electrode and the drain electrode of the transistor 13 is connected to the terminal P. Further, one of electrodes of the capacitor element 14 is connected to the terminal P, the other of the electrodes of the capacitor element 14 is connected to the terminal OUT.

The gate electrode of the transistor 15 is connected to a terminal OUT, one of a source electrode and a drain electrode of the transistor 15 is connected to the terminal OUT, and the other of the source electrode and the drain electrode of the transistor 15 is connected to a terminal B. Further, the gate electrode of the transistor 16 is connected to the terminal P, one of a source electrode and a drain electrode of the transistor 16 is connected to a terminal G, and the other of the source electrode and the drain electrode of the transistor 16 is connected to a terminal F. Further, the gate electrode of the transistor 17 is connected to the terminal R, one of a source electrode and a drain electrode of the transistor 17 is connected to the terminal G, and the other of the source electrode and the drain electrode of the transistor 17 is connected to the terminal OUT.

As shown in FIG. 1A, the terminal IN of the circuit 10 at a first stage is connected to a start pulse terminal SP and the gate electrode of the transistor 18. Further, an electrode SR(1) at a first stage is connected to a terminal B of the circuit 10 at a second stage, and one of a source electrode and a drain electrode of the transistor 18. The other of the source electrode and the drain electrode of the transistor 18 is connected to the power supply line Vss. Further, the power supply line Vss is connected to the terminal G at each stage of the circuit 10. Still further, the first clock signal line CLK1 connected to the terminal C at each of odd-numbered stages of the circuit 10, and the second clock signal line CLK2 is connected to the terminal C at each of even-numbered stages.

Next, connection of the circuit 10 at a kth stage in the circuit shown in FIG. 1A will be described. An electrode SR(k) connected to the terminal R of the circuit 10 at the kth stage is connected to the terminal B of the circuit 10 at a (k+1)th stage and the terminal F of the circuit 10 at a (k−1)th stage. Further, the output terminal L(k) connected to the terminal OUT of the circuit 10 at a kth stage is connected to the terminal IN of the circuit 10 at a (k+1)th stage. Here, as shown in FIG. 1A, connection of the circuit 10 at either a first stage or an nth stage may be different from a connection of the circuit 10 at the other stages. For example, an electrode SR(n) at the nth stage may be connected to an electrode SR(n−1)

Here, in this embodiment mode, the number n of the circuit 10 is an odd number; however, in the present invention in, n may be an even number. Further, in this embodiment mode, the first clock signal line CLK1 is connected to the terminal C of the circuit 10 at an odd-numbered stage, the second clock signal line CLK2 is connected to the terminal C of the circuit 10 at an even-numbered stage. Alternatively, in the present invention, the connection of CLK1 and CLK2 may be reversed, specifically, the first clock signal line CLK1 may be connected to the terminal C of the circuit 10 at an even-numbered stage, and the second clock signal line CLK2 may be connected to the terminal C of the circuit 10 at an odd-numbered stage. Further, in the present invention, the number of clock signal lines is not limited to two, it may be two or more. In such case, it is preferable that the number of kinds (number of phase) of signals inputted to the click signal line is the same as the number of clock signal lines. For example, it is preferable that in a case using three clock signal lines, the number of kinds (three of phase) of clock signals inputted to the circuit 10 is three.

Next, the operation of a circuit shown in FIGS. 1A and 1B will be described with reference to FIG. 1C. FIG. 1C is a timing chart illustrating waveforms of signals inputted to the circuit shown in FIGS. 1A and 1B, internal electrodes, and the output signals. The vertical axis indicates electric potentials of the signals, the input signals and the output signals may be digital signals having either electric potential of a high level (also referred to as an H level or a Vdd level) or a low level (also referred to as an L level or a Vss level). The horizontal axis indicates time. In this embodiment mode, description is given of input signals are inputted repeatedly based on the time T0. Note that the present invention is not limited thereto, and includes the case where the input signals may be variously changed to obtain a desired output signal.

Further, in this embodiment mode, an operation of selecting (scanning) output terminal L(1) to OUT(n) are sequentially selected as output signals (scan) will be described. This operation is widely applied to, for example, in an active matrix display device, a peripheral driver which controls ON/OFF of switches for selecting pixels. Note that, in this embodiment mode, signals inputted to the start pulse terminal SP, the first clock signal line CLK1, and the second clock signal line CLK2 in FIG. 1C are collectively referred to as an input signal. Further, the electric potential of the power supply line Vss is assumed to be almost equal to the electric potential of the L level of the input signal. However, electric potential of the power supply line Vss in the present invention is not limited thereto.

Next, an operation of the circuit shown in FIGS. 1A to 1C will be described as in summary with reference to FIGS. 35A to 35F. FIGS. 35A to 35F illustrate operation of a circuit in FIG. 1B in chronological order. The transistors indicated in broken lines in FIGS. 35A to 35F are in an OFF-state, and transistors indicated in continuous lines are in an ON-state. Further, the arrows in the diagrams indicate directions of current in operations at the points. Further, electric potentials of an electrode and a terminal in the diagrams at that point are enclosed in < >. Note that, electric potential of a clock signal is represented as <Vss> assuming that the lower electric potential is the electric potential of the power supply line Vss, or as <Vdd> which is the higher electric potential.

Figure 35A:
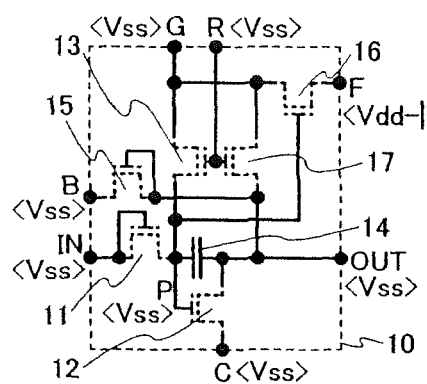
FIGS. 35A to 35F illustrate operations of shift register circuits of the present invention.

First, referring to FIG. 35A, an operation of canceling a reset operation of a current stage by a preceding stage will be explained. Here, in this specification, an operation of increasing the electric potential of the terminal R to turn ON the internal voltage clamp transistor 13 and the output voltage clamp transistor 17 is referred to as a reset operation. On the other hand, an operation of decreasing the electric potential of the terminal R to turn OFF the internal voltage clamp transistor 13 and the output voltage clamp transistor 17 is referred to as a set operation. During reset operation, electric potentials of the terminal P and the terminal OUT are forced to be <Vss>. Therefore, in order to operate the circuit 10, set operation is required first. The set operation may be conducted by making the potential of the terminal R of the stage be <Vss> using the set transistor 16 of the preceding stage at a time where the electric potential of the terminal P of the preceding stage increases. In FIG. 35A, the transistors 11, 12, 13, 15, 16, and 17 are all in an OFF-state, which may be considered as an initialized state.

Figure 35B:
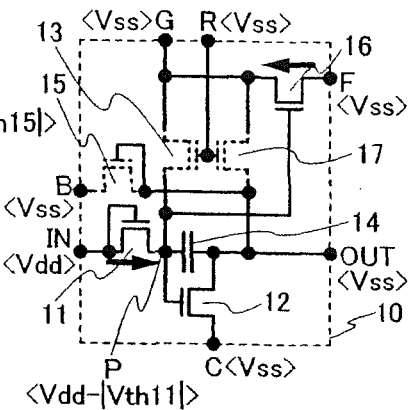

Next, referring to FIG. 35B, pulse input operation will be described. A pulse is inputted to the terminal IN, and then, electric potential of the terminal IN increases. The electric potential of the terminal IN rises above the electric potential of the terminal P by the threshold voltage of the transistor 11 (also referred to as Vth11) or more, and thus, the transistor 11 is turned ON. Accordingly, electric potential of the terminal P also rises to be <Vdd−|Vth11|> which is lower than the electric potential of the terminal IN <Vdd> by Vth11. The transistors 11 and 16 are turned ON, then, the potential of the terminal OUT becomes equal to the electric potential <Vss> of the terminal C. Further, electric potential of the terminal F becomes <Vss>; thus, electric potential of the terminal R of the following stage will be <Vss>. That is, the following stage is subjected to set operation by the set transistor 16 of the current stage.

Figure 35C:
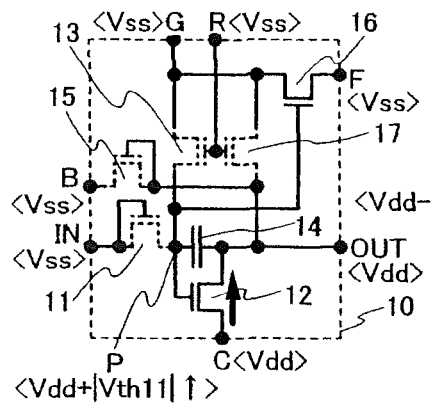

Next, referring to FIG. 35C, bootstrap operation will be described. The terminal IN which has increased the electric potential of the terminal P may be returned to the electric potential <Vss> at arbitrary timing. The transistor 11 is diode connected and is in an OFF-state even when the electric potential of terminal IN returns to <Vss>. Therefore, the transistor 11 does not affect the electric potential of the terminal P. That is, the transistor 11 increases the electric potential of the terminal P in accordance with the increase in the electric potential of the terminal IN, but is not required to lower it, and is used as a rectifying element for input.

In the case where the electric potential of the terminal P has increased, a clock signal is inputted and the electric potential of the terminal C becomes <Vdd>, current flows through the transmission transistor 12 from the terminal C toward the terminal OUT, and the electric potential of the terminal OUT also increases. At that time, since the terminal P and the terminal OUT are connected by the capacitor element 14, the electric potential of the terminal P also increases in accordance with the increase in the electric potential of the terminal OUT. The value to which the electric potential of the terminal P increases depends on the capacitance value of parasitic capacitor elements other than the capacitor element 14 connected to the terminal P. As long as the electric potential is <Vdd+|Vth11|> or more, there is problem with operation, and the electric potential of the terminal OUT increases to <Vdd>, equal to the potential of the clock signal. Accordingly, in the diagram, the electric potential of the terminal P at that time is represented as <Vdd+|Vth11|(upward arrow)>, meaning an electric potential of <Vdd−|Vth11|> or more.

Figure 35D:
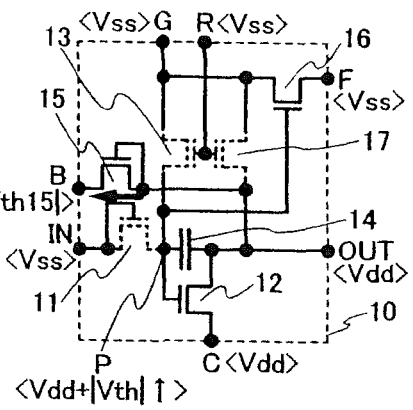

Next, referring to FIG. 35D, an operation of resetting the preceding stage by the current stage will be described. As shown in FIG. 35C, when the electric potential of the terminal OUT is increased to <Vdd>, the transistor 15 is turned ON, and the electric potential of the terminal B increases accordingly. Since the transistor 15 turns OFF when the electric potential of the terminal B decreases from the electric potential of the terminal OUT by the threshold voltage of the transistor 15 (also referred to as Vth15), the increase of the electric potential of the terminal B stops, and the electric potential of the terminal B is <Vdd−|Vth15|>. Hereupon, since the electric potential of the terminal R of the preceding stage increases to <Vdd−|Vth15|>, the preceding stage is reset, and the electric potential of the terminal P and the terminal OUT of the preceding stage is fixed at <Vss>; thus, a pulse is not inputted to the terminal IN of the current stage.

Figure 35E:
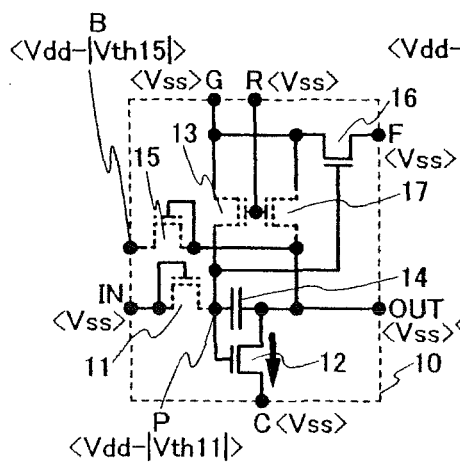

Next, referring to FIG. 35E, an operation of a clock signal returning to Vss will be described. When the electric potential of the clock signal returns to <Vss>, and the electric potential of the terminal C returns to <Vss>, the transmission transistor 12 is in an ON-state. Therefore, current flows through the transmission transistor 12 from the terminal OUT toward the terminal C; thus, the electric potential of the terminal OUT also returns to <Vss>. Thereupon, the electric potential of the terminal P also returns to <Vdd−|Vth11|>. Further, since the transistor 15 is in an OFF-state, the electric potential of the terminal B remains at <Vdd−|Vth15|> even when the electric potential of the terminal OUT returns to <Vss>. In other words, the transistor 15 increases electric potential of the terminal B in accordance with the electric potential of the terminal OUT but is not required to lower it, and is used as a rectifying element for reset.

Figure 35F:
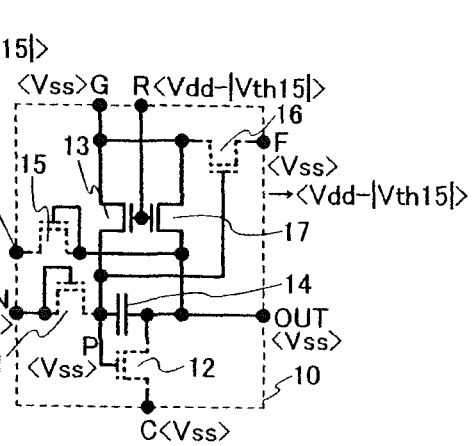

Next, referring to FIG. 35F, an operation of resetting the current stage by the next stage will be described. When an increase in the electric potential of the terminal OUT of the current stage is transmitted to the terminal IN of the next stage, the electric potential of the terminal OUT of the next stage increases, and the transistor 15 of the next stage turns ON. Thereby the electric potential of the terminal B of the next stage increases, and the electric potential of the terminal R of the current stage increases to <Vdd−|Vth15|>. Accordingly, the current stage is reset. Thereupon, the internal voltage clamp transistor 13 and the output voltage clamp transistor 17 of the current stage is turned ON, and the terminal P and the terminal OUT are each fixed at an electric potential of <Vss>. Thus, the current stage is reset by the operation of the next stage, and thereby the transmission transistor 12 is turned OFF. Accordingly, electrical continuity between the terminal OUT and the terminal C is interrupted.

This interruption ends when the electric potential of the terminal R is lowered due to leakage current of an element connected to the terminal R, and the internal voltage clamp transistor 13 and the output voltage clamp transistor 17 are naturally turned OFF accordingly, or when the set transistor 16 of the preceding stage is turned ON and the electric potential of the terminal R becomes <Vss> accordingly, so that the internal voltage clamp transistor 13 and the output voltage clamp transistor 17 are forcedly turned OFF (See FIG. 35A). The period from the state shown in FIG. 35F to the state shown in FIG. 35A is referred to as a non-selection period in this specification. It is important to stabilize and fix the electric potentials of the terminal P and the terminal OUT to <Vss> in the non-selection period. In other words, it is important to maintain the ON-state of a transistor with its gate electrode connected to the terminal R.

Note that a single stage circuit in a shift register circuit of the present invention includes an output voltage clamp transistor, so that the output terminal is prevented from being floated when the transmission transistor is in an OFF-state, thereby establishing electrical continuity with the power supply line. Therefore, how the reset operation or the set operation of the terminal R is conducted is not limited to the above example. The configurations shown in FIGS. 36A and 36C may be used for the single stage circuit.

Figure 36A:
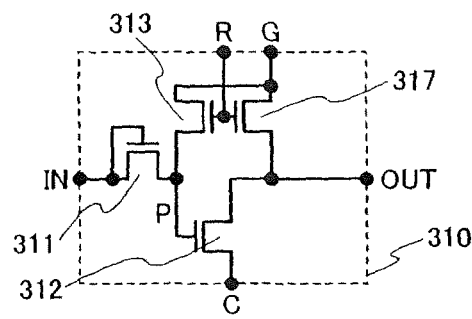
FIGS. 36A to 36D illustrate shift register circuits of the present invention and timecharts thereof.

A circuit 310 shown in FIG. 36A includes terminals IN, OUT, R, G, and C, a terminal P, and transistors 311, 312, 313, and 317. The gate electrode of the transistor 311 is connected to the terminal IN, one of a source electrode and a drain electrode of the transistor 311 is connected to the terminal IN, the other of the source electrode and the drain electrode of the transistor 311 is connected to the terminal P. The gate electrode of the transistor 312 is connected to the terminal P, one of a source electrode and a drain electrode of the transistor 312 is connected to the terminal C, and the other of the source electrode and the drain electrode of the transistor 312 is connected to the terminal OUT.

The gate electrode of the transistor 313 is connected the terminal R, one of a source electrode and a drain electrode of the transistor 313 is connected to the terminal G and the other of the source electrode and the drain electrode of the transistor 313 is connected to the terminal P. The gate electrode of the transistor 317 is connected to the terminal R, one of a source electrode and a drain electrode of the transistor 317 is connected to the terminal G, and the other of the source electrode and the drain electrode of the transistor 317 is connected to the terminal OUT. Note that the transistor 311 may be used as a rectifying element for input (a first rectifying element).

Further, the transistor 312 may be used as a transmission transistor (a first transistor). The transistor 317 may be used as an output voltage clamp transistor (a second transistor). The transistor 313 may be used as an internal voltage clamp transistor (a third transistor).

Figure 36B:
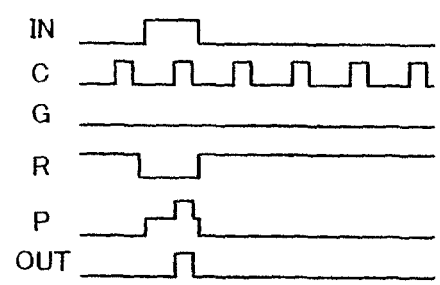

Here, an operation of the circuit shown in FIG. 36A will be described with reference to FIG. 36B. FIG. 36B is a timing chart of the change in electric potential of each terminal shown in FIG. 36A. Description will be given of the case where a clock signal is inputted to the terminal C, a pulse for increasing the electric potential of the terminal P is inputted to the terminal IN, the terminal G is fixed to the L level, and a pulse for lowering the electric potential of the terminal P is inputted to the terminal R.

When the electric potential of the terminal R is low, and a pulse is inputted to the terminal IN with the internal voltage clamp transistor and the output voltage clamp transistor in an ON-state, the electric potential of the terminal P is increased through the rectifying element for input, so the transmission transistor is turned ON. After that, when the electric potential of the terminal C is increased, the transmission transistor bootstraps, and the electric potential of the terminal C is transmitted to the terminal OUT as is. After that, when the electric potential of the terminal R increases, the internal voltage clamp transistor and the output voltage clamp transistor are turned ON, so the terminal P and the terminal OUT are fixed to the L level. However, a signal waveform of a signal inputted to the circuit 310 of the present invention is not limited to these.

In this manner, in the circuit 310 of the present invention, a signal inputted to the terminal C can be transmitted to the terminal OUT only during a period in which the electric potential of the terminal R is low. Further, in a period during which the electric potential of the terminal R is high, the terminal P and the terminal OUT can be fixed to the L level.

Figure 36C:
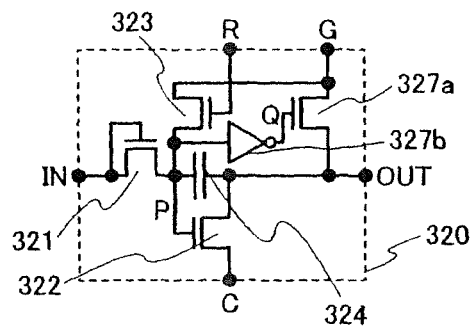

A circuit 320 shown in FIG. 36C includes terminals IN, OUT, R, and C, terminals P and Q, and transistors 321, 322, 323, and 327a, an inverter 327b, and the capacitor element 324. Note that the capacitor element 324 is not necessarily connected as in FIG. 36A. The gate electrode of the transistor 321 is connected to the terminal one of a source electrode and a drain electrode of the transistor 321 is connected to the terminal IN, and the other of the source electrode and the drain electrode of the transistor 321 is connected to the terminal P.

The gate electrode of the transistor 322 is connected to the terminal P, one of a source electrode and a drain electrode of the transistor 322 is connected to the terminal C, and the other of the source electrode and the drain electrode of the transistor 322 is connected to the terminal OUT The gate electrode of the transistor 323 is connected to the terminal R, one of a source electrode and a drain electrode of the transistor 323 is connected to the terminal G, and the other of the source electrode and the drain electrode of the transistor 327 is connected to the terminal P. One of electrodes of the capacitor element 324 is connected to the terminal P, and the other electrode of the capacitor element 324 is connected to the terminal OUT. The gate electrode of the transistor 327a is connected to the terminal Q, one of a source electrode and a drain electrode of the transistor 327a is connected to the terminal G, and the other of the source electrode and the drain electrode of the transistor 327a is connected to the terminal OUT.

An input electrode of the inverter 327b is connected to the terminal P, and an output electrode of the inverter 327b is connected to the terminal Q. Note that the transistor 321 may be used as a rectifying element for input (a first rectifying element). Further, the transistor 322 may be used as a transmission transistor (a first transistor). Still further, the transistor 327a may be used as an output voltage clamp transistor (a second transistor). Moreover, the transistor 323 may be used as an internal voltage clamp transistor (a third transistor).

Figure 36D:
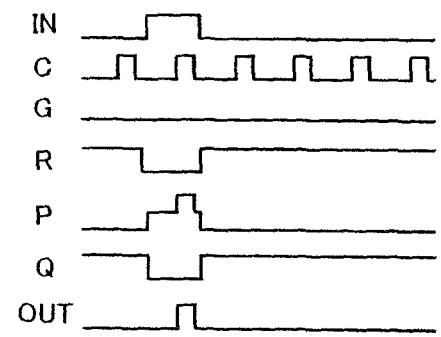
Figure 37A:
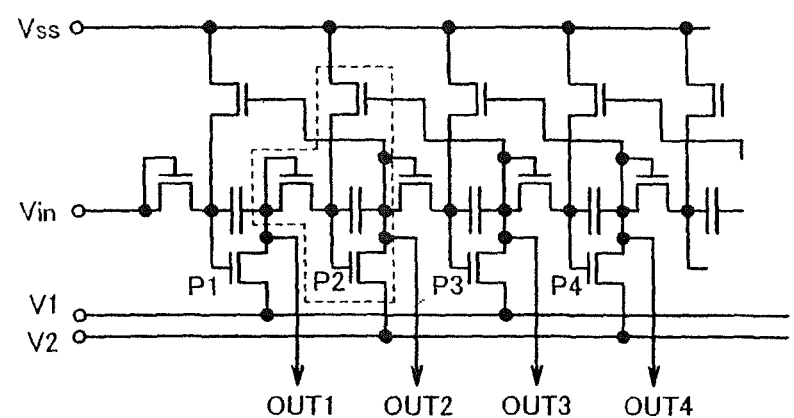
FIGS. 37A and 37B illustrate a conventional shift register.
Figure 37B:
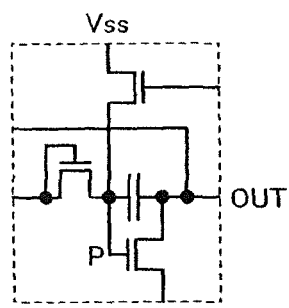
Figure 38A:
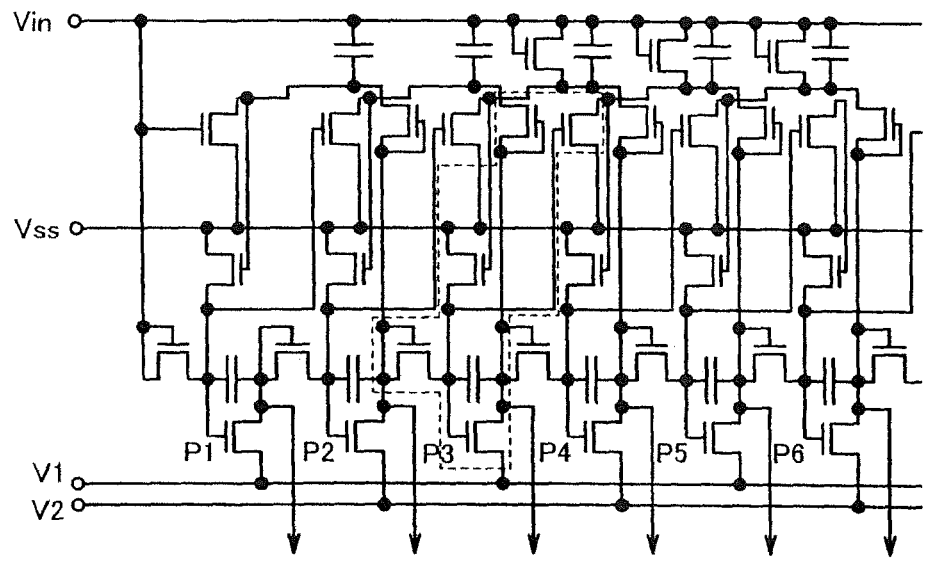
FIGS. 38A and 38B illustrate a conventional shift register.
Figure 38B:
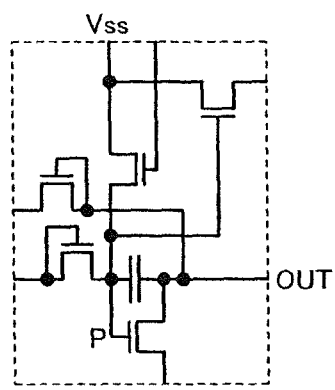

Here, an operation of the circuit shown in FIG. 36C will be explained with reference to FIG. 36D. FIG. 36D is a timing chart of change in electric potential of each terminal shown in FIG. 36C. Description will be given of the case where A clock signal is inputted to the terminal C, a pulse for increasing the electric potential of the terminal P is inputted to the terminal IN, the terminal G is fixed to the L level, and a pulse for lowering the electric potential of the terminal P is inputted to the terminal R.

When the electric potential of the terminal R is low, and the internal voltage clamp transistor is in an OFF-state, if a pulse is inputted to the terminal IN, the electric potential of the terminal P is increased through the rectifying element for input, and thereby the transmission transistor is turned ON. At that time, since the electric potential of the terminal P is reversed, the terminal Q changes to L level. Therefore, the output voltage clamp transistor is in an OFF-state. After that, when the electric potential of the terminal C is increased, the transmission transistor bootstraps, and the electric potential of the terminal C is transmitted to the terminal OUT as is. Further, when the electric potential of the terminal R is increased, the internal voltage clamp transistor is turned ON; thus, the terminal P is fixed to the L level. Accordingly, the electric potential of the terminal Q becomes the H level, and thus, the output voltage clamp transistor is turned ON, and the terminal OUT is fixed to the L level. In this manner, in the circuit 320 of the present invention, a signal inputted to the terminal C can be transmitted to the terminal OUT only during a period in which the electric potential of the terminal R is low. Further, during a period in which the electric potential of the terminal R is high, the terminal P and the terminal OUT can be fixed to the L level. However, a signal waveform of a signal inputted to the circuit 320 of the present invention is not limited to these.

Next, with reference to FIGS. 1A to 1C, start pulse which is to be inputted to a start pulse terminal SP at a time of T0 will be described. The pulse width of the start pulse is arbitrary. Assuming that the a period of a signal inputted to the first clock signal line CLK1 and the second clock signal line CLK2 is Tc, the pulse width is preferably Tc/2 or more and Tc or less. Thus, the electric potential of a terminal P(1) which is connected to the start pulse terminal SP through the diode-connected transistor 11 can be increased sufficiently. Further, when the electric potential of the terminal P is lowered due to an ON-state of the transistor 13 of the circuit 10, power consumption can be suppressed because there is no path of stationary current through the terminal IN, the transistor 11, the terminal P, the transistor 13, and the terminal G sequentially, which is preferable.

Next, a signal to be inputted to the first clock signal line CLK1 and the second clock signal line CLK2 will be described. It is preferable that the percentage of a first clock signal and a second clock signal at H level in one period of time (duty ratio) is less than 50%. Further, it is more preferable that a difference between the middle of a period in which one of the signals is at H level and the middle of a period in which the other signal is at L level is within a range of 10% of the period of time. Thus, an output signal can be similar to a pulse signal having a single frequency. Further, the H levels of adjacent output terminals are prevented from temporally overlapping. This is advantageous since a plurality of rows can be prevented from being selected simultaneously when using a shift register circuit as a peripheral driver circuit for controlling ON/OFF of a switch for selecting pixels in an active matrix display device in this embodiment mode.

Description will be given of change in the potential of the terminal P(1) when a start pulse is inputted at a time of T0 at the initial potential of the terminal P(1) in the circuit 10 of the first stage is at the L level and the potential of the terminal IN changes from the L level to the H level. Here, the terminal R is at L level, and the transistor 13 is in an OFF-state. Accordingly, the transistor 11 is turned ON, and the electric potential of the terminal P(1) increases. Then, when the electric potential of the terminal P(1) increases to a potential of the H level of the start pulse minus the threshold voltage of the transistor 11, the transistor 11 is turned OFF. Thus, increase in the electric potential of the terminal P(1) stops. When the electric potential of the terminal P(1) once increases, even if the electric potential of the terminal IN drops and returns to the L level after that, the transistor 11 remains OFF. Therefore, the electric potential of the terminal P(1) is not reduced and is floated.

Hereupon, in a state where the electric potential of the terminal P(1) is increased, since the electric potential of the terminal C is the L level, the transistor 12 is turned ON. Accordingly, the L level if outputted to the terminal OUT. After that, the electric potential of the terminal C increases, the electric potential of the terminal OUT is also increased. Further, since the terminal P(1) is floated, the electric potential of the terminal P(1) also increases as the electric potential of the terminal OUT increases through the capacitor element 14. Thus, due to the bootstrap operation by the transistor 12, change in the electric potential of the terminal C is transmitted to the terminal OUT without attenuation.

In this manner, during a period in which the transistor 13 is in an OFF-state and the terminal P(1) is floated still with a high electric potential, and change of the electric potential of the terminal C is transmitted to the terminal OUT as it is. Therefore, in the case where a clock signal is not outputted to the output terminal as it is, the transistor 13 is turned ON at a certain time by increasing the electric potential of the terminal R; thus, the electric potential of the terminal P(1) becomes the L level. Then, the transistor 12 is turned OFF, thereby the electric potential of the terminal C is not transmitted to the terminal OUT as it is.

The terminal OUT is connected to the terminal IN of the circuit 10 of the second stage through the output terminal L(1). Specifically, the output of the circuit 10 at the first stage functions as a start pulse; thus, the circuit 10 at the second stage operates in the same manner as the above-described circuit 10 of the first stage.

Next, the timing of reset operation will be described. The timing of performing the reset operation is arbitrary; reset operation may be conducted at a point where one pulse of a clock signal is transmitted from the terminal C to the terminal OUT. Specifically, reset operation of a kth stage may be conducted at the time where the electric potential of the terminal OUT of (k+1)th stage rises. Further, as a circuit configuration of this case, as shown in FIGS. 1A and 1B, it is preferable to use a configuration in which the terminal OUT and the terminal B of the (k+1)th stage is connected through the diode-connected transistor 15, and the terminal B of the (k+1)th stage is connected to the terminal R of the kth stage using the electrode SR(k).

When using this configuration, a clock signal is transmitted to the terminal OUT of the circuit 10 at the kth stage, and when the clock signal is inputted to the terminal IN of the circuit 10 at the (k+1)th stage, a clock signal having a phase different from the output signal of the circuit 10 at the kth stage is outputted to the terminal OUT of the circuit 10 at the (k+1)th stage. Hereupon, the electric potential of the terminal B of the circuit 10 at the (k+1)th stage rises with the same timing as when the electric potential of the terminal OUT of the circuit 10 at the (k+1)th stage rises. Specifically, the electric potential of the terminal R in the circuit 10 at the kth stage rises with the same timing as when the electric potential of the terminal OUT in the circuit 10 at the (k+1)th stage rises, thereby the circuit 10 of the kth stage is reset. When the electric potential of the terminal OUT in the circuit 10 at the (k+1)th stage rises, since the circuit 10 at the kth stage output the L level after transmitting a pulse of the clock signal, the pulse of the output terminal is one. In this manner, an output terminal of the shift register of this embodiment mode is at H level sequentially form an OUT(1); therefore, the shift register can be used for a peripheral driver circuit for controlling ON/OFF of a switch for selecting pixels in an active matrix display device.

Note that, the timing of reset operation of the present invention is not limited thereto and the reset operation can be conduced at any timing. For example, reset operation may be conduced when the electric potential of the output terminal of a stage two stages after the current stage rises, or when the electric potential of output terminal of a stage more than three stages after the current stage rises. At that time, as the signal line which defines the timing for reset operation is distant from the current stage, the distance of leading the electrode SR becomes longer, so that the value of parasitic capacitance associated with the electrode SR becomes larger. That is advantageous for maintaining the electric potential of the electrode SR.

Reset operation of the last stage may be conduced by output of the last stage itself by connecting the electrode SR(n) and an electrode SR(n−1) as shown in FIG. 1A. Thus, reset (operation of return to the electric potential of the power supply line Vss) of the terminal P(n) and the output terminal L(n) can be conducted. Further, a common timing pulse may be additionally inputted to all the stages for the reset operation. Alternatively, the start pulse may be used as a common timing pulse.

Next, a period other than the period in which the output terminal L(k) of the kth stage is conducting to the clock signal line through the transistor 12 in an ON-state (a period in which the electric potential of the terminal P(k) is at L level in FIG. 1C). In the (k+1)th stage of the circuit 10, when the electric potential of the terminal OUT rises, since the diode-connected transistor 15 is in an ON-state, the electric potential of the terminal B increases to a potential of the H level minus the threshold voltage transistor 15. However, when the electric potential of the terminal OUT drops, the transistor 15 is turned OFF; thus, the electric potential of the terminal B does not drop. Thus, the electric potential of the electrode SR(k) rises due to the electric potential of the terminal OUT of the (k+1)th stage rises but does not drop. Therefore, the electric potential of the terminal R of after reset operation of the kth stage is held at H level, and the transistors 13 and 17 remain ON accordingly. Thus, the electric potential of the terminal P(k) and the electric potential of the terminal OUT are fixed at L level.

If the electric potential of the terminal R reset after the reset operation is not held at H level, the transistors 13 and 17 is turned OFF; therefore, the terminal P(k) and the terminal OUT would be floated. Since the terminal P(k) is connected to one of the first clock signal line and the second clock signal line through the gate capacitor of the transistor 12, if the terminal P(k) is floated, the electric potential of the terminal P(k) is varied easily. Further, since the terminal OUT is capacitively coupled with the terminal P(k) through capacitor element 14, if the electric potential of the terminal P(k) is varied when the terminal OUT is floated, the electric potential of the terminal OUT is also varied. In addition, the electric potential of the output terminal L(k) is varied even by parasitic capacitance with the clock signal line. The variation in the electric potential of the output terminal L(k) cause instability of the shift register circuit and malfunctions; therefore, it is very important to hold the electric potential of the terminal R at H level in order to fix the electric potentials of the terminal P and the terminal OUT.

Note that, it is preferable that a period during which the electric potential of the terminal R is held at H level for fixing the electric potentials of the terminal P and the terminal OUT be at least half of a period of a start pulse.

Note that since the electric potentials of the electrode SR and the terminal R are held at H level after reset operation, the capacitor element is not required to be connected. The average of the areas of the gate electrode of the internal voltage clamp transistor 13 and the output voltage clamp transistor 17 is larger than the area of the transmission transistor 12; thus, the electric potentials of the electrode SR ad the terminal R can be held at H level after the reset operation. Further, the length of leading the electrode SR from the terminal R at the kth stage is longer than a pitch between the circuit 10 of the kth stage and the circuit 10 of the (k+1)th stage, so that the value of the parasitic capacitance associated with the electrode SR is increased, thereby holding the electric potentials of the electrode SR and the terminal R. Naturally, the electric potentials of the electrode SR and the terminal R may be held by connecting a capacitor element between the electrode SR and the power supply line Vss or the start pulse terminal SP.

As mentioned above, it is very important to hold the electric potentials of the terminal R and the electrode SR at H level after reset operation for stable operation of the shift register circuit. However, in the case where after the shift register circuit is operated once, a start pulse is inputted again, and then the circuit 10 at the kth stage is not operated again unless the transistors 13 and 17 are in an OFF-state. Accordingly, before the circuit 10 at the kth stage operates, the electric potentials of the terminal R and the electrode SR(k) should be returned to the L level. This operation is referred to as 'set operation' in this specification. The timing of performing the set operation is arbitrary. The set operation of the kth stage may be performed at a timing when the electric potential of the terminal P(k−1) at the (k−1)th stage rises. As a circuit configuration of this case, it is preferable that, as in FIGS. 1A and 1B, the terminal F and the electrode SR(k) are connected using the transistor 16 of which gate electrode is connected to the terminal P(k−1), one of the source electrode and the drain electrode is connected to the terminal G, and the other of the source electrode and the drain electrode is connected to the terminal F.

In the case of using this configuration, since the electric potential of terminal P(k−1) at the (k−1)th stage rises before a pulse is inputted to the terminal IN at the kth stage, the transistor 16 at the (k−1)th stage is turned on at the timing. Thus, the electric potential of the terminal F becomes the L level. Therefore, the terminal R at the kth stage is changed from the H level held to the L level, and thus, the transistors 13 and 17 are turned OFF. After that, an output of the (k−1)th stage is inputted to the terminal IN at the kth stage; thus, the operation of the circuit 10 at a kth stage starts.

Here, the gate electrode the transistor 16 at the (k−1)th stage may be connected to the terminal OUT at the (k−1)th stage instead of being connected to the terminal F of the (k−1)th stage. In this case, set operation of the kth stage is performed when the output of the (k−1)th stage is inputted to the terminal IN of the kth stage.

Further, set operation of the kth stage may be performed at a timing when the electric potentials of the terminal P(k−2) and the terminal OUT at the (k−2)th stage rise. Alternatively, the set operation may be performed at a timing when the electric potentials of the terminal P(k−2) and the terminal OUT at a stage before the (k−2)th rise. With the connection with a farther stage through the electrode SR, the length of leading the electrode SR from the terminal R at the kth stage is made longer than the pitch between the circuit 10 at the kth stage and the circuit 10 at the (k+1)th stage; thereby, the value of parasitic capacitance associated with the electrode SR can be made larger. It is thus advantageous that the electric potentials of the electrode SR and the terminal R are ensured to be held.

A common timing pulse may be additionally inputted to all the stages to perform the set operation. Alternatively, the start pulse may be used as a common timing pulse. The electrode SR(1) at the first stage may be connected to one of a source and a drain electrode of the transistor 18 instead of being connected to the terminal F at the preceding stage. Thus, set operation of the first stage is performed when the start pulse is inputted.

Figure 2A:
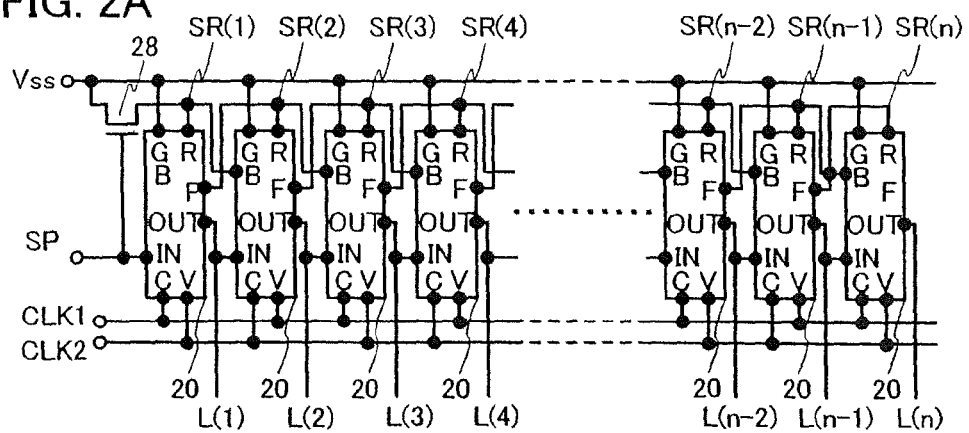
FIGS. 2A to 2C illustrate shift register circuits of the present invention.
Figure 2B:
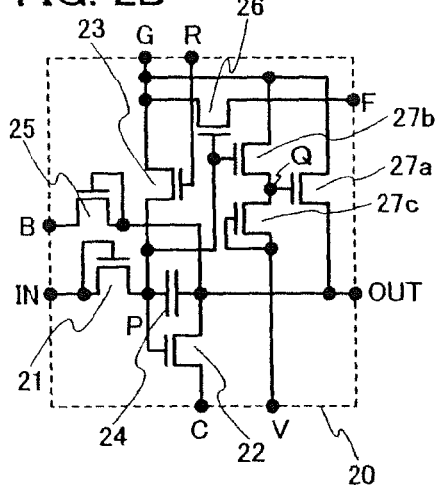
Figure 2C:
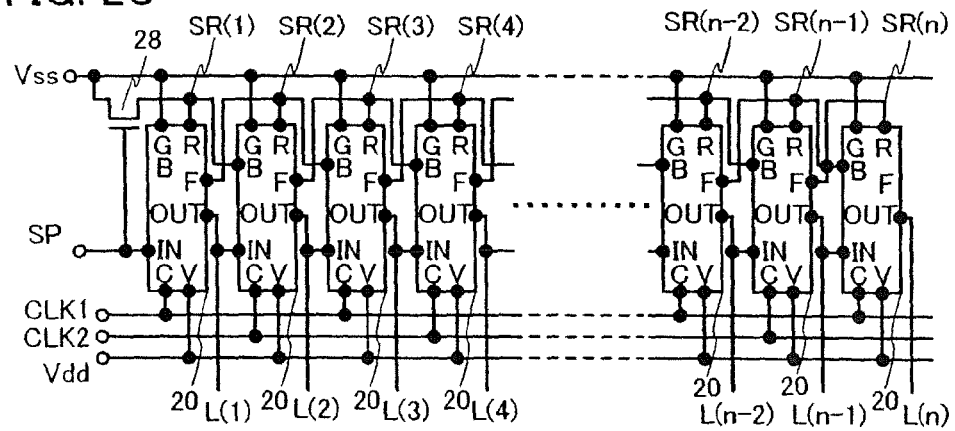

Another circuit configuration of a shift register in this embodiment mode, in which the electric potential of the output terminal is fixed during a non-selection period, and malfunctions due to clock signals and noise are reduced, will be described below. An example of the shift register having a different circuit configuration according to the present invention is illustrated in FIGS. 2A to 2C. FIG. 2A illustrates a circuit configuration of the whole shift register of the present invention. FIG. 2B illustrates a configuration example of a circuit 20 corresponding to a single stage circuit of the present invention. FIG. 2C illustrates another circuit configuration of the whole shift register using the circuit 20 shown in FIG. 2B.

The circuit shown in FIG. 2A is provided with the start pulse terminal SP, the first clock signal line CLK1, the second clock signal line CLK2, the power supply line Vss, a transistor 28, and n pieces of the circuits 10 (n is an integer greater than or equal to two), and an output terminal L(k) (k is an integer from one to n inclusive) provided corresponding to the circuit 20.

The circuit 20 shown in FIG. 2B is provided with terminals IN, OUT, G, R, F, B, C, and V, transistors 21, 22, 23, 25, 26, 27a, 27b, and 27c, a capacitor element 24, and a terminal P. Here, the transistor 21 may be replaced with another element having rectifying characteristics, which is to be used as a rectifying element for input (a first rectifying element). Further, the transistor 25 may be another element having rectifying characteristics, which is to be a rectifying element for reset (also referred to as second rectifying element). Further, the transistor 22 is used as a transmission transistor (also referred to as a first transistor). The transistor 23 is used as an internal voltage clamp transistor (also referred to as a third transistor). The transistor 27a is used as an output voltage clamp transistor (also referred to as a second transistor). Still Further, the transistor 26 is used as a set transistor (also referred to as a fourth transistor).

Note that a terminal P of the circuit 20 at a kth stage is also referred to as a terminal P(k). Further, this embodiment mode specifies a capacitor element 24; however, functions of the capacitor element 24 can also be realized by parasitic capacitance formed between a gate electrode and a drain electrode (or a source electrode) of the transistor 22. Therefore, the present invention includes not only the case where the capacitor element 24 is formed as an electrical element, but also the case where the capacitor element 24 is a parasitic capacitor element which is associated with the transistor 22. The circuit shown in FIG. 2C has a configuration in which a power supply line Vdd is added to the circuit shown in FIG. 2A.

The gate electrode of transistor 21 of the circuit 20 shown in FIG. 2B is connected to a terminal IN, one of a source electrode and a drain electrode of the transistor 21 is connected to the terminal IN, and the other of the source electrode and the drain electrode of the transistor 21 is connected to the terminal P. The gate electrode of the transistor 22 is connected to the terminal P, one of the source electrode and the drain electrode of the transistor 22 is connected to the terminal C, the other of the source electrode and the drain electrode of the transistor 22 is connected to the terminal OUT.

Further, the gate electrode of the transistor 23 is connected to a terminal R, one of a source electrode and a drain electrode of the transistor 23 is connected to a terminal G, and the other of the source electrode and the drain electrode of the transistor 23 is connected to the terminal P. Further, one of electrodes of the capacitor element 24 is connected to the terminal P, the other of the electrodes of the capacitor element 24 is connected to the terminal OUT.

The gate electrode of the transistor 25 is connected to a terminal OUT, one of a source electrode and a drain electrode of the transistor 25 is connected to the terminal OUT, and the other of the source electrode and the drain electrode of the transistor 25 is connected to a terminal B. Further, the gate electrode of the transistor 26 is connected to the terminal P, one of a source electrode and a drain electrode of the transistor 26 is connected to a terminal G, and the other of the source electrode and the drain electrode of the transistor 26 is connected to a terminal F.

Further, the gate electrode of the transistor 27a is connected to the terminal Q, one of a source electrode and a drain electrode of the transistor 27a is connected to the terminal G, and the other of the source electrode and the drain electrode of the transistor 27a is connected to the terminal OUT. The gate electrode of the transistor 27b is connected to the terminal P, one of a source electrode and a drain electrode of the transistor 27b is connected to the terminal G, and the other of the source electrode and the drain electrode of the transistor 27b is connected to the terminal Q. The gate electrode of the transistor 27c is connected to the terminal V, one of a source electrode and a drain electrode of the transistor 27c is connected to the terminal V, and the other of the source electrode and the drain electrode of the transistor 27c is connected to the terminal Q.

Next, the connection of the circuit 20 at the kth stage in the circuit shown in FIG. 2A will be described. The circuit shown in FIG. 2A has the same configuration as the circuit shown in FIG. 1A except for the terminal V; thus, the same description will not be repeated. The terminal V may be connected to a clock signal line which is different from a clock signal line to which the terminal C is connected as shown in FIG. 2A. Although not shown, the terminal V may be connected to the clock signal line to which the terminal C is connected.

FIG. 2C shows a circuit in which a power supply line Vdd dedicated for connecting the terminal V is added to the circuit shown in FIG. 2A. As shown in FIG. 2C, the terminals V and the power supply lines Vdd of all the stages may be connected. The potential applied to the power supply line Vdd may be any electric potential as long as the electric potential is higher than the L level by the sum of the threshold voltages of the transistors 27a and 27c or more.

Next, input signals and output signals of the circuits shown in FIGS. 2A, 2B, and 2C are the same as that of the FIG. 1C. A different point of the circuit shown in FIGS. 2A to 2C from the circuit shown in FIGS. 1A to 1C is that the function of the transistor 17 in FIG. 1B for fixing the electric potential of the terminal OUT to the L level is realized by the transistors 27a, 27b, and 27c. Specifically, the gate electrode of the transmission transistor 22 and the gate electrode of the output voltage clamp transistor 27a are connected to each other through a circuit for outputting an inverted signal.

In the circuit in FIG. 2B, when the circuit does not operate and the electric potential of the terminal P is fixed at L level by the transistor 23, the transistor 27b is in an OFF-state. Here, since the electric potential of the electrode Q is at H level, the transistor 27a is in an ON-state. Specifically, when the terminal P is fixed at L level, the terminal OUT is also fixed at the L level, thereby malfunctions of the output terminal due to capacitive coupling with the clock signal line and the like will be reduced.

IN the case where the circuit 20 operates, since a pulse is inputted to the terminal IN, and the electric potential of the point P rises, the transistor 27b is turned ON. Thus, the electric potential of the electrode Q approximates the L level, thereby the transistor 27a is turned OFF. Specifically, when the electric potential of the terminal P rises and the terminal OUT is conducted electricity to the terminal C, the transistor 27a turned OFF. Thus, the circuit 20 can achieve operation similar to the circuit 10 shown in FIGS. 1A to 1C.

Note that according to this embodiment mode, it is a merit of a shift register of the present invention, that the period during which the terminal OUT is fixed at the Low level is long. In other words, as the terminal OUT is fixed at the Low level for a longer time, the malfunctions of the terminal OUT due to operation of another signal line or noise from the outside are reduced; thus, the stability in operation is high. Further, as to a shift register of the present invention, frequency of switching of the signals inputted to the transistor connected to the terminal OUT is less; thus, the electric potential of the terminal OUT is hardly varied due to feedthrough of signals, and high stability of operation can be achieved.

Embodiment Mode 2

In this embodiment mode, reset operation of the last stage and the reset operation of all the stages of the shift register circuit of the present invention will be described.

In the circuit configuration described in Embodiment Mode 1, the reset operation of the current stage is conducted at the timing of the operation of the next stage. Here, since there is no stage after the shift register circuit at the last stage, no pulse defining the timing of the reset operation is inputted to the last stage. Therefore, the electric potential of the electrode SR(n) will not be at H level by reset operation. Accordingly, clock signals are constantly outputted to the terminal OUT of the last stage.

Considering the points, in Embodiment Mode 1, the electrode SR(n) is connected to the electrode SR(n−1) as shown in FIG. 1A, FIG. 2A, and FIG. 2C. Thus, reset operation can be performed by making the electrode SR(n) at H level with the output of the terminal OUT at the last stage itself. Accordingly, the electric potential of a clock signal line can be prevented from being constantly outputted to the output terminal L(n) at the last stage can. In this case, the pulse width of the output of the last stage is smaller than the pulse width of the output of a clock signal. Here, in the case of a circuit configuration in which clock signals are constantly outputted to the last stage, and the output of the last stage is not used actively except for reset operation of the preceding stage, excess power is consumed for charging or discharging the parasitic capacitance element connected to the output terminal of the last stage.

Figure 3A:
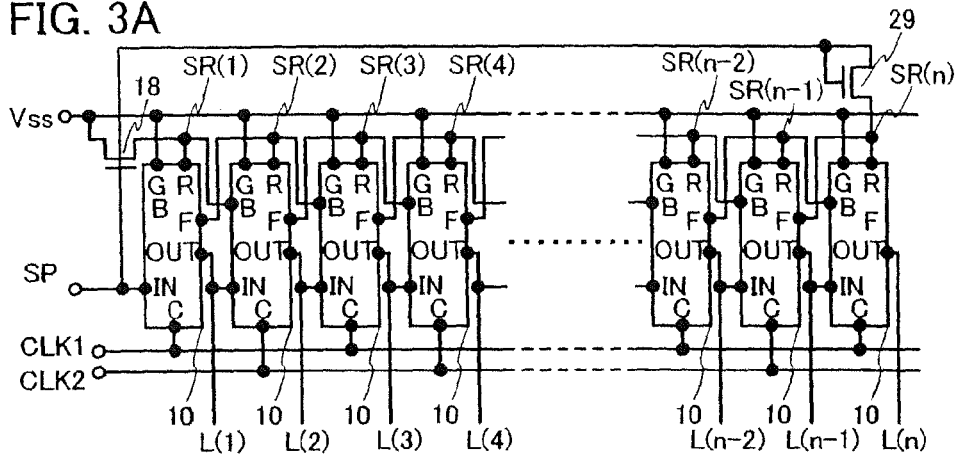
FIGS. 3A to 3C illustrate shift register circuits of the present invention.
Figure 3B:
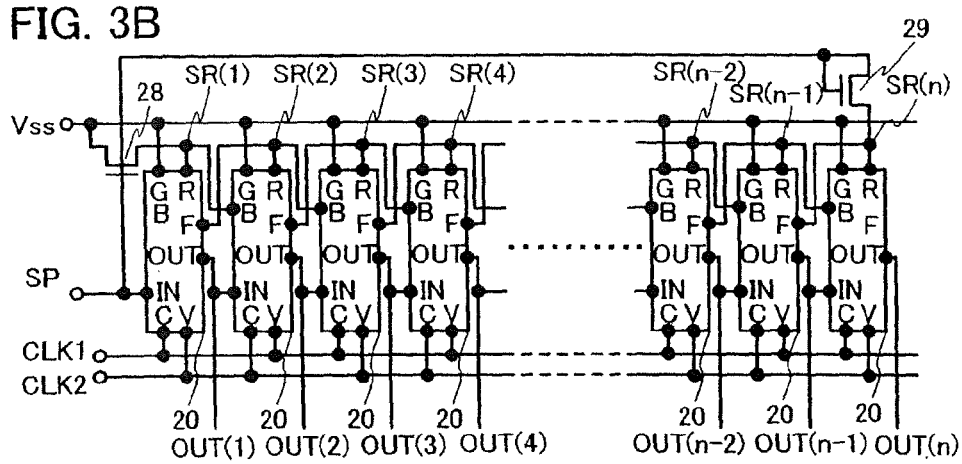
Figure 3C:
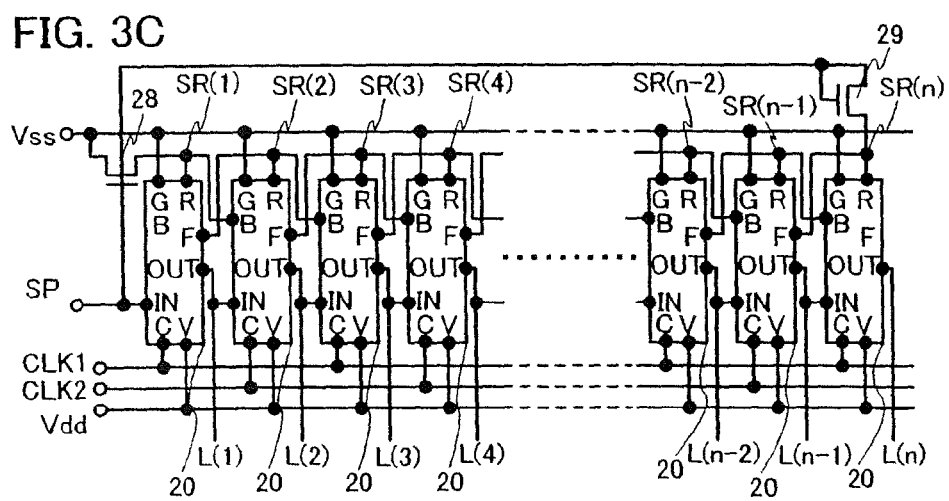

A configuration to be described in this embodiment mode is different from the configuration shown in Embodiment Mode 1, in which the last stage can be operated as a shift register. FIGS. 3A, 3B, and 3C each illustrate a configuration in which a transistor 29 which is used for reset operation of the last stage is added to each configuration shown in FIG. 1A, FIG. 2A, and FIG. 2C. The gate electrode of the transistor 29 is connected to the start pulse terminal SP, one of a source electrode and a drain electrode transistor 29 is connected to the start pulse terminal SP, the other of the source electrode and the drain electrode of the transistor 29 is connected to the electrode SR(n).

Further, as shown in FIGS. 3A to 3C, in the case where the transistor 29 is used for reset operation of the last stage, it is not necessary to perform reset operation of the last stage by the last stage itself, and reset operation can be performed at a timing when the start pulse is inputted; therefore, the electrode SR(n) and electrode SR(n−1) are not required to be connected.

Figure 4:
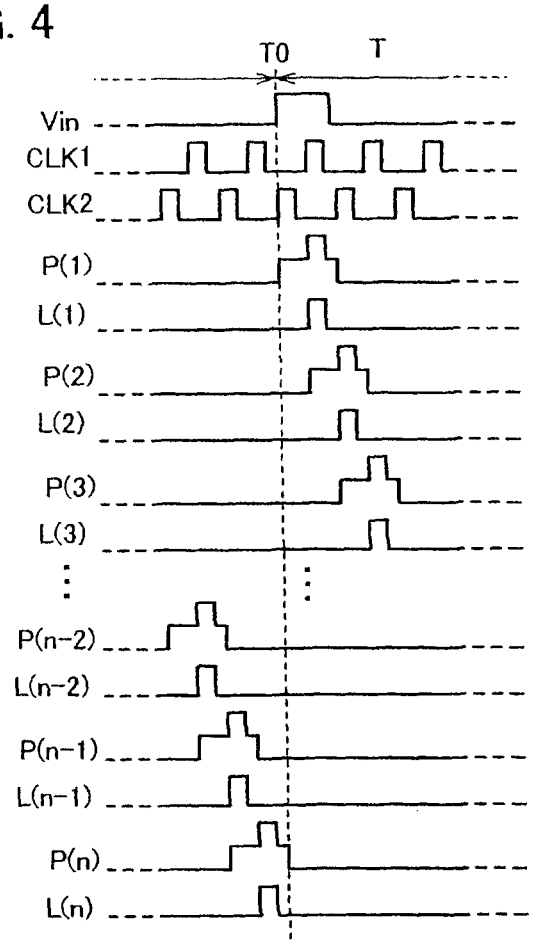
FIG. 4 illustrates a timechart of a shift register circuit of the present invention.

FIG. 4 is a timing chart for explaining operation of the circuit shown in FIGS. 3A to 3C. A different point from FIG. 1C is that since reset operation of the terminal P(n) of the last stage is performed at a timing when the start pulse is inputted (time T0), the output terminal L(n) of the last stage can also be operated as a shift register circuit. Here, in the timing chart in FIG. 4, when the period during which the start pulse is inputted is T, the total number of pulses of the clock signals, which are inputted during the period T is preferably greater than the number n of the stages in the shift register circuit. Thus, reset operation of the last stage can be securely operated during within the period T.

Next, referring to FIGS. 5A to 5C and FIG. 6, a shift register circuit of the present invention in which a signal line dedicated for reset operation is added will be described.

Figure 5A:
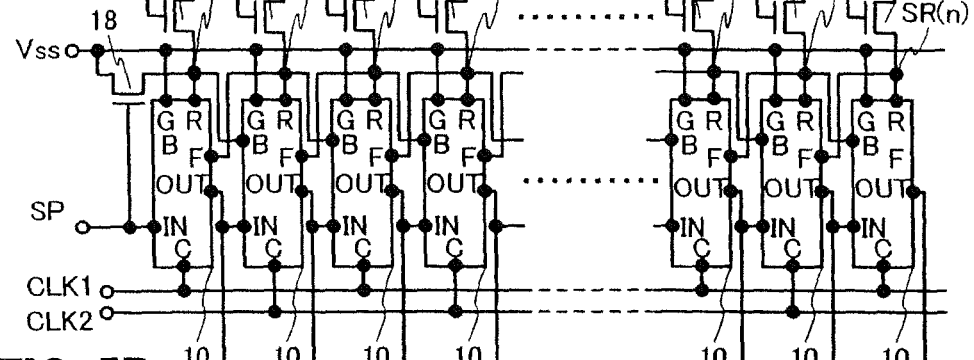
FIGS. 5A to 5C illustrate shift register circuits of the present invention.
Figure 5B:
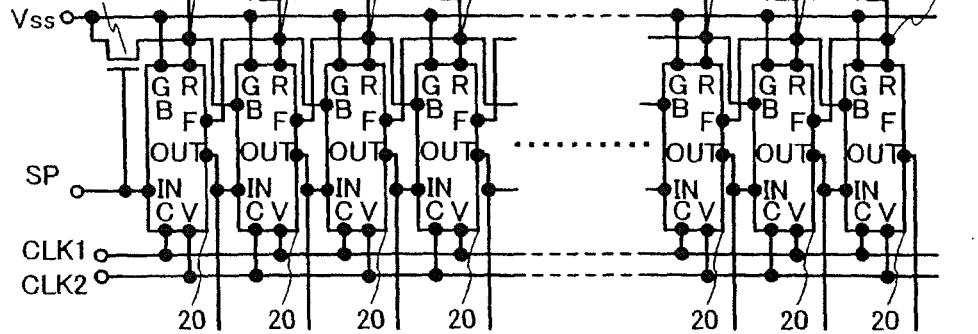
Figure 5C:
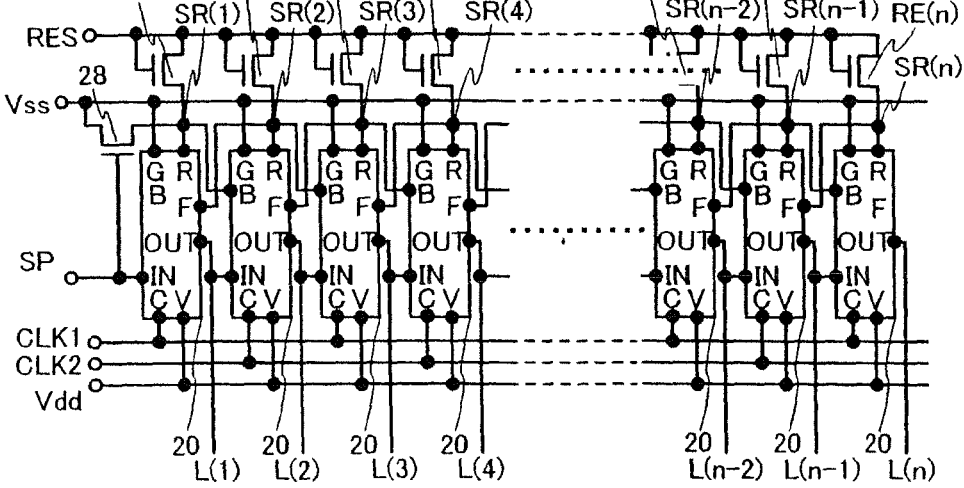

FIGS. 5A, 5B, and 5C each illustrate a configuration in which a signal line RES dedicated for reset operation and a transistor RE(k) (k is an integer from one to n inclusive) connected to the signal line RES are added to the configuration each shown in FIG. 1A, FIG. 2A, and FIG. 2C. The gate electrode of the transistor RE(k) is connected to the signal line RES, one of a source electrode and a drain electrode of the transistor RE(k) is connected to the signal line RES, the other of the source electrode and the drain electrode of the transistor RE(k) is connected to the electrode SR(k).

FIG. 5 and FIG. 6 illustrate shift register circuits, in which the transistor RE(k) is additionally connected to each of the stages, thereby all the stages can be reset at any arbitrary timing, which can be returned to an initial state before operating the last stage. However, the present invention is not limited to thereto, and the number of the transistor REs(k) is arbitrary. For example, the transistor RE may be provided only on the last stage, the transistors RE may be provided on only odd-numbered stages or only even-numbered stages, or the transistor RE may be provided on the stages in only the first half or only in the second half. There is an advantage in that the number of the transistors RE is reduced, the circuit scale becomes smaller accordingly; thereby the percentage of the circuit taking up over the substrate is reduced. Further, when the number of the transistors RE is reduced, the load of driving the signal line RES is reduced and power consumption can be reduced, which is advantageous.

Here, referring to FIG. 6, an operation of a shift register circuit of the present invention in which a signal line dedicated for reset operation is added will be described. FIG. 6 is a timing chart of change in the electric potentials of the input signal, the terminal P, and the output terminal L at time Tr when a pulse is inputted to a signal line RES to reset all the stages. When a start pulse is inputted at the time T0, the same operation as FIG. 1C is performed until a pulse is inputted to the signal line RES. However, when a pulse is inputted to the signal line RES at the time Tr, electric potentials of the electrodes SR of all the stages are at the stage H level; thus, the output terminal L and the terminal P are fixed at L level. Here, the transistor 16 or 26 for changing the electric potential of the electrode SR into the L level is turned OFF because the electric potential of the terminal P becomes the L level. Accordingly, a path through which current flows from the signal line RES to the power supply line Vss when a pulse is inputted to the signal line RES will not be formed.

Thus, as to the shift register circuits of the present invention in FIGS. 5A to 5C in each of which a signal line dedicated for reset operation is added, all the stages can be reset at any arbitrary timing, which can be returned to an initial state before operating the last stage. In the case of using this shift register circuit as a driver circuit of a display device, for example, only pixels arranged in a part of the display area are used, it is advantageous that pixels of an area not to be used will not be used by stopping the operation of the shift register circuit, which results in a merit that power consumption can be reduced.

Further, when a pulse is inputted to the signal line RES, the floated electrode SR is charged, so that decrease in the electric potential of the electrode SR due to leakage current can be prevented. Specifically, there is an advantage that a transistor of which gate electrode is connected to the electrode SR can easily be held at an ON-state.

Note that this embodiment mode can be freely combined with another embodiment mode.

Embodiment Mode 3

Voltage is applied between a gate electrode and a source electrode to turn a transistor ON. Here, if voltage is continuously applied to the gate electrode of the transistor, charges are trapped in energy levels regions between the source electrode or the drain electrode and the gate electrode due to an impurity or the like, and the trapped charges form an internal electric field; thus, change in characteristics over time is caused. Especially, change of shifting of the threshold voltage (threshold shift) is caused. As to this change over time, not only the voltage of the polarity for turning the transistor ON, but also the voltage of the inverted polarity (also referred to as a reverse bias) is also applied, thus, the trapped charges are discharged and the degree of change is known to decrease. The threshold shift is significantly observed in a thin film transistor using amorphous silicon in a channel layer, which has defect levels in a region between the source electrode or the drain electrode and the gate electrode. Therefore, the shift register circuit of this embodiment mode is particularly advantageous in a thin film transistor using amorphous silicon in a channel layer. However, the present invention is not limited thereto.

In this embodiment mode, description will be given of operation of applying a reverse bias to a transistor forming a shift register circuit of the present invention.

Figure 7A:
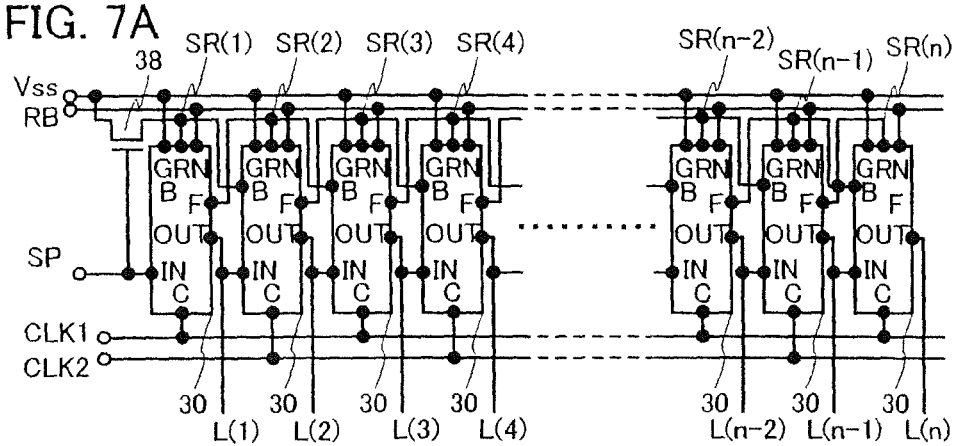
FIGS. 7A to 7C illustrate a shift register circuit of the present invention and a timechart thereof.
Figure 7B:
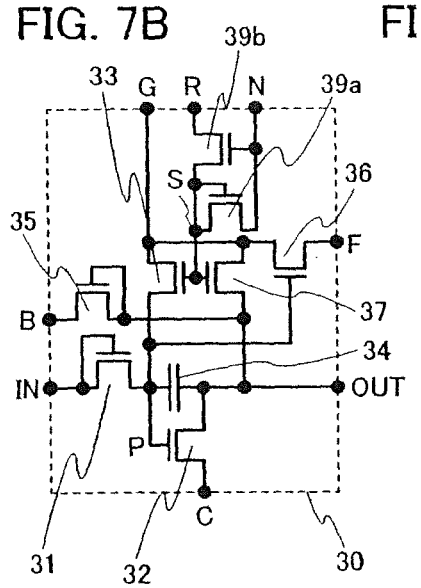
Figure 7C:
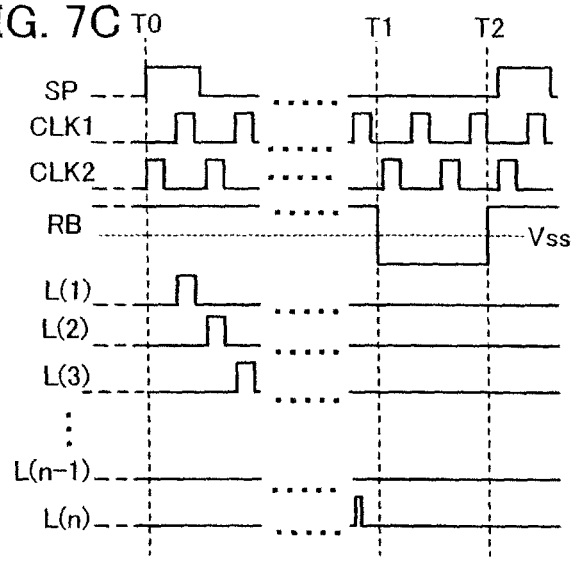

First, FIGS. 7A to 7C illustrates shift register circuits in which function of applying a reverse bias to reduce change in characteristics over time is added to the circuits shown in FIGS. 1A to 1C. FIG. 7A is an overall view of a shift register circuit of the present invention, FIG. 7B illustrates one stage of a circuit 30 of the shift register circuit of the present invention, and FIG. 7C is a timing chart of input signals and output signals of the shift register circuit of the present invention.

FIG. 7B shows a circuit in which transistors 39a and 39b, a terminal N, and an electrode S are added to a circuit shown in FIG. 1B. Further, transistors 31, 32, 35, 36, and 37 and a capacitor element 34 correspond to the transistors 11, 12, 15, 16, and 17 and the capacitor element 14 in FIG. 1B respectively, the connection is the same as FIG. 1B Further, the gate electrode of the transistor 33 in FIG. 7B is connected to an electrode S, one of a source electrode and a drain electrode of the transistor 33 is connected to the terminal G, and the other of the source electrode and the drain electrode of the transistor 33 is connected to the terminal P.

Further, the gate electrode of the transistor 37 is connected to the electrode S, one of a source electrode and a drain electrode of the transistor 37 is connected to the terminal G, and the other of the source electrode and the drain electrode of the transistor 37 is connected to the terminal OUT. The gate electrode of the transistor 39a is connected to the electrode S, one of a source electrode and a drain electrode of the transistor 39a is connected to the electrode S, and the other of the source electrode and the drain electrode of the transistor 39a is connected to the terminal N. Further, the gate electrode of the transistor 39b is connected to the terminal N, one of a source electrode and a drain electrode of the transistor 39b is connected to the electrode S, the other of the source electrode and the drain electrode of the transistor 39b is connected to the terminal R.

FIG. 7A illustrates a circuit in which a signal line RB connected to a terminal N of the circuit 30 in each stage is added to the circuit shown in FIG. 1A. Further, the transistor 38 corresponds to the transistor 18 in FIG. 1A, and the connection is similar.

Here, operations of the circuits shown in FIGS. 7A and 7B with reference to FIG. 7C. When a pulse is inputted to the start pulse terminal SP at time T0, the shift register circuit is operated, and output signals are outputted sequentially from the output terminal L(1). Further, the period during which the output signals are outputted to an output terminal L(n) is referred to as a normal operation period. During normal operation period, the electric potential of the H level may be inputted to the signal line RB. Here, the transistor 39b is in an ON-state, and the transistor 39a is in an OFF-state. Specifically, the terminal R and the electrode S are in conduction state, and the terminal N and the electrode S are in non-conduction state; thus, the connection state in FIG. 7B is similar to that of FIG. 1B, thereby the shift register circuits in FIGS. 7A to 7C operates in a like manner shown in FIGS. 1A to 1C.

Next, as shown in FIG. 7C, after an output signal is outputted to the output terminal L(n) of the shift register circuit shown in FIG. 7A, the electric potential of the signal line RB may be lowered between time T1 and time T2. This period is referred to as a reverse bias application period. Thus, the transistor 39b shown in FIG. 713 is turned OFF, and the transistor 39a is turned ON. That is, electrical continuity between the terminal R and the electrode S is lost and electrical continuity between the terminal N and the electrode S is made; thus, the electric potential of the electrode S is lowered. After that, when the electric potential of the electrode S exceeds the electric potential of the electrode N by the threshold voltage of the transistor 39a, the transistor 39a is turned OFF, and lowering of the electric potential of the electrode S is stopped. Here, the electric potential of the signal line RB may be lower than the electric potential of the power supply line Vss. When lower electric potential of the signal line RB is lower than the electric potential of the power supply line Vss, the electric potential of the electrode S can be lowered further during the reverse bias application period. Thus, the electric potential of the opposite polarity to the case of an ON-state can be applied to the gate electrodes of the transistors 33 and 37, thus, it is advantageous that the threshold shift of the transistor can be reduced.

Here, the transistor 39b is a transistor having functions of providing electrical continuity between the terminal R and the electrode S, during the normal operation period, and interrupting the electrical continuity between the terminal R and the electrode S during the reverse bias application period. In the case where the transistor 39b is not provided and electric continuity between the terminal R and the electrode S is established continuously, the circuit scale is made smaller, and since the value of parasitic capacitance connected to the signal line RB is reduced, which results in reduction of the power consumption.

Further, when the transistor 39b is disposed as shown in FIG. 7B, the electric potential of the terminal N is lowered by the signal line RB, the electric potential of the terminal R can be prevented from decreasing at the same time as the electric potential of the electrode S is lowered. Here, consider the case where the electrical continuity is established between the terminal R and the electrode S during the reverse bias application period, and the electric potential of the terminal R is also decreased with decrease of the electric potential of the electrode S. The terminal R is connected to the terminal F of the preceding circuit 30 through the electrode SR; therefore, when the electric potential of the terminal R is reduced to a potential lower than or equal to the electric potential of the power supply line Vss minus the threshold voltage of the transistor 36 in the preceding stage, the transistor 36 of the preceding stage is turned ON; thus, constant current flows through the signal line RB and the power supply line Vss. Further, the terminal R is also connected to the circuit 30 at the next stage through the electrode SR; therefore, when the electric potential of the terminal R is reduced, the transistors 35 and 32 of the next stage is turned ON; thus, constant current can be considered to flow through a clock signal line, the transistor 32, and the transistor 35 at the next stage, and the transistor 39a and the signal line RB at the current stage. Accordingly, during the reverse bias application period, electrical continuity between the terminal R and the electrode S is interrupted, thereby preventing the formation of a path of current including the terminal R due to decrease in the electric potential of the terminal R. Thus, sufficient reverse bias can be applied to the transistors 33 and 37 while reducing power consumption.

Note that in this embodiment mode, an example of applying a reverse bias to the gate electrodes of the transistors 33 and 37 during the reverse bias application period is described; however, the present invention is not limited thereto. A reverse bias may be applied to any of the transistors. However, the transistors 33 and 37 are in an ON-state during most of the period during when the output terminal L should out put the L level, and such transistors which are in an ON-state with large ratio of time will cause great degree of threshold shift. Accordingly, as shown in FIG. 7B, threshold shift should be reduced by connecting the transistors 39a and 39b to the gate electrodes of the transistors 33 and 37, and providing a reverse bias application period, which is effective and preferable.

Figure 8A:
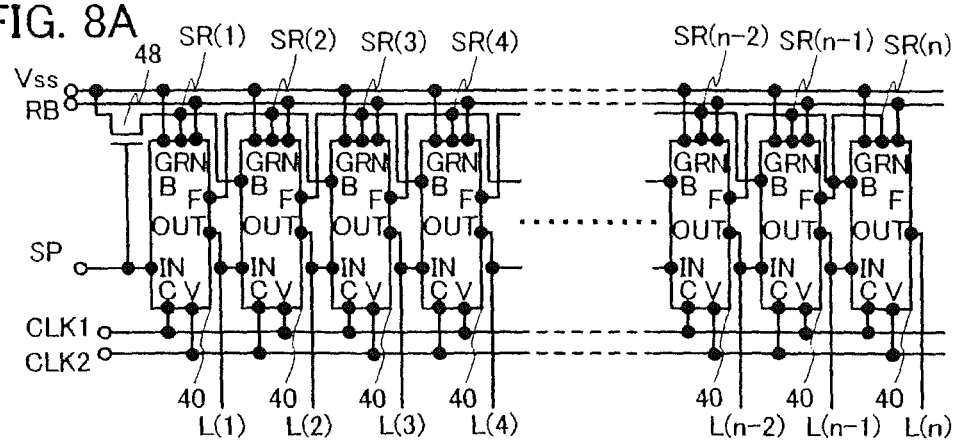
FIGS. 8A to 8C illustrate a shift register circuit of the present invention.
Figure 8B:
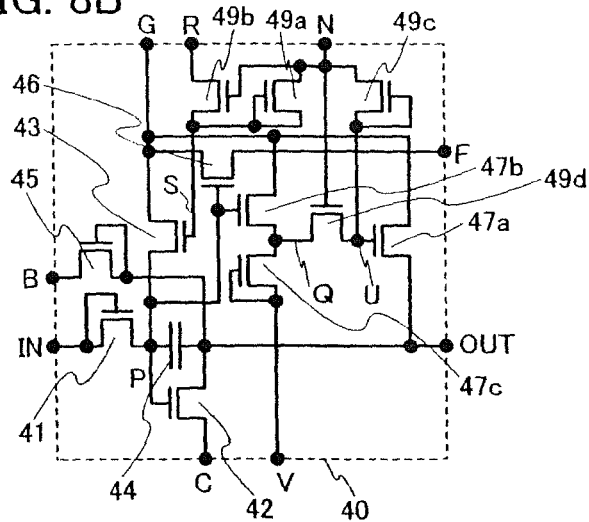
Figure 8C:
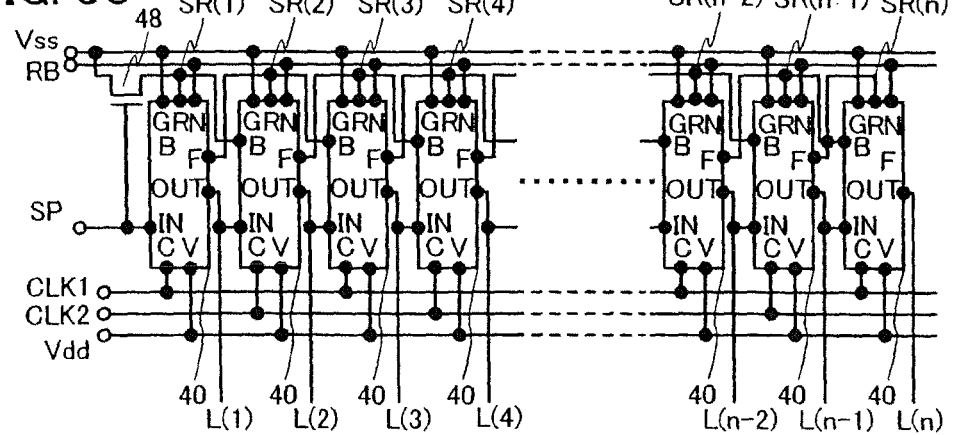

First, FIGS. 8A to 8C illustrates circuits in which a function of applying a reverse bias to reduce change in characteristics over time is added to the shift register circuit shown in FIGS. 2A to 2C. FIG. 8A is an overall view of a shift register circuit of the present invention, FIG. 8B illustrates one stage of a circuit 40 of the shift register circuit of the present invention, and FIG. 8C is another overall view the shift register circuit of the present invention.

FIG. 8B shows a circuit in which transistors 49a, 49b, 49c, and 49d, a terminal N, an electrode S, and an electrode U are added to a circuit shown in FIG. 2B. Further, transistors 41, 42, 45, 46, 47b, and 47c and a capacitor element 44 correspond to the transistors 21, 22, 25, 26, 27b, and 27c and the capacitor element 24 in FIG. 2B respectively, the connection is the same as FIG. 2B. Further, the gate electrode of the transistor 43 in FIG. 8B is connected to the electrode S, one of a source electrode and a drain electrode of the transistor 43 is connected to the terminal G, and the other of the source electrode and the drain electrode of the transistor 43 is connected to the terminal P.

Further, the gate electrode of the transistor 47a is connected to the electrode U, one of a source electrode and a drain electrode of the transistor 47a is connected to the terminal G, and the other of the source electrode and the drain electrode of the transistor 47a is connected to the terminal OUT. The gate electrode of the transistor 49a is connected to the electrode S, one of a source electrode and a drain electrode of the transistor 49a is connected to the electrode S, and the other of the source electrode and the drain electrode of the transistor 49a is connected to the terminal N. Further, the gate electrode of the transistor 49b is connected to the terminal N, one of a source electrode and a drain electrode of the transistor 49b is connected to the electrode R, and the other of the source electrode and the drain electrode of the transistor 49b is connected to the terminal S. The gate electrode of the transistor 49c is connected to the terminal U, one of a source electrode and a drain electrode of the transistor 49c is connected to the electrode U, and the other of the source electrode and the drain electrode of the transistor 49c is connected to the terminal N. Further, the gate electrode of the transistor 49d is connected to the terminal N, one of a source electrode and a drain electrode of the transistor 49d is connected to the electrode Q, the other of the source electrode and the drain electrode of the transistor 49d is connected to the terminal U.

Here, FIG. 8A illustrates a circuit in which a signal line RB connected to a terminal N of the circuit 40 in each stage is added to the circuit shown in FIG. 2A. Further, the transistor 48 corresponds to the transistor 28 in FIG. 2A, and the connection is similar. Further, FIG. 8C illustrates a circuit in which a power supply line Vdd is added to the circuit shown in FIG. 8A, and the power supply line Vdd is connected to the terminals V of the circuits 40 of all the stages.

Here, the circuits shown in FIGS. 8A, 8B, and 8C may be operated in accordance with the timing chart shown in FIG. 7C. In the case of operating the circuits shown in FIGS. 8A, 8B, and 8C in accordance with the timing chart shown in FIG. 7C, during normal operation period, the electric potential of the H level may be inputted to the signal line RB. Here, the transistors 49b and 49d are in an ON-state, and the transistors 49a and 49c are in an OFF-state. Specifically, the terminal R and the electrode S, and the terminal Q and the electrode U are in a conduction state, and the terminal N and the electrode S, and the electrode N and the electrode U are in a non-conduction state; thus, the connection state in FIG. 8B is similar to that of FIG. 2B, thereby the shift register circuits in FIGS. 8A to 8C operates in a like manner shown in FIGS. 2A to 2C.

Next, during the reverse bias application period, the transistors 49b and 49d shown in FIG. 8B are turned OFF, and the transistors 49a and 49c are turned ON. That is, the terminal R and the electrode S, and the terminal Q and the electrode U are in the non-conduction state, and the terminal N and the electrode S, and the electrode N and the electrode U are in the conduction state; thus, the electric potentials of the electrode S and the electrode U drop. After that, when the electric potentials of the electrode S and the electrode U exceed the electric potential of the electrode N by the threshold voltage of the transistors 49a and 49c are turned OFF, and lowering of the electric potential of the electrodes S and U is stopped. Here, the electric potential of the signal line RB may be lower than the electric potential of the power supply line Vss. When lower electric potential of the signal line RB is lower than the electric potential of the power supply line Vss, the electric potentials of the electrode S and the electrode U can be lowered further during the reverse bias application period. Thus, the electric potential of the opposite polarity to the case of an ON-state can be applied to the gate electrodes of the transistors 43 and 47a, thus, it is advantageous that the threshold shift of the transistor can be reduced.

Here, the transistors 49b and 49d are transistors having functions of providing conduction state of the terminal R and the electrode S, and the electrode Q and the electrode U during the normal operation period, and non-conduction state of the terminal R and the electrode S, and the electrode Q and the electrode U during the reverse bias application period. In the case where the transistors 49b and 49d are not provided and the terminal R and the electrode S, and the electrode Q and the electrode U are in the conduction state continuously, the circuit scale is made smaller, and since the value of parasitic capacitance connected to the signal line RB is reduced, which results in reduction of the power consumption.

Further, when the transistors 49b and 49d are disposed as shown in FIG. 8B, the electric potential of the terminal N is lowered by the signal line RB, the electric potentials of the terminal R and the electrode Q can be prevented from decreasing at the same time as the electric potentials of the electrode S and the electrode U are lowered.

Here, consider the case where the terminal R and the electrode S are in the conduction state during the reverse bias application period, and the electric potential of the terminal R is also decreased with decrease of the electric potential of the electrode S. The terminal R is connected to the terminal F of the preceding circuit 40 through the electrode SR; therefore, when the electric potential of the terminal R is reduced to a potential lower than or equal to the electric potential of the power supply line Vss minus the threshold voltage of the transistor 46 in the preceding stage, the transistor 46 of the preceding stage is turned ON; thus, constant current flows through the signal line RB and the power supply line Vss. Further, the terminal R is also connected to a transistor 45 of the circuit 40 at the next stage through the electrode SR; therefore, when the electric potential of the terminal R is reduced, the transistors 45 and 42 of the next stage is turned ON; thus, constant current can be considered to flow through a clock signal line, the transistor 42, and the transistor 45 at the next stage, and the transistor 49a and the signal line RB at the current stage.

Further, consider the case where the terminal Q and the electrode U are in the conduction state during the reverse bias application period, and the electric potential of the terminal Q is also decreased with decrease of the electric potential of the electrode U. Since the electrode Q is connected to a source electrode or a drain electrode of the transistors 47b and 47c, when the electric potential of the electrode Q is reduced, the transistors 47b and 47c are in an ON-state, so that constant current flows from the terminal G and the terminal V through the electrode Q, the transistor 49d, the electrode U, the transistor 49c, and the terminal N.

Accordingly, during the reverse bias application period, the terminal R and the electrode S, and the electrode Q and the electrode U are in the non-conduction state with the transistors 49b and 49d, thereby preventing the formation of a path of current including the terminal R and the electrode Q due to decrease in the electric potentials of the terminal R and the electrode Q. Thus, sufficient reverse bias can be applied to the transistors 43 and 47a while reducing power consumption. Note that both the transistors 49b and 49d may be provided, only one of them may be provided, or neither of them may be provided.

Note that in this embodiment mode, an example of applying a reverse bias to the gate electrodes of the transistors 43 and 47a during the reverse bias application period is described; however, the present invention is not limited thereto. A reverse bias may be applied to any of the transistors. However, the transistors 43 and 47a are in an ON-state during most of the period during when the output terminal L should output the L level, and such transistors which are in an ON-state with large ratio of time will cause great degree of threshold shift. Accordingly, as shown in FIG. 8B, threshold shift should be reduced by connecting the transistors 49a, 49b, 49c, and 49d to the gate electrodes of the transistors 43 and 47a, and providing a reverse bias application period, which is effective and preferable.

As described above, in this embodiment mode, threshold shift of the transistors 33, 37, and 43, 43a can be reduced by connecting the transistors 39a, 39b, 49a, 49b, 49c, and 49d for applying reverse bias to the gate electrodes of the transistors 33, 37, 43, and 47a. Further, a gate electrode of an arbitrary transistor of an arbitrary circuit in addition to the circuit shown in this embodiment mode may be connected to a circuit shown in FIGS. 9A to 9D, thereby applying a reverse bias to the transistor. Due to the circuits shown in FIGS. 9A to 9D, the electric potential of any electrode in the circuit other than the gate electrode of the transistor is not changed; thus, threshold shift of the transistor can be reduced without constant current flow or malfunctions.

The circuits shown in FIGS. 9A to 9D are each provided with a signal terminal SIG, a bias terminal BIAS, an object terminal GATE, a cut-off transistor SIG-Tr, and a bias transistor BIAS-Tr. Here, the bias transistor BIAS-Tr in each of the circuits shown in FIGS. 9A to 9D and FIGS. 10A to 10H are used as a rectifying element.

In the circuits shown in FIGS. 9A, 9B, 9C, and 9D, the gate electrode of the cut-off transistor SIG-Tr is connected to the bias terminal BIAS, one of a source electrode and a drain electrode of the cut-off transistor SIG-Tr is connected to the signal terminal SIG, and the other of the source electrode and the drain electrode of the cut-off transistor SIG-Tr is connected to the object terminal GATE.

Figure 9A:
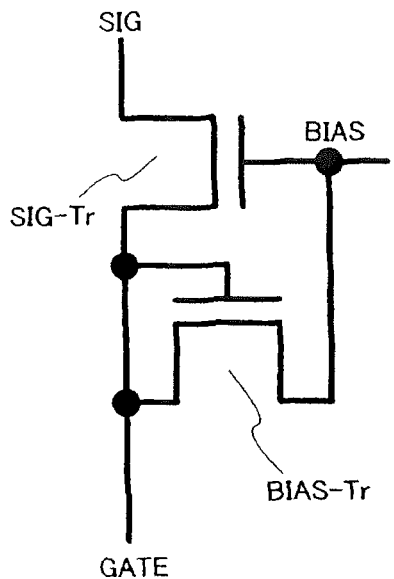
FIGS. 9A to 9D illustrate reverse bias circuits of the present invention.
Figure 9B:
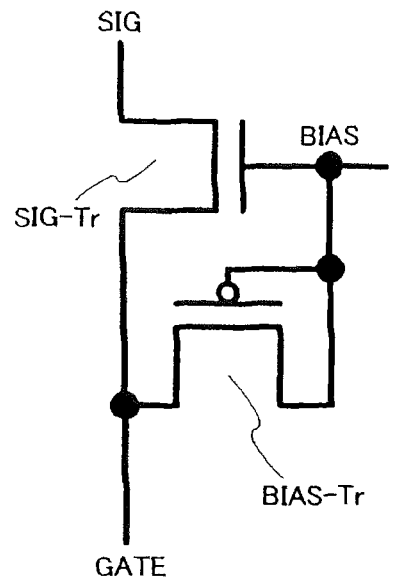
Figure 9C:
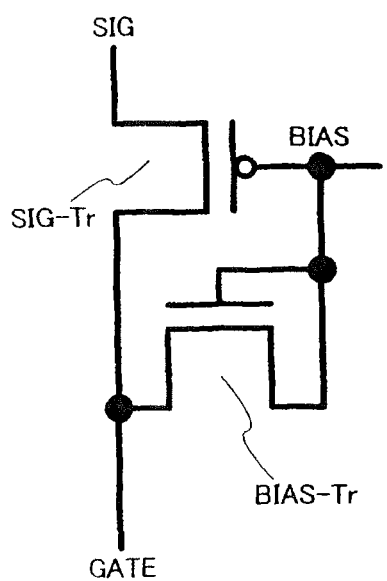
Figure 9D:
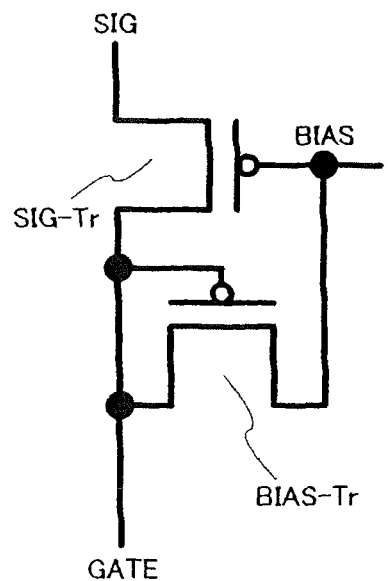

In the circuits shown in FIGS. 9A and 9D, the gate electrode of the bias transistor BIAS-Transistor is connected to the object terminal GATE, one of a source electrode and a drain electrode of the bias transistor BIAS-Tr is connected to the object terminal GATE, the other of the source electrode and the drain electrode of the bias transistor BIAS-Tr is connected to the bias terminal BIAS.

In the circuits shown in FIGS. 9B and 9C, the gate electrode of the bias transistor BIAS-Tr is connected to the bias terminal BIAS, one of a source electrode and a drain electrode of the bias transistor BIAS-Tr is connected to the object terminal GATE, and the other of the source electrode and the drain electrode of the bias transistor BIAS-Tr is connected to the bias terminal BIAS.

The object terminal GATE is connected to a transistor which applies a reverse bias. It is appropriate to apply a reverse bias to both between the gate electrode and a source electrode of the transistor, and between the gate electrode and a drain electrode of the transistor. Therefore, it is preferable to connect the object terminal GATE to the gate electrode of the transistor which applies a reverse bias. However, the present invention is not limited thereto, and the object terminal GAUL may be connected to the source electrode or the drain electrode of the transistor which applies a reverse bias. At that time, the polarity of the bias to be applied as a reverse bias may be opposite to the case where the object terminal GATE is connected to the gate electrode. Note that the number of transistors connected to the object terminal GATE is arbitrary.

The signal terminal SIG is connected to a signal line or a power supply line inputted to the transistor when the transistor is normally operated. The bias terminal BIAS is a signal line for selecting whether to apply a reverse bias to the transistor, or to transmit the electric potential of an electrode connected to the signal terminal SIG to the object terminal GATE.

Here, the circuits shown in FIGS. 9A, 9B, 9C, and 9D are classified with respect to the polarity of the cut-off transistor SIG-Transistor and the polarity of the bias transistor BIAS-Tr.

FIGS. 9A and 9B illustrate circuits in which the electric potential of an H level is applied to the bias terminal BIAS at a time of the normal operation, and the electric potential of L level is applied to the bias terminal BIAS at a time of applying a reverse bias. For example, the circuits can be used when the electrode to which a reverse bias is applied is the gate electrode of an n-channel transistor.

FIGS. 9C and 9D are circuits in which the electric potential of an L level is applied to the bias terminal BIAS at a time of the normal operation, and the electric potential of H level is applied to the bias terminal BIAS at a time of applying a reverse bias. For example, the circuits can be used when the electrode to which a reverse bias is applied is the gate electrode of a p-channel transistor. Thus, using a circuit shown in FIGS. 9A to 9D in this embodiment mode, a reverse bias can be applied to the gate electrode of any transistor in any circuit without changing the electric potentials of other electrodes in the circuit.

Next, the case where a transistor to which a reverse bias is applied is included in the circuits shown in FIGS. 9A to 9D will be described with reference to FIGS. 10A to 10H.

Figure 10A:
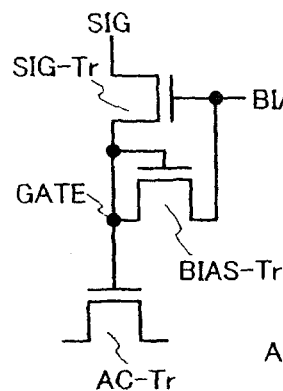
FIGS. 10A to 10H illustrate reverse bias circuits of the present invention.
Figure 10B:
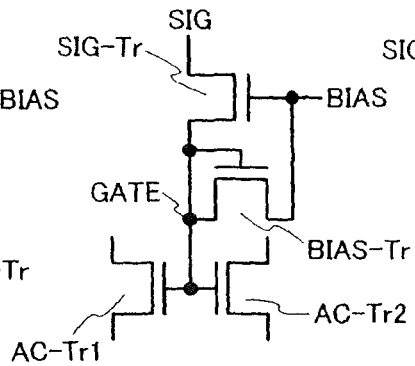

FIG. 10A illustrates a circuit including a transistor AC-Tr to which a reverse bias is applied is added to the circuit shown in FIG. 9A. As shown in FIG. 10A, the gate electrode of the transistor AC-Tr may be connected to the object terminal GATE of the circuit shown in FIG. 9A. FIG. 10B illustrates a circuit in which transistors AC-Tr1 and AC-Tr2 to which a reverse bias is applied are included in the circuit shown in FIG. 9A. As shown in FIG. 10B, the gate electrodes of the transistors AC-Tr1 and AC-Tr2 may be connected to the object terminal GATE in the circuit shown in FIG. 9A.

Here, the transistors AC-Tr, AC-Tr1, and AC-Tr2 may constitute a part of a circuit having a certain function as the whole as with the transistors 33 and 37 in FIGS. 7A to 7C or the transistors 43 and 47a in FIG. 8A to 8C, the circuit of the present invention in which a reverse bias is applied is not dependent on where one of each source electrode and each drain electrode of the transistors AC-Tr, AC-Tr1, and AC-Tr2. Further, the transistors AC-Tr, AC-Tr1, and AC-Tr2 may be N-channel transistors. Thus, in a period during which an H level is inputted to the bias terminal BIAS, a signal inputted to a signal terminal SIG is inputted to the transistor AC-Tr, AC-Tr1, and AC-Tr2, and in a period during which the L level is inputted to the bias terminal BIAS, the electric potential dependent on the electric potential of the L level is applied to the gate electrodes of the transistor AC-Tr, AC-Tr1, and AC-Tr2; thus, a reverse bias can be applied.

Figure 10C:
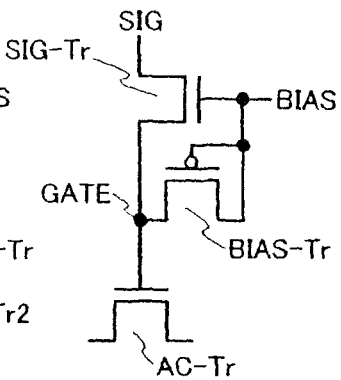
Figure 10D:
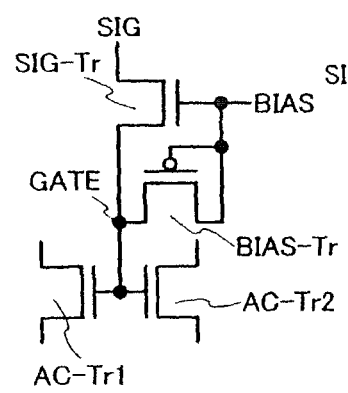

Further, FIG. 10C illustrates a circuit including a transistor AC-Tr to which a reverse bias is applied in addition to the circuit shown in FIG. 9B. As shown in FIG. 10C, the gate electrode of the transistor AC-Tr may be connected to the object terminal GATE of the circuit shown in FIG. 9B. Further, FIG. 10D illustrates a circuit in which transistors AC-Tr1 and AC-Tr2 to which a reverse bias is applied are included in the circuit shown in FIG. 9B. As shown in FIG. 10D, the gate electrodes of the transistors AC-Tr1 and AC-Tr2 may be connected to the object terminal GATE in the circuit shown in FIG. 9B. Here, the transistors AC-Tr, AC-Tr1, and AC-Tr2 may constitute a part of a circuit having a certain function as the whole as with the transistors 33 and 37 in FIGS. 7A to 7C or the transistors 43 and 47a in FIG. 8A to 8C, the circuit of the present invention in which a reverse bias is applied is not dependent on where one of each source electrode and each drain electrode of the transistors AC-Tr, AC-Tr1, and AC-Tr2. Further, the transistors AC-Tr, AC-Tr1, and AC-Tr2 may be N-channel transistors. Thus, in a period during which an H level is inputted to the bias terminal BIAS the period, a signal inputted to a signal terminal SIG is inputted to the transistor AC-Tr, AC-Tr1, and AC-Tr2, and in a period during which the L level is inputted to the bias terminal BIAS, the electric potential dependent on the L level is applied to the gate electrodes of the transistors AC-Tr, AC-Tr1, and AC-Tr2; thus, a reverse bias can be applied.

Figure 10E:
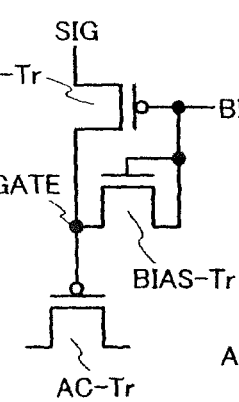
Figure 10F:
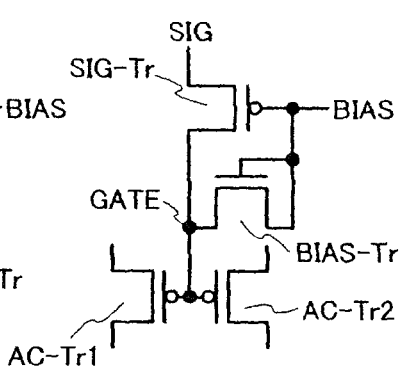

Further, FIG. 10E illustrates a circuit including a transistor AC-Tr to which a reverse bias is applied in addition to the circuit shown in FIG. 9C. As shown in FIG. 10E, the gate electrode of the transistor AC-Tr may be connected to the object terminal GATE of the circuit shown in FIG. 9C. Further, FIG. 10F illustrates a circuit in which transistors AC-Tr1 and AC-Tr2 to which a reverse bias is applied are included in the circuit shown in FIG. 9C As shown in FIG. 10F, the gate electrodes of the transistors AC-Tr1 and AC-Tr2 may be connected to the object terminal GATE in the circuit shown in FIG. 9C.

Here, the transistors AC-Tr, AC-Tr1, and AC-Tr2 may constitute a part of a circuit having a certain function as the whole as with the transistors 33 and 37 in FIGS. 7A to 7C or the transistors 43 and 47a in FIG. 8A to 8C, the circuit of the present invention in which a reverse bias is applied is not dependent on where one of each source electrode and each drain electrode of the transistors AC-Tr, AC-Tr1, and AC-Tr2.

Further, the transistors AC-Tr, AC-Tr1, and AC-Tr2 may be P-channel transistors. Thus, in a period during which an L level is inputted to the bias terminal BIAS, a signal inputted to a signal terminal SIG is inputted to the transistor AC-Tr, AC-Tr1, and AC-Tr2, and in the period during which the H level is inputted to the bias terminal BIAS, the electric potential dependent on the H level is applied to the gate electrodes of the transistor AC-Tr, AC-Tr1, and AC-Tr2; thus, a reverse bias can be applied.

Figure 10G:
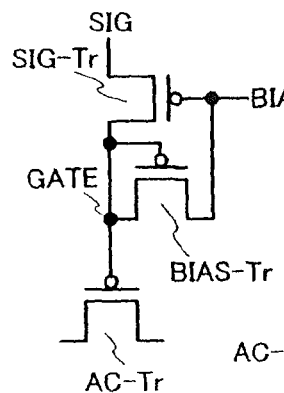

Further, FIG. 10G illustrates a circuit including a transistor AC-Tr to which a reverse bias is applied in addition to the circuit shown in FIG. 9D. As shown in FIG. 10G, the gate electrode of the transistor AC-Tr may be connected to the object terminal GATE of the circuit shown in FIG. 9D.

Figure 10H:
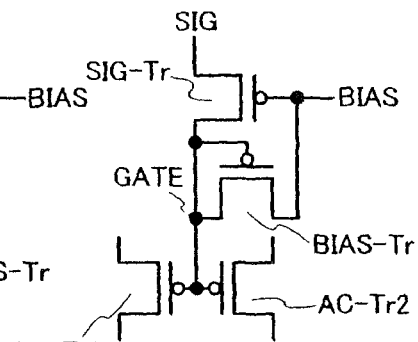

Further, FIG. 10H illustrates a circuit in which transistors AC-Tr1 and AC-Tr2 to which a reverse bias is applied are included in the circuit shown in FIG. 9D. As shown in FIG. 10H, the gate electrodes of the transistors AC-Tr1 and AC-Tr2 may be connected to the object terminal GATE in the circuit shown in FIG. 9D. Here, the transistors AC-Tr, AC-Tr1, and AC-Tr2 may constitute a part of a circuit having a certain function as the whole as with the transistors 33 and 37 in FIGS. 7A to 7C or the transistors 43 and 47a in FIG. 8A to 8C, the circuit of the present invention in which a reverse bias is applied is not dependent on where one of each source electrode and each drain electrode of the transistors AC-Tr, AC-Tr1, and AC-Tr2.

Further, the transistors AC-Tr, AC-Tr1, and AC-Tr2 may be P-channel transistors. Thus, in a period during which an L level is inputted to the bias terminal BIAS, a signal inputted to a signal terminal SIG is inputted to the transistor AC-Tr, AC-Tr1, and AC-Tr2, and in the period during which the H level is inputted to the bias terminal BIAS, the electric potential dependent on the H level is applied to the gate electrodes of the transistor AC-Tr, AC-Tr1, and AC-Tr2; thus, a reverse bias can be applied.

Next, referring to FIGS. 11A to 11C and FIG. 12, a shift register circuit of the present invention in which a signal line dedicated for reset operation is added to the circuits illustrated in FIG. A, FIG. 8A, and FIG. 8C in which a reverse bias can be applied will be described.

Figure 11A:
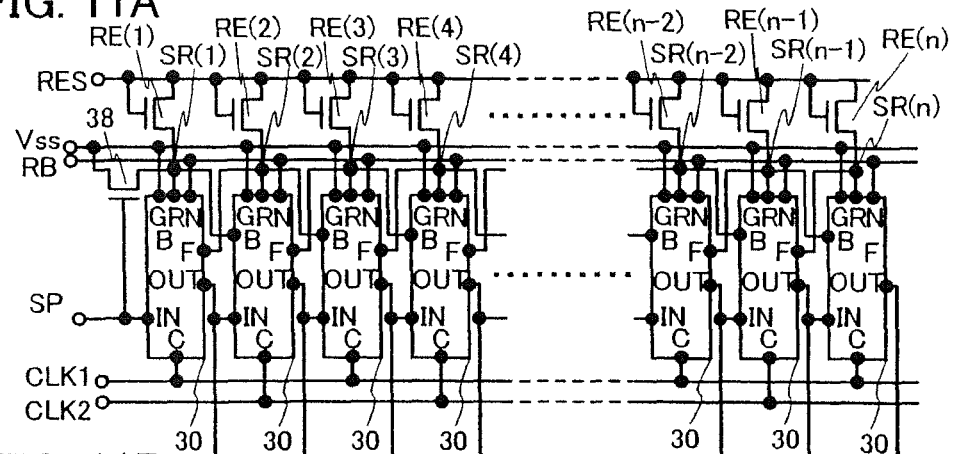
FIGS. 11A to 11C illustrate a shift register circuit of the present invention.
Figure 11B:
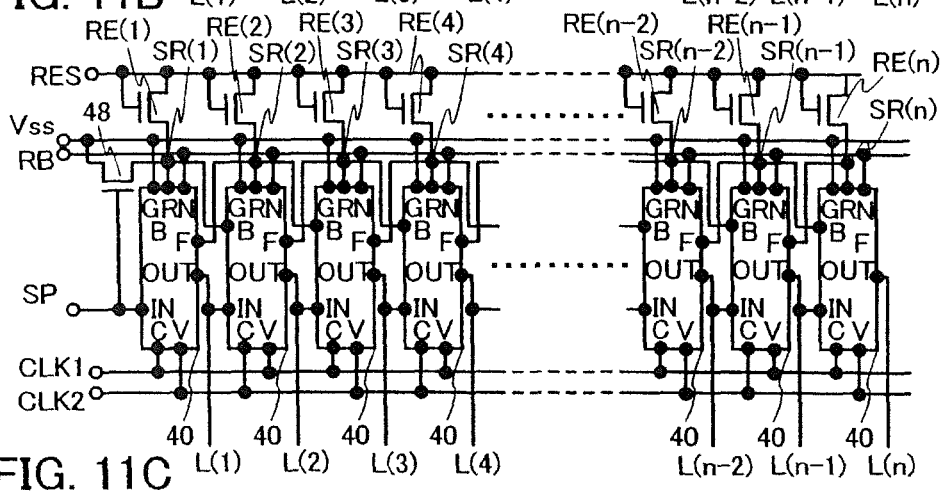
Figure 11C:
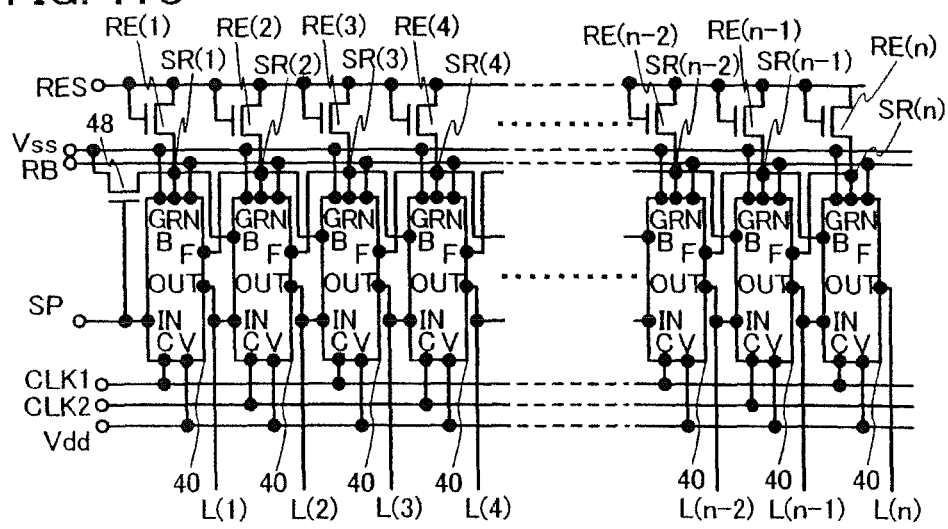

FIGS. 11A, 11B, and 11C each illustrate a configuration in which a signal line RES dedicated for reset operation and a transistor RE(k) (k is an integer from one to n inclusive) connected to the signal line RES are added to the configuration each shown in FIG. 7A, FIG. 8A, and FIG. 8C. The gate electrode of the transistor RE(k) is connected to the signal line RES, one of a source electrode and a drain electrode of the transistor RE(k) is connected to the signal line RES, and the other of the source electrode and the drain electrode of the transistor RE(k) is connected to the electrode SR(k).

FIGS. 11A to 11C illustrate shift register circuits, in which the transistor RE(k) is additionally connected to each of the stages, thereby all the stages can be reset at any arbitrary timing, which can be returned to an initial state before operating the last stage. However, the present invention is not limited to thereto, and the number of the transistor REs(k) is arbitrary. For example, the transistor RE may be provided only on the last stage, the transistors RE may be provided on only odd-numbered stages or only even-numbered stages, or the transistor RE may be provided on the stages in only the first half or only in the second half. There is an advantage in that the number of the transistors RE is reduced, the circuit scale becomes smaller accordingly; thereby the percentage of the circuit taking up over the substrate is reduced. Further, when the number of the transistors RE is reduced, the load of driving the signal line RES is reduced and power consumption can be reduced, which is advantageous.

Here, referring to FIG. 12, an operation of a shift register circuit of the present invention in which a signal line dedicated for reset operation is added will be described. FIG. 12 is a timing chart of change in the electric potentials of the input signal SP, the terminal P (not shown in the timing chart), and the output terminal L at time T1 when a pulse is inputted to a signal line RES to reset all the stages and at time T2 when the electric potential of the signal line RB is reduced to conduct a reverse bias application operation. When a start pulse is inputted at the time T0, the same operation as FIG. 1C is performed until a pulse is inputted to the signal line RES. However, when a pulse is inputted to the signal line RES at the time T1, electric potentials of the electrodes SR of all the stages are at the stage H level; thus, the output terminal L and the terminal P are fixed at L level. Here, the transistor 36 or 46 for changing the electric potential of the electrode SR into the L level is turned OFF because the electric potential of the terminal P becomes the L level. Accordingly, a path through which current flows from the signal line RES to the power supply line Vss when a pulse is inputted to the signal line RES will not be formed.

After that, during a period between time T2 and time T3, a reverse bias can be applied by reducing the electric potential of the signal line RB. Here, the electric potential of the signal line RB is preferably lower than the electric potential of the power supply line Vss. Further, the electric potentials of the signal line RB and the signal line RES may be set at H level in order to later operate reset operation again during a period between time T3 and time T4. When thus another reset operation is performed after applying a reverse bias, the electric potentials of the electrode S, the terminal R, the electrode SR are set at H level; accordingly, the electric potential of the output terminal L is fixed at L level, thereby the period during which change in the electric potential of output is suppressed can be extended.

Thus, as to the shift register circuits of the present invention in FIGS. 11A to 11C in each of which a signal line dedicated for reset operation is added, all the stages can be reset at any arbitrary timing, which can be returned to an initial state before operating the last stage and a reverse bias can be applied at any arbitrary timing. In the case of using this shift register circuit as a driver circuit of a display device, for example, only pixels arranged in a part of the display area are used, it is advantages that pixels of an area not to be used will not be used by stopping the operation of the shift register circuit, which results in a merit that power consumption can be reduced and the threshold shift of the transistor can be reduced. Further, when a pulse is inputted to the signal line RES, the floated electrode SR is charged, so that decrease in the electric potential of the electrode SR due to leakage current can be prevented. Specifically, there is an advantage that a transistor of which gate electrode is connected to the electrode SR can easily be held at an ON-state.

Figure 13A:
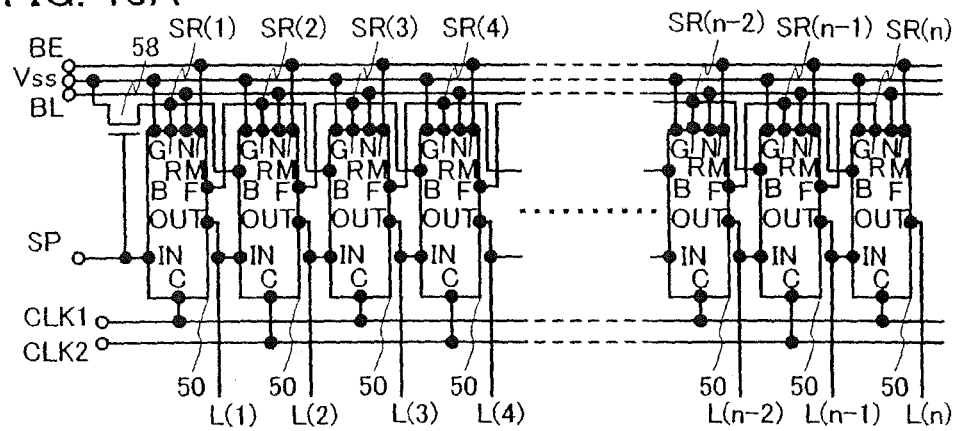
FIGS. 13A to 13C illustrate a shift register circuit of the present invention and a timechart thereof.
Figure 13B:
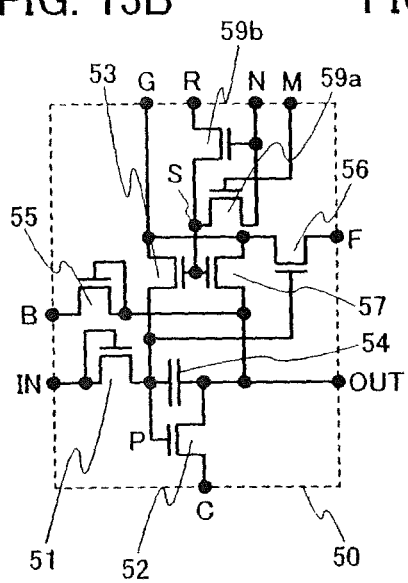
Figure 13C:
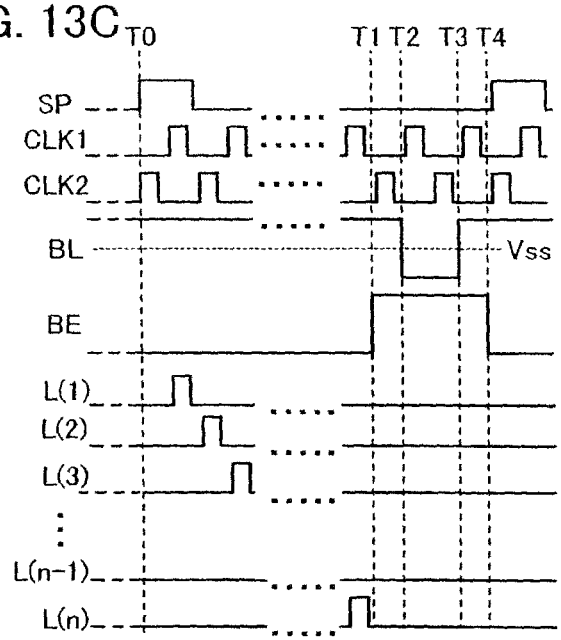

Next, referring to FIGS. 13A to 13C, description is given of a circuit which can conduct reset operation in addition to reverse bias operation by adding only one signal line to the shift register circuit shown in FIGS. 7A to 7C in which a revere bias can be applied.

FIG. 13A is an overall view of a shift register circuit of the present invention, FIG. 13B illustrates one stage of a circuit 50 of the shift register circuit of the present invention, and FIG. 13C is a timing chart of input signals and output signals of the shift register circuit of the present invention.

FIG. 13B illustrates a circuit in which the connection of the transistor 39a (corresponding to a transistor 59a) is modified from and a terminal M is added to the circuit shown in FIG. 7B. Here, transistors 51, 52, 53, 55, 56, 57, and 59b and a capacitor element 54 correspond to the transistors 31, 32, 33, 35, 36, 37, and 39b and the capacitor element 34 in FIG. 7B respectively, and the connections are the same as that shown in FIG. 7B. Further, the gate electrode of the transistor 59a in FIG. 13B of which connection has been modified is connected to the terminal M, one of a source electrode and a drain electrode of the transistor 59a is connected to the electrode S, and the other of the source electrode and the drain electrode of the transistor 59a is connected to the terminal N.

FIG. 13A illustrates a circuit in which the signal line RB of the circuit shown in FIG. 7A is replaced with a signal line BL and a signal line BE connected to a terminal M of the circuit 50 in each stage is added to the circuit shown in FIG. 7A. Further, the transistor 58 corresponds to the transistor 38 in FIG. 7A, and the connection is similar.

Here, operations of the circuits shown in FIGS. 13A and 13B will be explained with reference to FIG. 13C. During normal operation period, the electric potential of the H level may be inputted to the signal line BL and the electric potential of the L level may be inputted to the signal line BE. Here, the transistor 59b is in an ON-state, and the transistor 59a is in an OFF-state. Specifically, the terminal R and the electrode S are in the conduction state, and the terminal N and the electrode S are in the non-conduction state; thus, the connection state in FIG. 13B is similar to that of FIG. 1B, thereby the shift register circuits in FIGS. 13A to 13C operates in a like manner shown in FIGS. 1A to 1C.

Next, as shown in FIG. 13C, after the normal operation period of the shift register circuit shown in FIG. 13A is finished, the electric potential of the signal line BE may be increased between time T1 and time T4. This period is referred to as a bias enable period. In the bias enable period, the transistor 59a is in an ON-state. Periods in the bias enable period, in which the electric potential of the signal line BL is at H level (between time T1 and time T2, and between time T3 and T4) are referred to as reset periods. In the reset periods, the transistors 59a and 59b are in an ON-state, and the electric potential of the terminal N is at H level; therefore, the electric potentials of the electrode S, the terminal R, and the electrode SR to which the terminal R is connected become H level. That is, reset operation can be performed. Further, in the bias enable period, the period during which the electric potential of the signal line BL is at L level (between time T2 and time T3) is a reverse bias application period. In the reverse bias application period, the transistor 59b in FIG. 13B is turned OFF, and the transistor 59a is turned ON. Specifically, the terminal R and the electrode S are in the non-conduction state, and the terminal N and the electrode S are in the conduction state, thereby the electric potential of the electrode S becomes L level in accordance with the electric potential of the electrode N. Thereupon, since the transistor 59b is in the non-conduction state, the electric potential of the terminal N does not transmitted to the terminal R. Here, the electric potential of the signal line BL may be lower than the electric potential of the power supply line Vss. If the lower electric potential of the signal line BL is lower than the electric potential of the power supply line Vss, the electric potential of the electrode S can be made further lower in the reverse bias application period. Thus, the electric potential which is has the opposite polarity to the case of ON-state can be applied to the gate electrodes of the transistors 53 and 57, thereby the threshold shift of the transistors can be reduced.

As described above, as to the shift register circuit of the present invention shown in FIGS. 13A to 13C, normal operation periods and bias enable periods can be arbitrarily provided by the signal line BE. Further, in the bias enable period, if the electric potential of the signal line BL is at H level, the circuit 50 can be subjected to reset operation; meanwhile, the electric potential of the signal line BL is at L level, a reverse bias can be applied to the transistors 53 and 57. Moreover, lowering of the electric potential of the signal line BL does not change the potentials of other electrodes than the electrode S; thus, troubles such as flowing of constant current and malfunctions can be reduced. Note that in the bias enable period, the electric potential of the electrode S can be set freely.

Figure 14A:
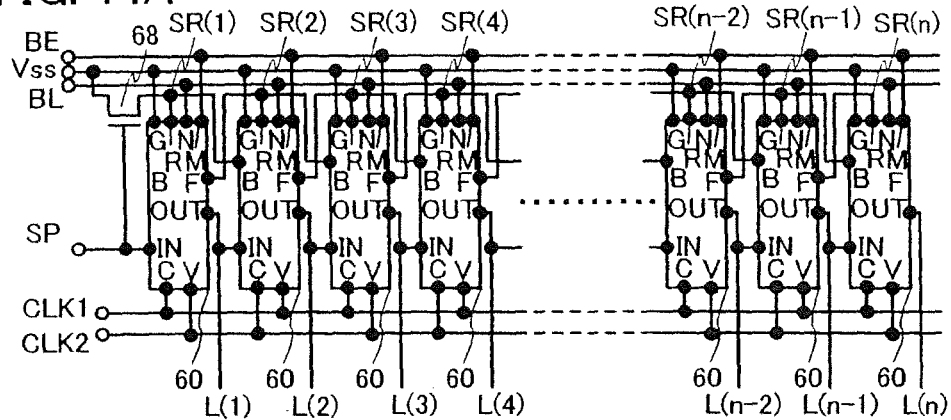
FIGS. 14A to 14C illustrate a shift register circuit of the present invention.
Figure 14B:
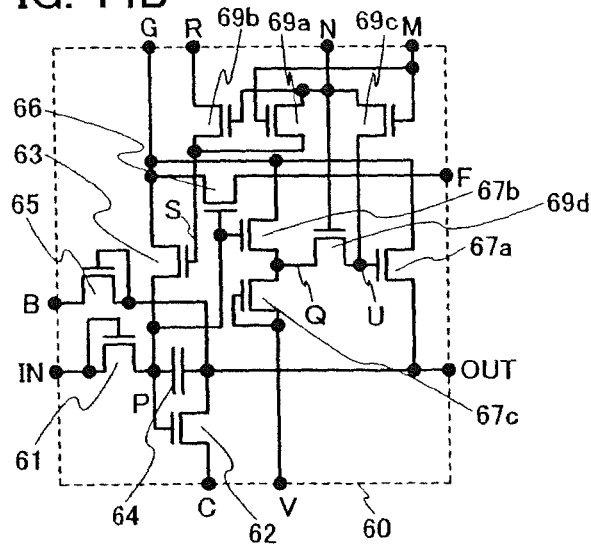
Figure 14C:
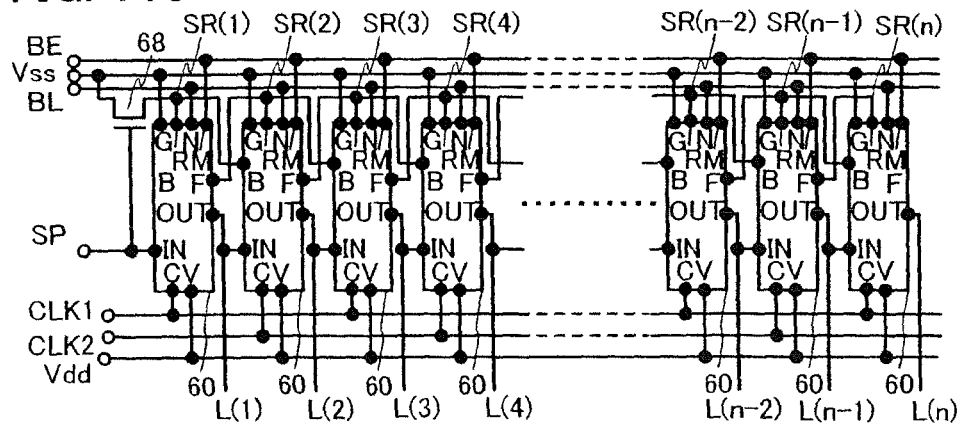

Next, referring to FIGS. 14A to 14C, description is given of a circuit which can conduct reset operation in addition to reverse bias operation by adding only one signal line to the shift register circuit shown in FIGS. 8A to 8C in which a revere bias can be applied.

FIG. 14A is an overall view of a shift register circuit of the present invention, FIG. 14B illustrates one stage of a circuit 60 of the shift register circuit of the present invention, and FIG. 14C is another overall view of the shift register circuit of the present invention. FIG. 14B illustrates a circuit in which the connection of the transistor 39a (corresponding to a transistor 59a) is modified from and a terminal M is added to the circuit shown in FIG. 7B. Further, transistors 61, 62, 63, 65, 66, 67a, 67b, 67c, 69b, and 69d and a capacitor element 64 correspond to the transistors 41, 42, 43, 45, 46, 47a, 47b, 47c, 49b, and 49d, and the capacitor element 44 in FIG. 8B respectively, and the connections are the same as that shown in FIG. 8B.

Further, the gate electrode of the transistor 69a in FIG. 14B is connected to the terminal M, one of a source electrode and a drain electrode of the transistor 69a is connected to the electrode S, and the other of the source electrode and the drain electrode of the transistor 69a is connected to the terminal N. The gate electrode of the transistor 69c is connected to the terminal M, one of a source electrode and a drain electrode of the transistor 69a is connected to the electrode U, and the other of the source electrode and the drain electrode of the transistor 69a is connected to the terminal N.

Here, FIG. 14A illustrates a circuit in which a signal line RB connected to a terminal N of the circuit 40 in each stage is added to the circuit shown in FIG. 8A. Further, the transistor 68 corresponds to the transistor 48 in FIG. 8A, and the connection is similar. Further, FIG. 14C illustrates a circuit in which a power supply line Vdd is added to the circuit shown in FIG. 14A, and the power supply line Vdd is connected to the terminal V of the circuits 60 of all the stages.

Here, the circuits shown in FIGS. 14A, 14B, and 14C may be operated in accordance with the timing chart shown in FIG. 13C. In the case of operating the circuits shown in FIGS. 14A, 14B, and 14C in accordance with the timing chart shown in FIG. 13C, during normal operation period, the electric potential of the H level may be inputted to the signal line BL and the electric potential of the L level may be inputted to the signal line BE. Here, the transistors 69b and 69d are in an ON-state, and the transistors 69a and 69c are in an OFF-state. Specifically, the terminal R and the electrode S, and the terminal Q and the electrode U are in the conduction state, and the terminal N and the electrode S, and the electrode N and the electrode U are in the non-conduction state; thus, the connection state in FIG. 14B is similar to that of FIG. 2B, thereby the shift register circuits in FIGS. 14A to 14C operates in a like manner shown in FIGS. 2A to 2C.

Next, during the bias enable period, a reset period can be provided by increasing the electric potential of the signal line BL to the H level, and a reverse bias application period can be provided by reducing the electric potential of the signal line BL to the L level. In the reset period, the transistors 69a, 69b, 69c, and 69d are all turned ON, and the terminal N at H level; thus, the circuit 60 is reset. On the other hand, in FIG. 14B, in the reverse bias application period, the transistors 69b and 69d are turned OFF, and the transistors 69a and 69c are turned ON. That is, the terminal R and the electrode S, and the terminal Q and the electrode U are in the non-conduction state, and the terminal N and the electrode S, and the electrode N and the electrode U are in the conduction state; thus, since the electric potential of the terminal N is low, the electric potentials of the electrode S and the electrode U become low. Here, the electric potential of the signal line BL may be lower than the electric potential of the power supply line Vss. When lower electric potential of the signal line BL is lower than the electric potential of the power supply line Vss, the electric potential of the electrode S can be lowered further during the reverse bias application period. Thus, the electric potential of the opposite polarity to the case of an ON-state can be applied to the gate electrodes of the transistors 63 and 67a, thus, the threshold shift of the transistor can be reduced.

As described above, as to the shift register circuit of the present invention shown in FIGS. 14A to 14C, normal operation periods and bias enable periods can be arbitrarily provided by the signal line BR Further, in the bias enable period, if the electric potential of the signal line BL is at H level, the circuit 60 can be subjected to reset operation; meanwhile, the electric potential of the signal line BL is at L level, a reverse bias can be applied to the transistors 63 and 67a. Moreover, lowering of the electric potential of the signal line BL does not change the potentials of other electrodes than the electrode S and the electrode U; thus, troubles such as flowing of constant current and malfunctions can be reduced. Note that in the bias enable period, the electric potentials of the electrode S and the electrode U can be set freely.

Here, the gate electrode of an arbitrary transistor of an arbitrary circuit in addition to the circuit shown in FIGS. 13A to 13C and 14A to 14C may be connected to a circuit shown in FIGS. 15A to 15D, thereby applying a forward bias in addition to a reverse bias to the transistor. Due to the circuits shown in FIG. 15A to 15D, the electric potential of any electrode in the circuit other than the gate electrode of the transistor is not changed when a reverse bias is applied; thus, threshold shift of the transistor can be reduced without constant current flow or malfunctions. When a forward bias is applied, the cut-off transistor SIG-Tr turns ON; thus, the electric potential of an electrode connected to the signal terminal SIG and the signal terminal SIG can be initialized or reset.

The circuits shown in FIGS. 15A to 15D are each provided with a signal terminal SIG, a bias terminal BIAS, an object terminal GATE, a cut-off transistor SIG-Tr, and a bias transistor BIAS-Tr. In the circuits shown in FIGS. 15A, 15B, 15C, and 15D, the gate electrode of the cut-off transistor SIG-Tr is connected to the bias terminal BIAS, one of a source electrode and a drain electrode of the cut-off transistor SIG-Tr is connected to the signal terminal SIG, and the other of the source electrode and the drain electrode of the cut-off transistor SIG-Tr is connected to the object terminal GATE.

In the circuits shown in FIGS. 15A, 15B, 15C, and 15D, the gate electrode of the bias transistor BIAS-Tr is connected to the selection terminal BE-SW, one of a source electrode and a drain electrode of the bias transistor BIAS-Tr is connected to the object terminal GATE, and the other of the source electrode and the drain electrode of the bias transistor BIAS-Tr is connected to the bias terminal BIAS.

The object terminal GATE, is connected to a transistor which applies a reverse bias. It is appropriate to apply a reverse bias to both between the gate electrode and a source electrode of the transistor, and between the gate electrode and a drain electrode of the transistor. Therefore, it is preferable to connect the object terminal GATE to the gate electrode of the transistor which applies a reverse bias. However, the present invention is not limited thereto, and the object terminal GATE may be connected to the source electrode or the drain electrode of the transistor which applies a reverse bias. At that time, the polarity of the bias to be applied as a reverse bias may be opposite to the case where the object terminal GATE is connected to the gate electrode. Note that the number of transistors connected to the object terminal GATE is arbitrary.

The signal terminal SIG is connected to a signal line or a power supply line inputted to the transistor when the transistor is normally operated. The selection terminal BE-SW is a signal line for selecting whether or not transmitting the electric potential of the bias terminal BIAS to the object terminal GATE. The bias terminal BIAS is a signal line for controlling an electric potential applied to the object terminal GATE when the bias transistor BIAS-Tr is in an ON-state. When the bias transistor BIAS-Tr is in an OFF-state, the bias terminal BIAS is used for controlling whether to make or break electrical continuity between the signal terminal SIG and the object terminal GATE.

Here, the circuits shown in FIGS. 15A, 15B, 15C, and 15D are classified with respect to the polarity of the cut-off transistor SIG-Tr and the polarity of the bias transistor BIAS-Tr.

Figure 15A:
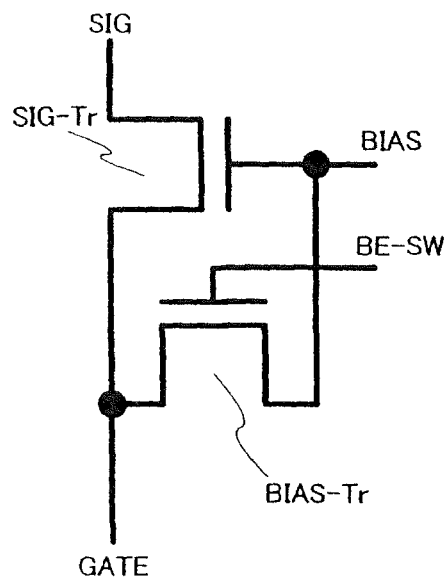
FIGS. 15A to 15D illustrate reverse bias-reset circuits of the present invention.

FIG. 15A illustrates a circuit in which the electric potential of the H level is applied to the bias terminal BIAS and the electric potential of the L level is applied to the selection terminal BE-SW at a time of the normal operation, the electric potential of the H level is applied to the bias terminal BIAS and the electric potential of the H level is applied to the selection terminal BE-SW at a time of reset operation, and the electric potential of L level is applied to the bias terminal BIAS and the electric potential of the H level is applied to the selection terminal BE-SW at a time of applying a reverse bias. For example, the circuit can be used when the electrode to which a reverse bias is applied is the gate electrode of an n-channel transistor.

Figure 15B:
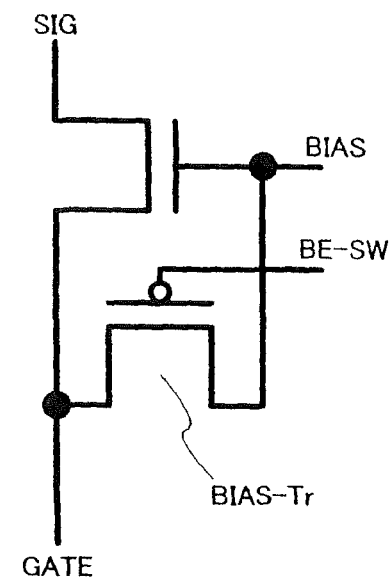

FIG. 15B illustrates a circuit in which the electric potential of the H level is applied to the bias terminal BIAS and the electric potential of the H level is applied to the selection terminal BE-SW at a time of the normal operation, the electric potential of the H level is applied to the bias terminal BIAS and the electric potential of the L level is applied to the selection terminal BE-SW at a time of reset operation, and the electric potential of L level is applied to the bias terminal BIAS and the electric potential of the L level is applied to the selection terminal BE-SW at a time of applying a reverse bias. For example, the circuit can be used when the electrode to which a reverse bias is applied is the gate electrode of an n-channel transistor.

Figure 15C:
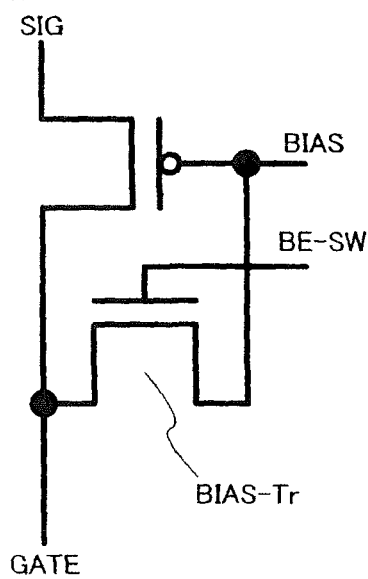

FIG. 15C illustrates a circuit in which the electric potential of the L level is applied to the bias terminal BIAS and the electric potential of the L level is applied to the selection terminal BE-SW at a time of the normal operation, the electric potential of the L level is applied to the bias terminal BIAS and the electric potential of the H level is applied to the selection terminal BE-SW at a time of reset operation, and the electric potential of H level is applied to the bias terminal BIAS and the electric potential of the H level is applied to the selection terminal BE-SW at a time of applying a reverse bias. For example, the circuit can be used when the electrode to which a reverse bias is applied is the gate electrode of a P-channel transistor.

Figure 15D:
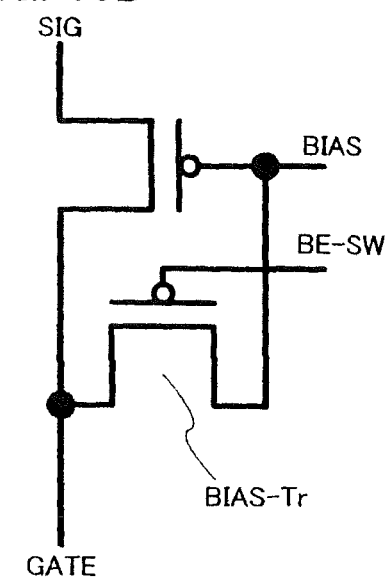

FIG. 15D illustrates a circuit in which the electric potential of the L level is applied to the bias terminal BIAS and the electric potential of the H level is applied to the selection terminal BE-SW at a time of the normal operation, the electric potential of the L level is applied to the bias terminal BIAS and the electric potential of the L level is applied to the selection terminal BE-SW at a time of reset operation, and the electric potential of H level is applied to the bias terminal BIAS and the electric potential of the L level is applied to the selection terminal BE-SW at a time of applying a reverse bias. For example, the circuit can be used when the electrode to which a reverse bias is applied is the gate electrode of a P-channel transistor.

Thus, using a circuit shown in FIGS. 15A to 15D in this embodiment mode, a reverse bias can be applied to the gate electrode of any transistor in any circuit without changing the electric potentials of other electrodes in the circuit. Further, a forward bias can be applied to both the signal terminal SIG and the object terminal GATE.

Next, the case where a transistor to which a reverse bias is applied is included in the circuits shown in FIGS. 15A to 15D will be described with reference to FIGS. 16A to 16H.

Figure 16A:
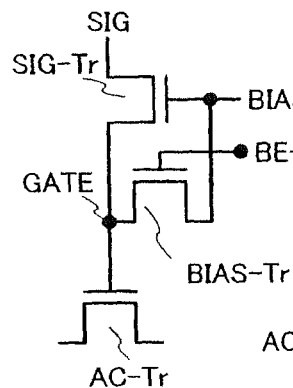
FIGS. 16A to 16H illustrate reverse bias-reset circuits of the present invention.
Figure 16B:
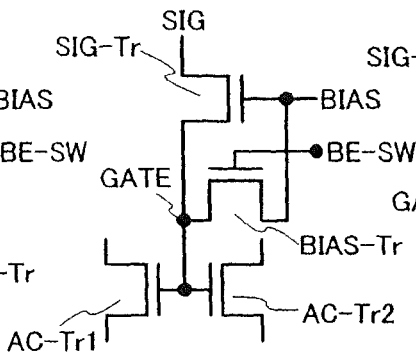

FIG. 16A illustrates a circuit including a transistor AC-Tr to which a reverse bias is applied is added to the circuit shown in FIG. 15A. As shown in FIG. 16A, the gate electrode of the transistor AC-Tr may be connected to the object terminal GATE of the circuit shown in FIG. 15A. FIG. 16B illustrates a circuit in which transistors AC-Tr1 and AC-Tr2 to which a reverse bias is applied are included in the circuit shown in FIG. 15A. As shown in FIG. 16B, the gate electrodes of the transistors AC-Tr1 and AC-Tr2 may be connected to the object terminal GATE in the circuit shown in FIG. 15A.

Here, the transistors AC-Tr, AC-Tr1, and AC-Tr2 may constitute a part of a circuit having a certain function as the whole as with the transistors 53 and 57 in FIGS. 13A to 13C and the transistors 63 and 67a in FIG. 14A to 14C, the circuit of the present invention in which a reverse bias is applied is not dependent on where one of each source electrode and each drain electrode of the transistors AC-Tr, AC-Tr1, and AC-Tr2.

Further, the transistors AC-Tr, AC-Tr1, and AC-Tr2 may be N-channel transistors. Thus, in a period during which an H level is inputted to the bias terminal BIAS and the L level is inputted to the selection terminal BE-SW, a signal inputted to a signal terminal SIG is inputted to the transistor AC-Tr, AC-Tr1, and AC-Tr2, and in a period during which the L level is inputted to the bias terminal BIAS and the H level is inputted to the selection terminal BE-SW, the electric potential dependent on the electric potential of the L level of the bias terminal BIAS is applied to the gate electrodes of the transistor AC-Tr, AC-Tr1, and AC-Tr2; thus, a reverse bias can be applied. Further, in a period during which the H level is inputted to the bias terminal BIAS and the H level is inputted to the selection terminal BE-SW, an electric potential dependent on the electric potential of the H level of the bias terminal BIAS can be applied to the gate electrodes of the transistors AC-Tr, AC-Tr1, and AC-Tr2.

Figure 16C:
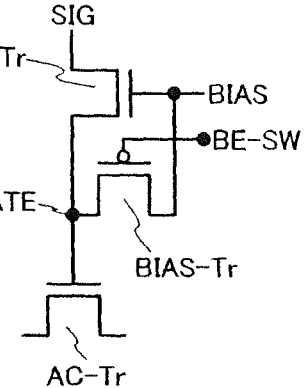

Further, FIG. 16C illustrates a circuit including a transistor AC-Tr to which a reverse bias is applied is added to the circuit shown in FIG. 15B. As shown in FIG. 16C, the gate electrode of the transistor AC-Tr may be connected to the object terminal GATE of the circuit shown in FIG. 15B.

Figure 16D:
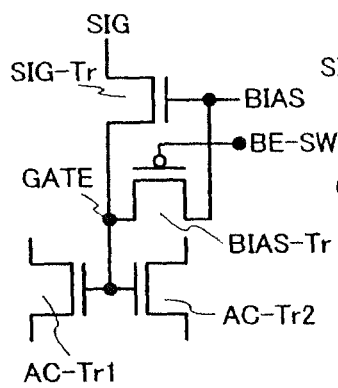

Further, FIG. 16D illustrates a circuit in which transistors AC-Tr1 and AC-Tr2 to which a reverse bias is applied are included in the circuit shown in FIG. 15B. As shown in FIG. 16D, the gate electrodes of the transistors AC-Tr1 and AC-Tr2 may be connected to the object terminal GATE in the circuit shown in FIG. 15B. Here, for example, the transistors AC-Tr, AC-Tr1, and AC-Tr2 may constitute a part of a circuit having a certain function as the whole as with the transistors 53 and 57 in FIGS. 13A to 13C or the transistors 63 and 67a in FIG. 8A to 8C, the circuit of the present invention in which a reverse bias is applied is not dependent on where one of each source electrode and each drain electrode of the transistors AC-Tr, AC-Tr1, and AC-Tr2.

Further, the transistors AC-Tr, AC-Tr1, and AC-Tr2 may be N-channel transistors. Thus, in a period during which an H level is inputted to the bias terminal BIAS and the H level is inputted to the selection terminal BE-SW, a signal inputted to a signal terminal SIG is inputted to the transistor AC-Tr, AC-Tr1, and AC-Tr2, and in a period during which the L level is inputted to the bias terminal BIAS and the L level is inputted to the selection terminal BE-SW, the electric potential dependent on the electric potential of the L level of the bias terminal BIAS is applied to the gate electrodes of the transistor AC-Tr, AC-Tr1, and AC-Tr2; thus, a reverse bias can be applied. Further, in a period during which the H level is inputted to the bias terminal BIAS and the L level is inputted to the selection terminal BE-SW, an electric potential dependent on the electric potential of the H level of the bias terminal. BIAS can be applied to the gate electrodes of the transistors AC-Tr, AC-Tr1, and AC-Tr2.

Figure 16E:
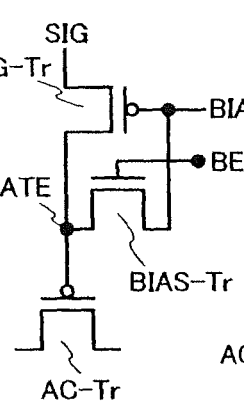

Further, FIG. 16E illustrates a circuit including a transistor AC-Tr to which a reverse bias is applied is added to the circuit shown in FIG. 15C. As shown in FIG. 16E, the gate electrode of the transistor AC-Tr may be connected to the object terminal GATE of the circuit shown in FIG. 15C.

Figure 16F:
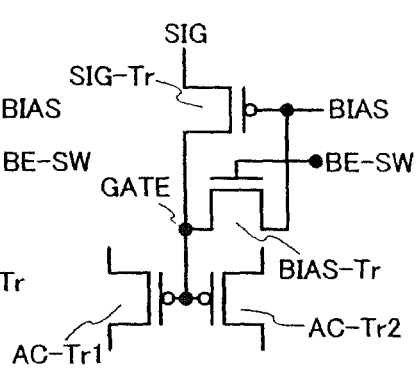

Further, FIG. 16F illustrates a circuit in which transistors AC-Tr1 and AC-Tr2 to which a reverse bias is applied are included in the circuit shown in FIG. 15C. As shown in FIG.

16F, the gate electrodes of the transistors AC-Tr1 and AC-Tr2 may be connected to the object terminal GATE in the circuit shown in FIG. 15C.

Here, the transistors AC-Tr, AC-Tr1, and AC-Tr2 may constitute a part of a circuit having a certain function as the whole as with the transistors 53 and 57 in FIGS. 13A to 13C and the transistors 63 and 67a in FIG. 14A to 14C, the circuit of the present invention in which a reverse bias is applied is not dependent on where one of each source electrode and each drain electrode of the transistors AC-Tr, AC-Tr1, and AC-Tr2.

Further, the transistors AC-Tr, AC-Tr1, and AC-Tr2 may be P-channel transistors. Thus, in a period during which an L level is inputted to the bias terminal BIAS and the L level is inputted to the selection terminal BE-SW, a signal inputted to a signal terminal SIG is inputted to the transistor AC-Tr, AC-Tr1, and AC-Tr2, in a period during which the H level is inputted to the bias terminal BIAS and the H level is inputted to the selection terminal BE-SW, an electric potential dependent on the electric potential of the H level of the bias terminal BIAS can be applied to the gate electrodes of the transistors AC-Tr, AC-Tr1, and AC-Tr2; thus, a reverse bias can be applied. Further, in a period during which the L level is inputted to the bias terminal BIAS and the H level is inputted to the selection terminal BE-SW, the electric potential dependent on the electric potential of the L level of the bias terminal BIAS is applied to the gate electrodes of the transistor AC-Tr, AC-Tr1, and AC-Tr2.

Figure 16G:
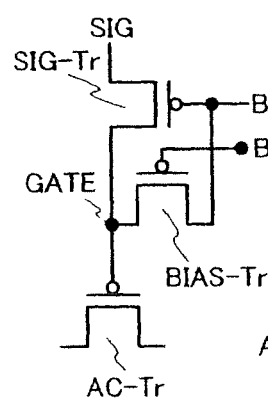

Further, FIG. 16G illustrates a circuit including a transistor AC-Tr to which a reverse bias is applied is added to the circuit shown in FIG. 15D. As shown in FIG. 16G, the gate electrode of the transistor AC-Tr may be connected to the object terminal GATE of the circuit shown in FIG. 15D.

Figure 16H:
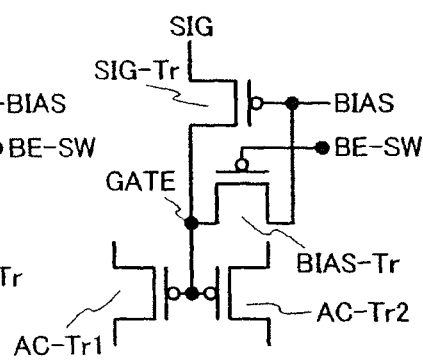

Further, FIG. 16H illustrates a circuit in which transistors AC-Tr1 and AC-Tr2 to which a reverse bias is applied are included in the circuit shown in FIG. 15D. As shown in FIG. 16H, the gate electrodes of the transistors AC-Tr1 and AC-Tr2 may be connected to the object terminal GATE in the circuit shown in FIG. 15D. Here, the transistors AC-Tr, AC-Tr1, and AC-Tr2 may constitute a part of a circuit having a certain function as the whole as with the transistors 53 and 57 in FIGS. 13A to 13C ors the transistors 63 and 67a in FIG. 14A to 14C, the circuit of the present invention in which a reverse bias is applied is not dependent on where one of each source electrode and each drain electrode of the transistors AC-Tr, AC-Tr1, and AC-Tr2.

Further, the transistors AC-Tr, AC-Tr1, and AC-Tr2 may be P-channel transistors. Thus, in a period during which an L level is inputted to the bias terminal BIAS and the H level is inputted to the selection terminal BE-SW, a signal inputted to a signal terminal SIG is inputted to the transistor AC-Tr, AC-Tr1, and AC-Tr2, in a period during which the H level is inputted to the bias terminal BIAS and the L level is inputted to the selection terminal BE-SW, an electric potential dependent on the electric potential of the H level of the bias terminal BIAS can be applied to the gate electrodes of the transistors AC-Tr, AC-Tr1, and AC-Tr2; thus, a reverse bias can be applied. Further, in a period during which the L level is inputted to the bias terminal BIAS and the L level is inputted to the selection terminal BE-SW, the electric potential dependent on the electric potential of the L level of the bias terminal BIAS is applied to the gate electrodes of the transistor AC-Tr, AC-Tr1, and AC-Tr2.

Note that this embodiment mode can be freely combined with any one of the other embodiment modes.

Embodiment Mode 4

Figure 17:
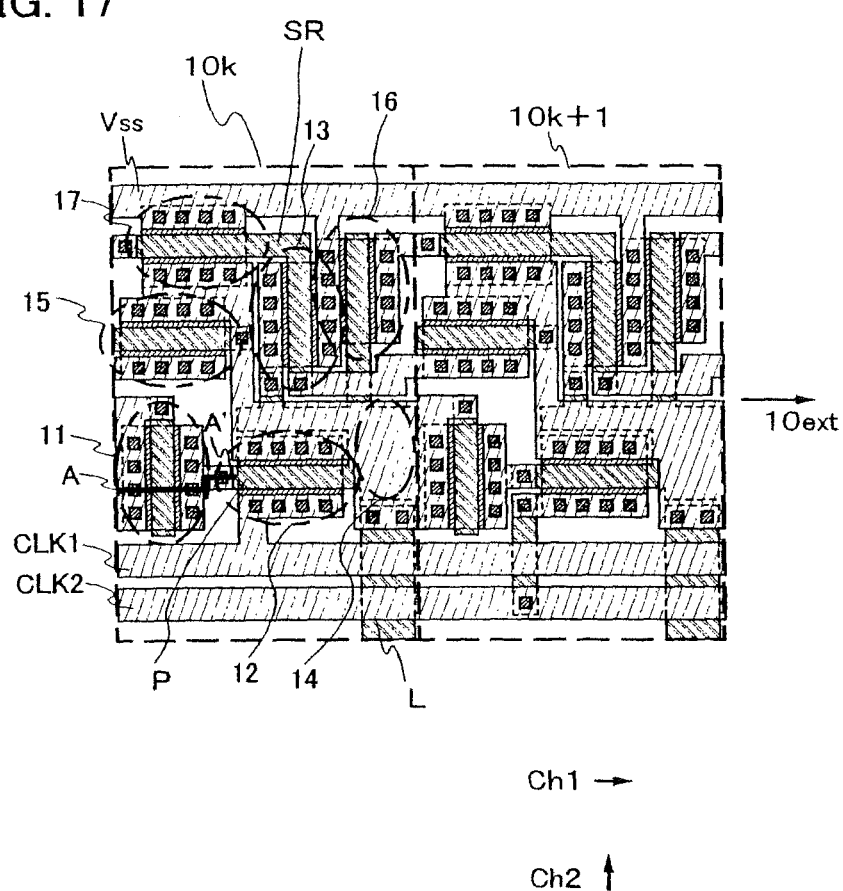
FIG. 17 is a top view of a shift register circuit of the present invention.

In this embodiment mode, description will be given of a top view and a cross-sectional view of the case of forming a shift register circuit of the invention by fabricating an element on a substrate with reference to the drawing. FIG. 17 illustrates an example of forming circuits 10 as a shift register circuit of the present invention using a top gate transistor as a transistor. In FIG. 17, only the circuit 10 at a kth stage (shown as 10k) and the circuit 10 of a (k+1)th stage (shown as 10k+1) are illustrated for description; however, the present invention is not limited thereto, and the circuits 10 may have any number of stages. Further, transistors 11, 12, 13, 15, 16, and 17, a capacitor element 14, and a terminal P in FIG. 17 may correspond to the transistors 11, 12, 13, 15, 16, and 17, the capacitor element 14, and the terminal P in FIG. 1B respectively. The electrode SR and the output terminal L which are arranged outside the circuits 10 in FIGS. 1A to 1C are arranged inside the circuits 10 in FIG. 17 in order to reduce the layout area. Note that in the top view referred in this embodiment mode, a region indicated by a broken line is a region where there is another layer in a layer above the region.

In FIG. 17, a power supply line Vss, a first clock signal line CLK1, a second clock signal line CLK2 are each formed from a wiring layer, and they may be provided in substantially parallel to the direction where the circuits 10 extend (shown as 10ext). Thus, in the case of providing a plurality of circuits 10, the length of leading the wiring is increased and wiring resistance is increased accordingly, and thus, malfunctions and increase in power consumption due to voltage drop of the power supply line can be prevented. Further, malfunctions caused by distortion of a signal waveform, reduction in the range of voltage where the circuit operates normally can be suppressed.

The power supply line Vss, the first clock signal line CLK1, and the second clock signal line CLK2 may be provided outside elements forming the circuit 10. Further, the power supply line Vss may be provided opposite to the first clock signal line CLK1 and the second clock signal line CLK2. Thus, the power supply line Vss can be prevented from crossing the first clock signal line CLK1 and the second clock signal line CLK2; thus, the power supply line can be prevented from being affected by noise from the, and malfunctions can be reduced.

Here, in this embodiment mode, a region where an active layer region overlaps with a gate electrode region in a transistor is also referred to as a channel region. Further, one of the regions in the active layer of the transistor, which are separated by the channel region transistor is referred to as "one of a source electrode and a drain electrode" and the other of the regions separated by the channel region is referred to as "the other of the source electrode and the drain electrode". Further, the direction of a tangential line of the boundaries between the one or the other of the source electrode and the drain electrode of the transistor and the channel region of the transistor is referred to as "a channel width direction". Further, the direction perpendicular to the channel width direction is referred to as a "channel length direction". For example, in a transistor of this embodiment mode, when the boundaries between one or the other of a source electrode and a drain electrode of the transistor and a channel region of the transistor are curved, the channel width direction and the channel length direction may vary depending on points in the boundaries.

In FIG. 17, the channel length direction of the transistor 11 (shown as Ch1) and the channel length direction of the transistor 12 (shown as Ch2) may be substantially perpendicular. With this structure, the area of a substrate occupied by the transistors 11 and 12 can be minimized, and circuit scale can be reduced.

Further, the channel length directions of the transistors 13 and 16 (shown as Ch1) may be substantially parallel to each other; they may share either one source electrode or one drain electrode. Thus, the area of a substrate which is occupied by the transistors 13 and 16 can be minimized and circuit scale can be reduced. Further, channel length directions of the transistors 15 and 17 (shown as Ch2) may be substantially parallel to each other, and they may share either one source electrode or one drain electrode. Thus, the area of a substrate occupied by the transistors 15 and 17 can be minimized, and circuit scale can be reduced.

Further, one of the electrodes of the capacitor element 14, the terminal P, may be formed from a gate electrode, and the other of the electrodes, an electrode connected to the output terminal L, may be formed from a wiring layer. Further, in the case where the transistor is an n-channel transistor, the active layer of the transistor and the wiring layer connected to the output terminal L may be connected to each other and the gate electrode constituting the terminal P may be interposed between the active layer and the wiring layer to form the capacitor element 14. When the terminal P is formed from the gate electrode, when the electric potential of the terminal P becomes high, carriers are generated in the active layer connected to the output terminal L. Therefore, the capacitance value of the capacitor element 14 formed from the active layer and the gate electrode can be increased.

Figure 18:
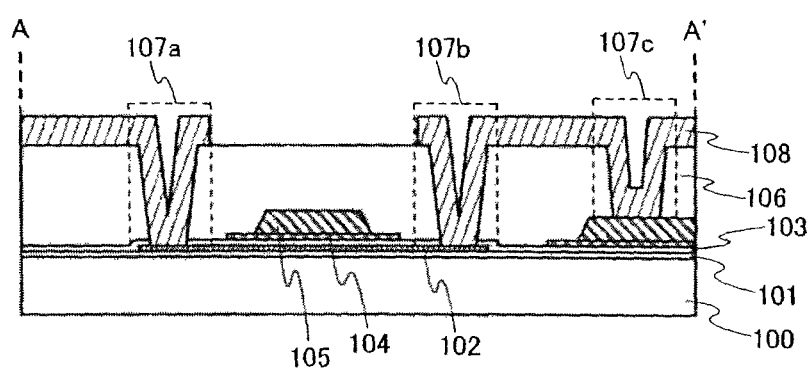
FIG. 18 is a cross-sectional view of a shift register circuit of the present invention.

Next, a cross-sectional view taken along line A-A' in FIG. 17 in the case of using a thin film transistor as a transistor will be described with reference to FIG. 18. A structure shown in FIG. 18 is provided with a substrate 100, a base film 101, an active layer 102, an insulating film 103, gate electrodes 104 and 105, an interlayer film 106, and a wiring layer 108. Further, the structure shown in FIG. 18 is provided with contacts 107a and 107b which connect the wiring layer 108 and the active layer 102, and a contact 107c which connects the wiring layer 108 and the gate electrode 104. The structure shown in FIG. 18 will be described step by step.

First, the substrate 100 may be a glass substrate formed from barium borosilicate glass, aluminoborosilicate glass, or the like; a quartz substrate, a silicon substrate, a metal substrate, a stainless-steel substrate, or a plastic substrate. Further, the substrate 100 may be polished by CMP or the like to planarize a surface of the substrate 100.

Next, a base film 101 may be formed over the substrate 100. The base film 101 may be formed from a single layer of nitride aluminum (AlN), silicon oxide ($SiO_2$), silicon oxynitride (SiOxNy), or the like or a laminate thereof by a known method such as CVD, plasma CVD, sputtering, or spin coating. Note the base film 101 has an effect of blocking impurities such as contaminants from the substrate 100. When the base film 101 is not formed, the manufacturing process is simplified, and cost can be reduced.

Next, the active layer 102 may be formed over the substrate 100 or the base film 101. Here, the active layer 102 may be formed of polysilicon (p-Si). The active layer 102 may be selectively formed to a desired shape by photolithography, a droplet discharge method, a printing method or the like.

Next, an insulating film 103 may be formed over the substrate 100, the base film 101, or the active layer 102. Here, the insulating film 103 may be formed of silicon oxide ($SiO_2$) or silicon oxynitride (SiOxNy).

Next, the gate electrodes 104 and 105 may be formed over the substrate 100, the base film 101, the active layer 102, or the insulating film 103. Here, the gate electrodes 104 and 105 may be selectively formed from different kinds of metals to a desired shape by photolithography, a droplet discharge method, a printing method or the like. Thus, in the case where the gate electrodes 104 and 105 are processed by etching using photolithography or the like, the etching is performed so that etch selectivity can be obtained between the gate electrodes 104 and 105; thus, the gate electrode 104 and the gate electrode 105 can be formed to have different areas without modifying a photomask. Thus, in the case where the conductivity of the active layer 102 is controlled by adding charged particles into the active layer 102, an LDD region can be formed in the active layer 102 without modifying a photomask. Accordingly, a transistor in which high electric field is hardly applied and deterioration due to hot carriers is small can be manufactured.

Next, the interlayer film 106 may be formed over the substrate 100, the base film 101, the active layer 102, the insulating film 103, or the gate electrodes 104 and 105. Here, the interlayer film 106 can be formed from an insulating material such as silicon oxide, silicone nitride, silicon oxynitride, aluminum oxide, aluminum nitride, aluminum oxynitride or other inorganic insulating materials; acrylic acid or methacrylic acid, or a derivative thereof; a heat resistant polymer such as polyimide, aromatic polyamide, polybenzimidazole; or a siloxane resin. Note that the siloxane resin refers to resin having a bond of Si—O—Si. The skeletal structure of siloxane is formed from a bond of silicon (Si) and oxygen (O). An organic group (for example, an alkyl group or aromatic hydrocarbon) containing at least hydrogen is used as the substituent. A fluoro group may also be used as the substituent. Alternatively, an organic group at least containing hydrogen and a fluoro group may be used as the substituent. When the interlayer film is formed from a photosensitive or a non photosensitive material such as acrylic or polyimide, the interlayer film has curved sides in which the curvature radius is changed continuously, and a thin film thereon can be formed without disconnection, which is preferable. Further, the interlayer film 106 may be formed to a desired shape by photolithography, a droplet discharge method, a printing method, or the like. Here, the interlayer film 106 may be processed by etching so that etching ends before the gate electrodes 104 and 105 are etched as with the contact 107c while the insulating film 103 is also processed as with the contacts 107a and 107b. Then, the wiring layer 108 can be formed so that the active layer 102 is connected to the gate electrodes 104 and 105.

The wiring layer 108 may be formed over the substrate 100, the base film 101, active layer 102, the insulating film 103, the gate electrodes 104 and 105, or the interlayer film 106. Here, a composition containing particles of metal such as Ag (silver), Au (gold), Cu (copper), W (tungsten), or Al (aluminum) as main components can be used as a material for forming the wiring layer 108. Further, a light-transmitting material such as indium tin oxide (ITO), ITSO containing indium tin oxide and silicon oxide, organoindium, organotin, zinc oxide, titanium nitride may be combined. Further, the wiring layer 108 may be formed to a desired shape by photolithography, a droplet discharge method, a printing method, or the like.

Figure 19:
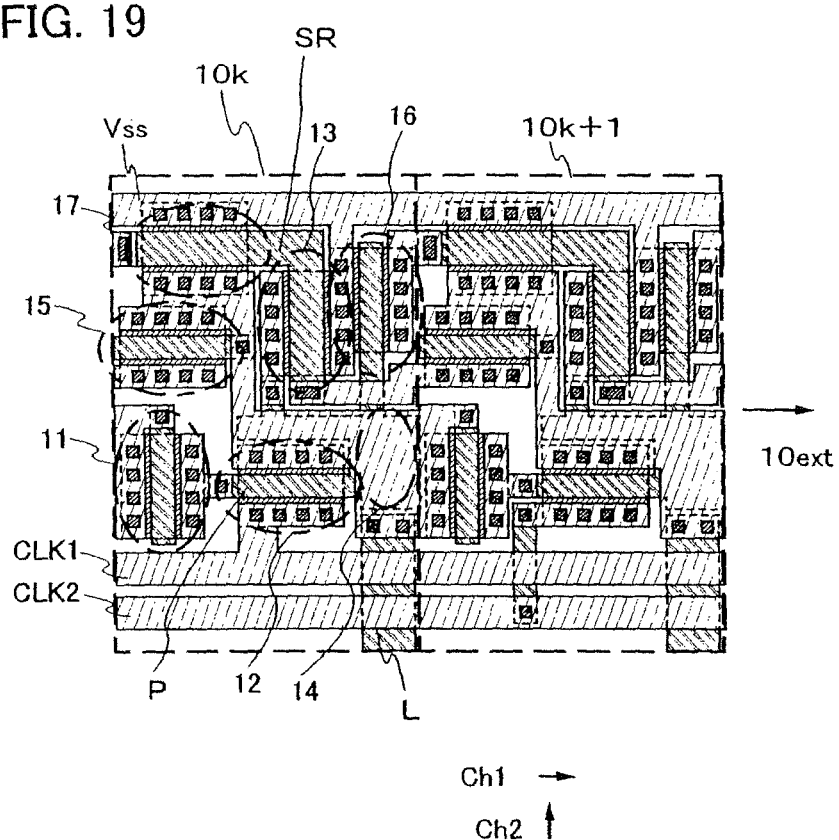
FIG. 19 is a top view of a shift register circuit of the present invention.

Next, description will be given of a top view of the circuits 10 of the case where the shapes of the transistors 13 and 17 are devised to maintaining the electric potential of the electrode SR at H level thereby fixing the electric potentials of the terminal P and the output terminal L with reference to FIG. 19. The circuit 10 shown in the top view of FIG. 19 is provided with transistors 11, 12, 13, 15, 16, and 17, and a capacitor element 14 as in FIG. 17, and connections are also similar; however, the areas of channel regions of the transistors 13 and 17 are different. Thus, when the average of the of areas of the gate electrodes in the transistors 13 and 17 is made larger than the area of the gate electrode in the transistor 12 of the circuit 10, the value of parasitic capacitance associated with the electrode SR can be made larger; thus, the electric potential of the electrode SR can be maintained at H level even after a reset operation, which is preferable. Further, as shown in FIG. 19, the electrode SR may be formed to be curved in the circuit 10 so as not to make the shape linear. Thus, the length of leading the electrode SR can be made longer than the pitch between the circuit 10 of the kth stage and the circuit 10 of the (k+1)th stage. Accordingly, the value of parasitic capacitance associated with the electrode SR can be increased, so that the electric potential of the electrode SR can be maintained at H level even after a reset operation, which is preferable.

Next, description will be given of a top view of the case where cross capacitance of the clock signal line and the output terminal L is eliminated so that the output terminal L is not affected by change in the electric potential of the clock signal line as possible with reference to FIG. 20. The circuit 10 shown in the top view of FIG. 20 is provided with transistors 11, 12, 13, 15, 16, and 17, a capacitor element 14, a terminal P, an electrode SR, and an output terminal L as in FIG. 17 and FIG. 19, and the connections are also similar; however, the arrangement of the first clock signal line CLK1, the second clock signal line CLK2, and the transistors 11 and 12 is different form FIG. 17 and FIG. 19.

Figure 20:
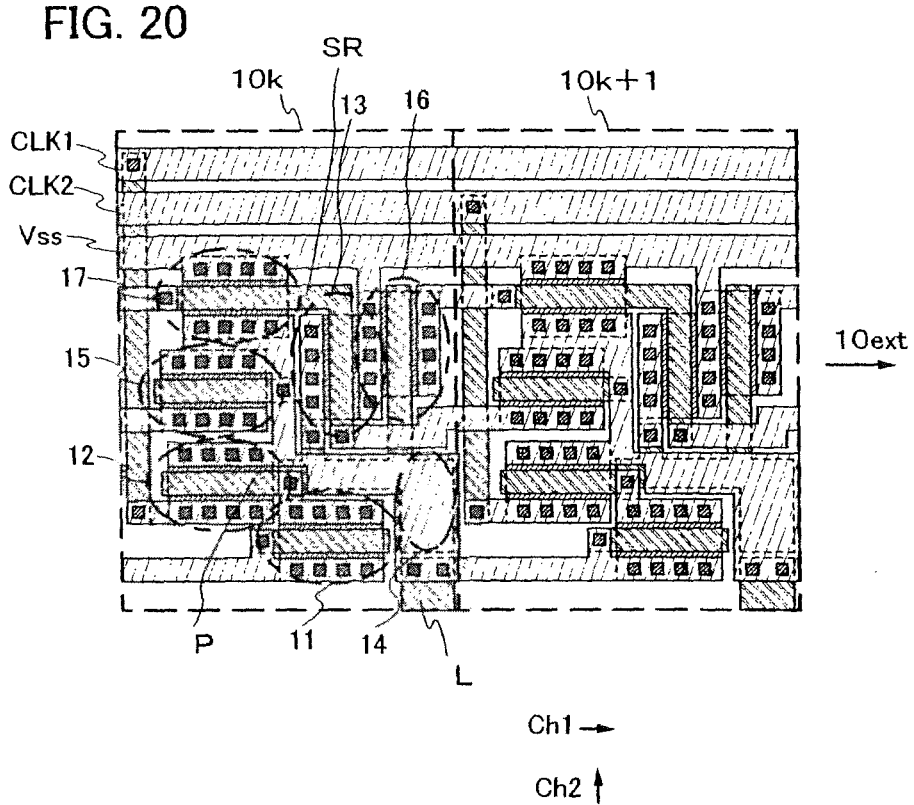
FIG. 20 is a top view of a shift register circuit of the present invention.

In FIG. 20, the power supply line Vss, the first clock signal line CLK1, and the second clock signal line CLK2 are formed from a wiring layer, and may be provided in substantially parallel to the direction where the circuits 10 extend (shown as 10ext). Thus, in the case of providing a plurality of circuits 10, the length of leading the wiring is increased and wiring resistance is increased accordingly, and thus, malfunctions and increase in power consumption due to voltage drop of the power supply line can be prevented. Further, malfunctions caused by distortion of a signal waveform, reduction in the range of voltage where the circuit operates normally can be suppressed.

The power supply line Vss, the first clock signal line CLK1, and the second clock signal line CLK2 may be provided outside elements forming the circuit 10. Further, the power supply line Vss, and the first clock signal line CLK1 and the second clock signal line CLK2 may be provided on the same side which is opposite to the side where the output terminal L is provided, with respect to the first transistor, the third transistor, the second transistor, and the fourth transistor. Thus, the output terminal L can be prevented from crossing the first clock signal line CLK1 and the second clock signal line CLK2; thus, the power supply line can be prevented from being affected by noise from the clock signal line, and malfunctions can be reduced.

Further, the channel length direction of the transistor 11 (shown as Ch1) and the channel length direction of the transistor 12 (shown as Ch2) may be substantially parallel. With this structure, the area of a substrate occupied by the transistors 11 and 12 can be minimized, and circuit scale can be reduced and generation of a region where the output terminal L crosses the first clock signal line CLK1 and the second clock signal line CLK2 can be prevented as well.

Figure 21:
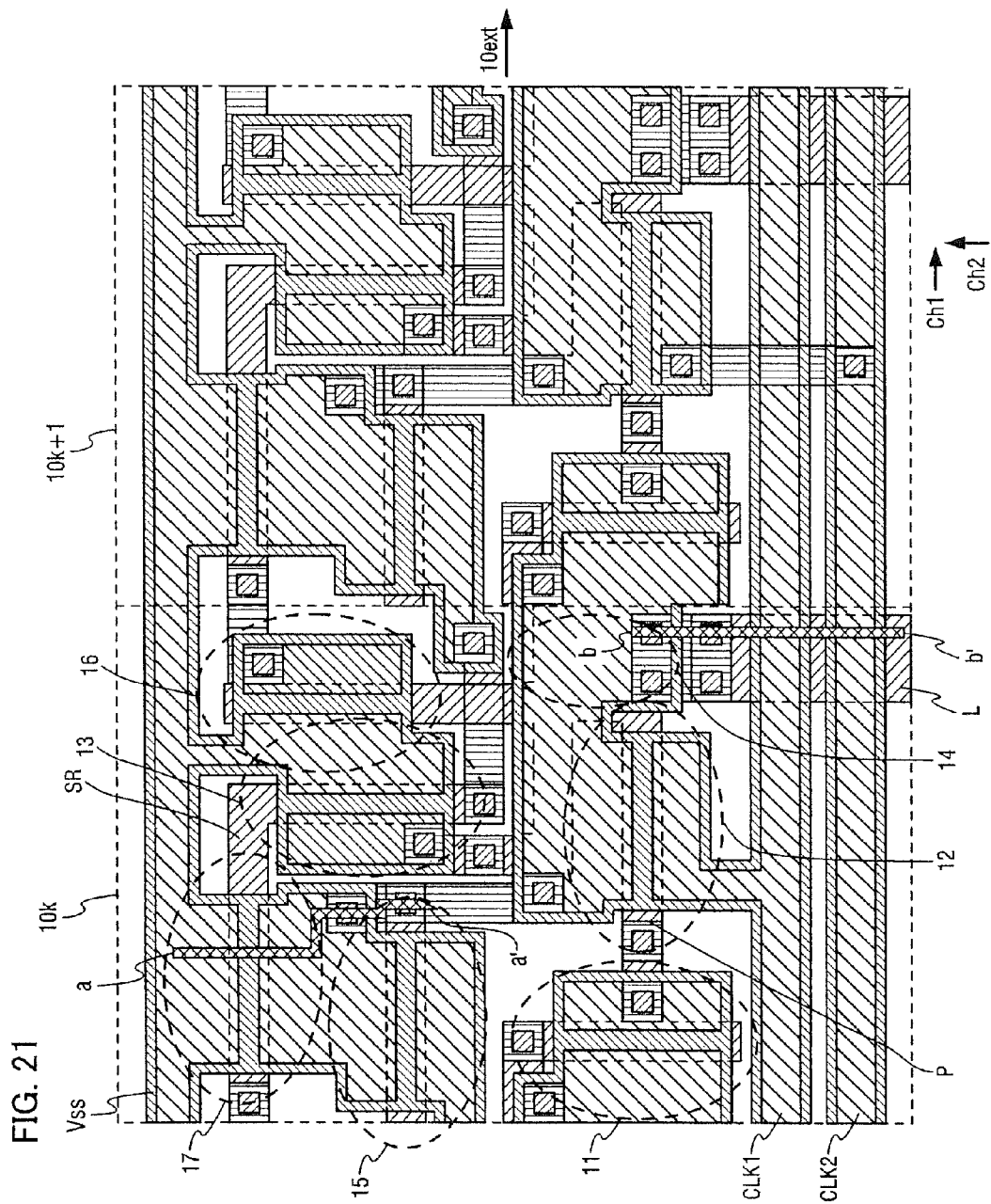
FIG. 21 is a top view of a shift register circuit of the present invention.

Next, description will be given of a top view of the case of a shift register circuit of the present invention of the case where a bottom gate transistor is used as a transistor and an active layer is processed into a desired shape using a wiring layer as a mask with reference to FIG. 21. In FIG. 21, only the circuit 10 at a kth stage (shown as 10k) and the circuit 10 of a (k+1)th stage (shown as 10k+1) are illustrated for description; however, the present invention is not limited thereto, and the circuits 10 may have any number of stages. Further, transistors 11, 12, 13, 15, 16, and 17, a capacitor element 14, and a terminal P in FIG. 21 may correspond to the transistors 11, 12, 13, 15, 16, and 17, the capacitor element 14, and the terminal P in FIG. 1B respectively. The electrode SR and the output terminal L which are arranged outside the circuits 10 in FIGS. 1A to 1C are arranged inside the circuits 10 in FIG. 21 in order to reduce the layout area. Note that in the top view referred in this embodiment mode, a region indicated by a broken line is a region where there is another layer in a layer above the region.

Figure 22A:
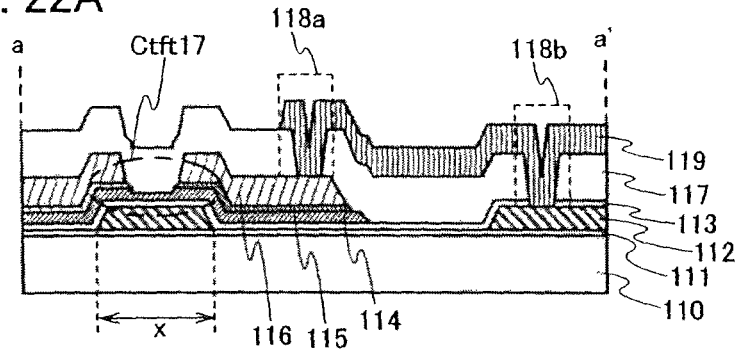
FIGS. 22A and 22B are cross-sectional views of a shift register circuit applied to the present invention.
Figure 22B:
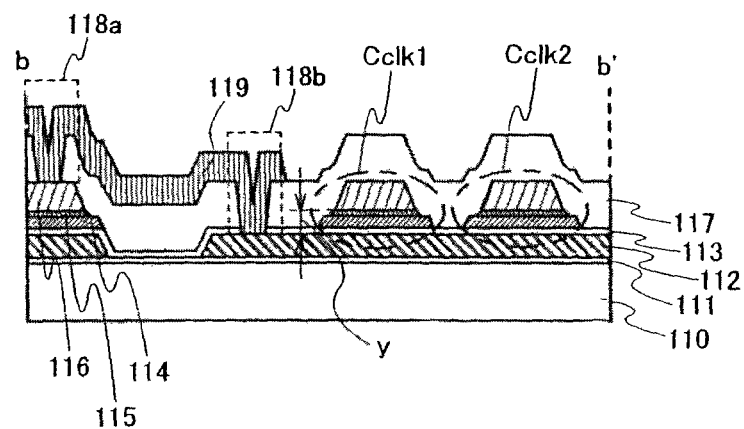

Next, cross-sectional views taken along lines a-a' and b-b' in FIG. 21 of the case of using a thin film transistor as a transistor will be described with reference to FIGS. 22A and 22B. A structure shown in FIGS. 22A and 22B is provided with a substrate 110, a base film 111, a first wiring layer 112, an insulating film 113, active layers 114 and 115, a second wiring layer 116, an interlayer film 117, and a third wiring layer 119. Further, the structure shown in FIGS. 22A and 22B is provided with a contact 118a which connect the third wiring layer 119 and the second wiring layer 116, and a contact 118b which connects the third wiring layer 119 and the first wiring layer 112. The structure shown in FIGS. 22A and 22B will be described step by step.

First, the substrate 110 may be a glass substrate formed from barium borosilicate glass, aluminoborosilicate glass, or the like; a quartz substrate, a silicon substrate, a metal substrate, a stainless-steel substrate, or a plastic substrate. Further, the substrate 110 may be polished by CMP or the like to planarize a surface of the substrate 110.

Next, a base film 111 may be formed over the substrate 110. The base film 111 may be formed from a single layer of nitride aluminum (AlN), silicon oxide ($SiO_2$), silicon oxynitride (SiOxNy), or the like or a laminate thereof by a known method such as CVD, plasma CVD, sputtering, or spin coating. Note the base film 111 has an effect of blocking impurities such as contaminants from the substrate 110. When the base film 101 is not formed, the manufacturing process is simplified, and cost can be reduced.

Next, the first wiring layer 112 may be formed over the substrate 110 or the base film 111. Here, the first wiring layer 112 may be processed into a desired shape by photolithography, a droplet discharge method, a printing method or the like.

Next, an insulating film 113 may be formed over the substrate 110, the base film 101, or the first wiring layer 112. Here, the insulating film 113 may be formed of silicon oxide ($SiO_2$) or silicon oxynitride (SiOxNy).

Next, the active layers 114 and 115 may be formed over the substrate 110, the base film 111, the first wiring layer 112, or the insulating film 113. Here, the active layers 114 and 115 may be formed of amorphous silicon (a-Si), and the active layers 114 and 115 may be continuously formed in the same film formation apparatus. The active layer 115 may have higher conductivity compared to the active layer 114. Note that a region in the vicinity of the interface between the channel region, specifically the active layer 114, and the insulating film 113 may be denser than the other region of the active layer 114. Thus, deterioration of the transistor can be suppressed, and film formation rate of the active layer 114 can be speeded; thus, throughput improve is improved.

The second wiring layer 116 may be formed over the substrate 110, the base film 111, the first wiring layer 112, the insulating film 113, or the active layers 114 and 115. Here, a composition containing particles of metal such as Ag (silver), Au (gold), Cu (copper), W (tungsten), or Al (aluminum) as main components can be used as a material for forming the second wiring layer 116. Further, a light-transmitting material such as indium tin oxide (ITO), ITSO containing indium tin oxide and silicon oxide, organoindium, organotin, zinc oxide, titanium nitride may be combined. Further, the second wiring layer 116 may be processed into a desired shape by photolithography, a droplet discharge method, a printing method, or the like.

Next, the interlayer film 117 may be formed over the substrate 110, the base film 111, the first wiring layer 112, the insulating film 113, or the active layers 114 and 115, or the second wiring layer 116. Here, the interlayer film 117 can be formed from an insulating material such as silicon oxide, silicone nitride, silicon oxynitride, aluminum oxide, aluminum nitride, aluminum oxynitride or other inorganic insulating materials; acrylic acid or methacrylic acid, or a derivative thereof; a heat resistant polymer such as polyimide, aromatic polyamide, polybenzimidazole; or a siloxane resin. Further, the interlayer film 117 may be processed into a desired shape by photolithography, a droplet discharge method, a printing method, or the like. When the interlayer film is formed from a photosensitive or a non photosensitive material such as acrylic or polyimide, the interlayer film has curved sides in which the curvature radius is changed continuously, and a thin film thereon can be formed without disconnection, which is preferable. Further, the interlayer film 117 may be processed into a desired shape by photolithography, a droplet discharge method, a printing method, or the like. Here, the interlayer film 117 may be processed so that etching ends before the wiring layer 116 is etched as with the contact 118a while the insulating film 113 is also processed as with the contact 118b. Then, the second wiring layer 116 can be formed so that the second wiring layer 116 is connected to the first wiring layer 112.

The third wiring layer 119 may be formed over the substrate 110, the base film 111, the first wiring layer 112, the insulating film 113, the active layers 114 and 115, the second wiring layer 116, or the interlayer film 117. Here, a composition containing particles of metal such as Ag (silver), Au (gold), Cu (copper), W (tungsten), or Al (aluminum) as main components can be used as a material for forming the third wiring layer 119. Further, a light-transmitting material such as indium tin oxide (ITO), ITSO containing indium tin oxide and silicon oxide, organoindium, organotin, zinc oxide, titanium nitride may be combined. Further, the third wiring layer 119 may be processed into a desired shape by photolithography, a droplet discharge method, a printing method, or the like.

Note that, in FIG. 22A, Reference numeral Ctft17 denotes a parasitic capacitance element of the transistor 17, Cclk1 denotes a parasitic capacitance element of the output terminal L and the first clock signal line CLK1, and Cclk2 denotes a parasitic capacitance element of the output terminal L and the second clock signal line CLK2 respectively. Reference numeral x in FIG. 22A denotes a width of the first Wiring layer over which the active layer exist in the parasitic capacitance element Ctft17. Reference numeral y denotes a distance between the upper end of the first wiring layer and the lower end of the second wiring layer in the parasitic capacitance elements Cclk1 and Cclk2.

Here, in FIG. 21, since the active layers are formed using the second wiring layer as a mask, they are formed into a shape in accordance with the second wiring layer. Thereupon, the active layers may be formed to have a shape such as to surround the second wiring layer. Thus, coverage of the third wiring layer laid over the second wiring layer is improved, and disconnection of the third wiring layer can be prevented. That is because, for example, when a shape of the perimeter of the active layer and a shape of the perimeter of the second wiring layer is the same or almost the same, or when the second wiring layer surrounds the active layer, the taper angle of the interlayer film on the second wiring layer is sharper compared with the case where the active layer is formed to have a shape such as to surround the second wiring layer.

Further, in FIG. 21, a power supply line Vss, a first clock signal line CLK1, a second clock signal line CLK2 are each formed from a wiring layer and the active layer, and they may be provided in substantially parallel to the direction where the circuits 10 extend (shown as 10ext). Thus, in the case of providing a plurality of circuits 10, the length of leading the wiring is increased and wiring resistance is increased accordingly, and thus, malfunctions and increase in power consumption due to voltage drop of the power supply line can be prevented. Further, malfunctions caused by distortion of a signal waveform, reduction in the range of voltage where the circuit operates normally can be suppressed.

The power supply line Vss, the first clock signal line CLK1, and the second clock signal line CLK2 may be provided outside elements forming the circuit 10. Further, the power supply line Vss may be provided opposite to the first clock signal line CLK1 and the second clock signal line CLK2. Thus, the power supply line Vss can be prevented from crossing the first clock signal line CLK1 and the second clock signal line CLK2; thus, the power supply line can be prevented from being affected by noise from the clock signal line, and malfunctions can be reduced.

In FIG. 21, the channel length direction of the transistor 11 (shown as Ch1) and the channel length direction of the transistor 12 (shown as Ch2) may be substantially perpendicular. With this structure, the area of a substrate occupied by the transistors 11 and 12 can be minimized, and circuit scale can be reduced. Further, the channel length directions of the transistors 13 and 16 (shown as Ch1) may be substantially parallel to each other; they may share either one source electrode or one drain electrode. Thus, the area of a substrate which is occupied by the transistors 13 and 16 can be minimized and circuit scale can be reduced.

Further, channel length directions of the transistors 15 and 17 (shown as Ch2) may be substantially parallel to each other; and they may share either one source electrode or one drain electrode. Thus, the area of a substrate occupied by the transistors 15 and 17 can be minimized, and circuit scale can be reduced.

Figure 23:
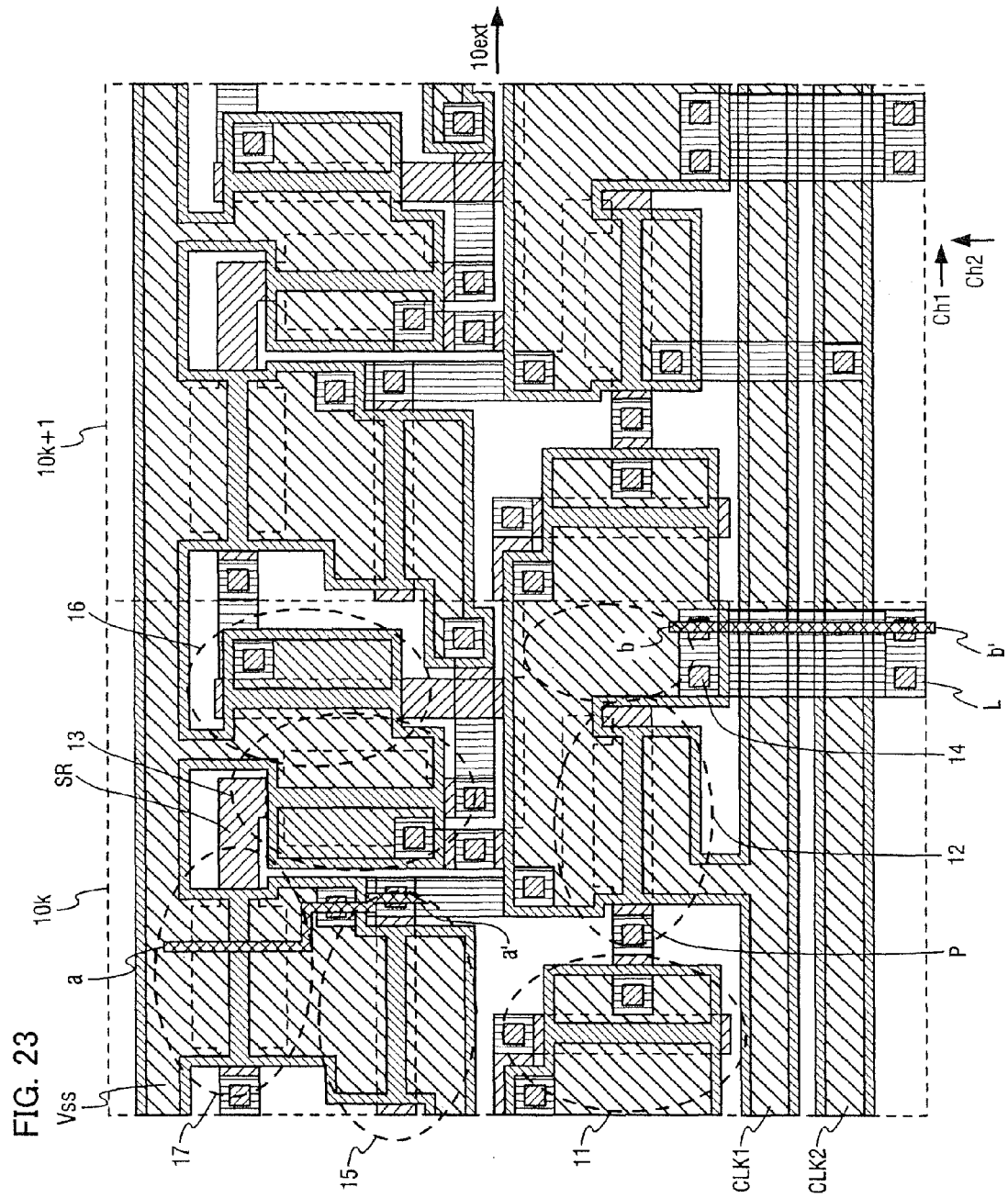
FIG. 23 is a top view of a shift register circuit of the present invention.

Next, description will be given of a top view of the circuits 10 of the case where the shapes of the transistors 13 and 17 are devised to maintaining the electric potential of the electrode SR at H level thereby fixing the electric potentials of the terminal P and the output terminal L with reference to FIG. 23. The circuit 10 shown in the top view of FIG. 23 is provided with transistors 11, 12, 13, 15, 16, and 17, a capacitor element 14, the terminal P, the electrode SR, and the output terminal L as in FIG. 21, and connections are also similar; however, the shapes of the first wiring layer of the transistors 13 and 17 are different. Thus, when the average of the of areas of the first wiring layer in the transistors 13 and 17 is made larger than the area of the first wiring layer in the transistor 12 of the circuit 10, the value of parasitic capacitance associated with the electrode SR can be made larger; thus, the electric potential of the electrode SR can be maintained at H level even after a reset operation, which is preferable.

Further, as shown in FIG. 23, the electrode SR may be formed to be curved in the circuit 10 so as not to make the shape linear. Thus, the length of leading the electrode SR can be made longer than the pitch between the circuit 10 of the kth stage (shown as 10k) and the circuit 10 of the (k+1)th stage (shown as 10k+1). Accordingly, the value of parasitic capacitance associated with the electrode SR can be increased, so that the electric potential of the electrode SR can be maintained at H level even after a reset operation, which is preferable. Further, the circuits 10 shown in the top view of FIG. 23 have a different structure of the region where the output terminal L crosses the clock signal line from one in FIG. 21. In the circuits 10 shown in FIG. 23, in the region where the output terminal L crosses the clock signal line, the output terminal L is formed with the third wiring layer, and the clock signal line can be formed with the second wiring layer and the active layer.

Figure 24A:
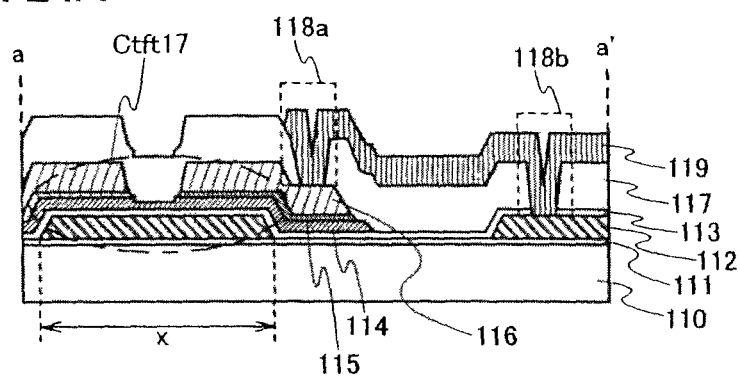
FIGS. 24A and 24B are cross-sectional views of a shift register circuit applied to the present invention.
Figure 24B:
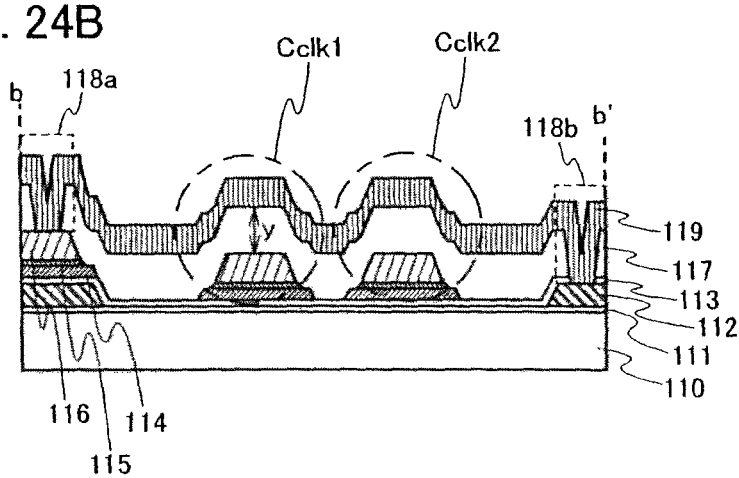

Next, cross-sectional views taken along lines a-a' and b-b' in FIG. 23 of the case of using a thin film transistor as a transistor will be described with reference to FIGS. 24A and 24B. A structure shown in FIGS. 24A and 24B is provided with a substrate 110, a base film 111, a first wiring layer 112, an insulating film 113, active layers 114 and 115, a second wiring layer 116, an interlayer film 117, and a third wiring layer 119 as the structure shown in FIGS. 22A and 22B. Further, the structure shown in FIGS. 24A and 24B is provided with a contact 118a which connect the third wiring layer 119 and the second wiring layer 116, and a contact 118b which connects the third wiring layer 119 and the first wiring layer 112.

Note that, in FIG. 24A, Reference numeral Ctft17 denotes a parasitic capacitance element of the transistor 17, Cclk1 denotes a parasitic capacitance element of the output terminal L and the first clock signal line CLK1, and Cclk2 denotes a parasitic capacitance element of the output terminal L and the second clock signal line CLK2 respectively. Reference numeral x in FIG. 24A denotes a width of the first wiring layer over which the active layer exist in the parasitic capacitance element Ctft17. Reference numeral y denotes a distance between the upper end of the first wiring layer and the lower end of the second wiring layer in the parasitic capacitance elements Cclk1 and Cclk2.

Here, the capacitance value of the parasitic capacitance element Ctft17 becomes larger as x is larger. Meanwhile, the capacitance values of the parasitic capacitance elements Cclk1 and Cclk2 become smaller as y is larger. When the capacitance value of the parasitic capacitance element Ctft17 is increased by making x larger as shown in FIG. 24A, parasitic capacitance value associated with the electrode SR can be increased; thus, the electric potential of the electrode SR can be maintained at H level sufficiently. Further, when the capacitance values of the parasitic capacitance elements Cclk1 and Cclk2 is reduced by making y larger as in FIG. 24B, change in the electric potential of the output terminal L due to change in the electric potentials of the first clock signal line CLK1 and the second clock signal line CLK2 through the parasitic capacitance elements Cclk1 and Cclk2, can be reduced. Thereupon, the first clock signal line CLK1 and the second clock signal line CLK2 may be formed with the first wiring layer.

Next, description will be given of a top view of the case where cross capacitance of the clock signal line and the output terminal L is eliminated so that the output terminal L is not affected by change in the electric potential of the clock signal line as possible with reference to FIG. 25. The circuit 10 shown in the top view of FIG. 25 is provided with transistors 11, 12, 13, 15, 16, and 17, a capacitor element 14, a terminal P, an electrode SR, and an output terminal L as in FIG. 21 and FIG. 23, and the connections are also similar; however, the arrangement of the first clock signal line CLK1, the second clock signal line CLK2, and the transistors 11 and 12 is different form FIG. 21 and FIG. 23.

In FIG. 25, the power supply line Vss, the first clock signal line CLK1, and the second clock signal line CLK2 are formed from the second wiring layer and the active layer, and may be provided in substantially parallel to the direction where the circuits 10 extend. Thus, in the case of providing a plurality of circuits 10, the length of leading the wiring is increased and wiring resistance is increased accordingly, and thus, malfunctions and increase in power consumption due to voltage drop of the power supply line can be prevented. Further, malfunctions caused by distortion of a signal waveform, reduction in the range of voltage where the circuit operates normally can be suppressed.

The power supply line Vss, the first clock signal line CLK1, and the second clock signal line CLK2 may be provided outside elements forming the circuit 10. Further, the power supply line Vss, and the first clock signal line CLK1 and the second clock signal line CLK2 may be provided on the same which is opposite to the side where the output terminal L is provided, with respect to the first transistor, the third transistor, the second transistor, and the fourth transistor. Thus, the output terminal L can be prevented from crossing the first clock signal line CLK1 and the second clock signal line CLK2; thus, the power supply line can be prevented from being affected by noise from the clock signal line, and malfunctions can be reduced.

Further, the channel length direction of the transistor 11 (shown as Ch1) and the channel length direction of the transistor 12 (shown as Ch2) may be substantially parallel. With this structure, the area of a substrate occupied by the transistors 11 and 12 can be minimized, and circuit scale can be reduced and generation of a region where the output terminal L crosses the first clock signal line CLK1 and the second clock signal line CLK2 can be prevented as well.

Figure 26:
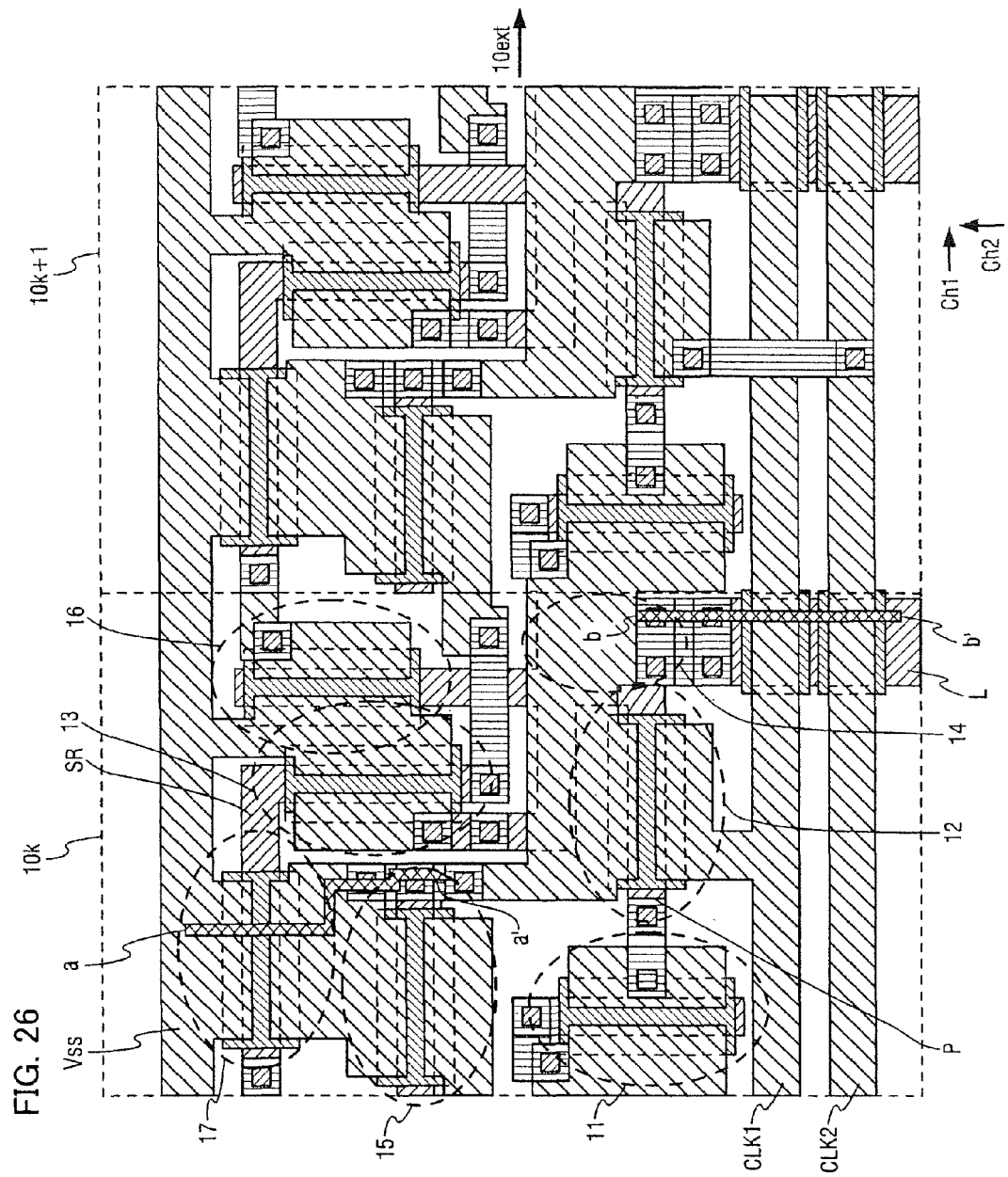
FIG. 26 is a top view of a shift register circuit of the present invention.

Next, description will be given of a top view of the case of a shift register circuit of the present invention of the case where a bottom gate transistor is used as a transistor and an active layer and a wiring layer are separately processed into desired shapes with reference to FIG. 26. In FIG. 26, only the circuit 10 at a kth stage (shown as 10k) and the circuit 10 of a (k+1)th stage (shown as 10k+1) are illustrated for description; however, the present invention is not limited thereto, and the circuits 10 may have any number of stages. Further, transistors 11, 12, 13, 15, 16, and 17, a capacitor element 14, and a terminal P in FIG. 26 may correspond to the transistors 11, 12, 13, 15, 16, and 17, the capacitor element 14, and the terminal P in FIG. 1B respectively. The electrode SR and the output terminal L which are arranged outside the circuits 10 in FIGS. 1A to 1C are arranged inside the circuits 10 in FIG. 26 in order to reduce the layout area. Note that in the top view referred in this embodiment mode, a region indicated by a broken line is a region where there is another layer in a layer above the region.

Figure 27A:
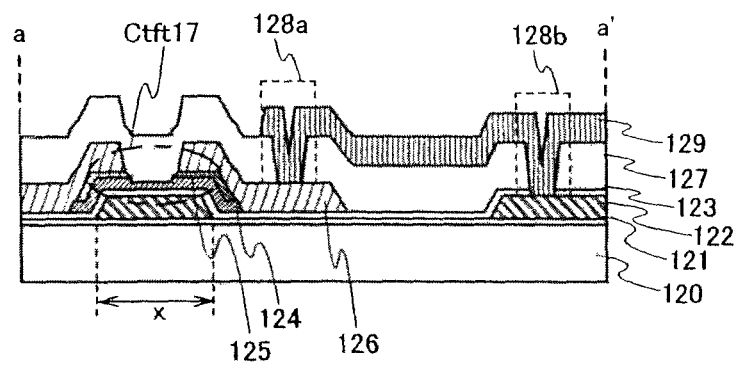
FIGS. 27A and 27B are cross-sectional views of a shift register circuit of the present invention.
Figure 27B:
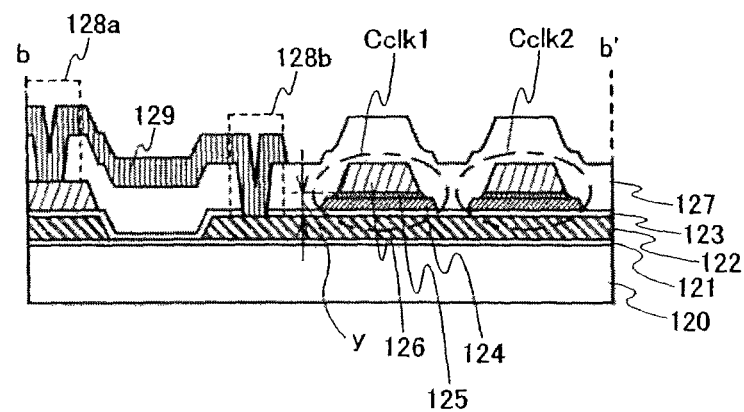

Next, cross-sectional views taken along lines a-a' and b-b' in FIG. 26 of the case of using a thin film transistor as a transistor will be described with reference to FIGS. 27A and 27B. A structure shown in FIGS. 27A and 27B is provided with a substrate 120, a base film 121, a first wiring layer 122, an insulating film 123, active layers 124 and 125, a second wiring layer 126, an interlayer film 127, and a third wiring layer 129. Further, the structure shown in FIGS. 27A and 27B is provided with a contact 128a which connect the third wiring layer 129 and the second wiring layer 126, and a contact 128b which connects the third wiring layer 129 and the first wiring layer 122. The structure shown in FIGS. 27A and 27B will be described step by step.

First, the substrate 120 may be a glass substrate formed from barium borosilicate glass, aluminoborosilicate glass, or the like; a quartz substrate, a silicon substrate, a metal substrate, a stainless-steel substrate, or a plastic substrate. Further, the substrate 120 may be polished by CMP or the like to planarize a surface of the substrate 120.

Next, a base film 121 may be formed over the substrate 120. The base film 121 may be formed from a single layer of nitride aluminum (AlN), silicon oxide ($SiO_2$), silicon oxynitride ($SiO_xN_y$), or the like or a laminate thereof by a known method such as CVD, plasma CVD, sputtering, or spin coating. Note the base film 121 has an effect of blocking impurities such as contaminants from the substrate 120. When the base film 121 is not formed, the manufacturing process is simplified, and cost can be reduced.

Next, a first wiring layer 122 may be formed over the substrate 120 or the base film 121. Here, the first wiring layer 122 may be processed into a desired shape by photolithography, a droplet discharge method, a printing method or the like.

Next, an insulating film 123 may be formed over the substrate 120, the base film 121, or the first wiring layer 122. Here, the insulating film 123 may be formed of silicon oxide ($SiO_2$) or silicon oxynitride ($SiO_xN_y$).

Next, active layers 124 and 125 may be formed over the substrate 120, the base film 121, the first wiring layer 122, or the insulating film 123. Here, the active layers 124 and 125 may be formed of amorphous silicon (a-Si), and the active layers 124 and 125 may be continuously formed in the same film formation apparatus. The active layer 125 may have higher conductivity compared to the active layer 124. Note that a region in the vicinity of the interface between the channel region, specifically the active layer 124, and the insulating film 123 may be denser than the other region of the active layer 124. Thus, deterioration of the transistor can be suppressed, and film formation rate of the active layer 124 can be speeded; thus, throughput improve is improved.

A second wiring layer 126 may be formed over the substrate 120, the base film 121, the first wiring layer 122, the insulating film 123, or the active layers 124 and 125. Here, a composition containing particles of metal such as Ag (silver), Au (gold), Cu (copper), W (tungsten), or Al (aluminum) as main components can be used as a material for forming the second wiring layer 126. Further, a light-transmitting material such as indium tin oxide (ITO), ITSO containing indium tin oxide and silicon oxide, organoindium, organotin, zinc oxide, titanium nitride may be combined. Further, the second wiring layer 126 may be processed into a desired shape by photolithography, a droplet discharge method, a printing method, or the like.

Next, an interlayer film 127 may be formed over the substrate 120, the base film 121, the first wiring layer 122, the insulating film 123, or the active layers 124 and 125, or the second wiring layer 126. Here, the interlayer film 127 can be formed from an insulating material such as silicon oxide, silicone nitride, silicon oxynitride, aluminum oxide, aluminum nitride, aluminum oxynitride or other inorganic insulating materials; acrylic acid or methacrylic acid, or a derivative thereof; a heat resistant polymer such as polyimide, aromatic polyamide, polybenzimidazole; or a siloxane resin. Further, the interlayer film 127 may be processed into a desired shape by photolithography, a droplet discharge method, a printing method, or the like. When the interlayer film is formed from a photosensitive or a non photosensitive material such as acrylic or polyimide, the interlayer film has curved sides in which the curvature radius is changed continuously, and a thin film thereon can be formed without disconnection, which is preferable. Further, the interlayer film 127 may be processed into a desired shape by photolithography, a droplet discharge method, a printing method, or the like. Here, the interlayer film 127 may be processed so that etching ends before the wiring layer 126 is etched as with the contact 128*a* while the insulating film 123 is also processed as with the contact 128*b*. Then, the second wiring layer 126 can be formed so that the second wiring layer 126 is connected to the first wiring layer 122.

A third wiring layer 129 may be formed over the substrate 120, the base film 121, the first wiring layer 122, the insulating film 123, the active layers 124 and 125, the second wiring layer 126, or the interlayer film 127. Here, a composition containing particles of metal such as Ag (silver), Au (gold), Cu (copper), W (tungsten), or Al (aluminum) as main components can be used as a material for forming the third wiring layer 129. Further, a light-transmitting material such as indium tin oxide (ITO), ITSO containing indium tin oxide and silicon oxide, organoindium, organotin, zinc oxide, titanium nitride may be combined. Further, the third wiring layer 129 may be processed into a desired shape by photolithography, a droplet discharge method, a printing method, or the like.

Note that, in FIG. 27A, Reference numeral Ctft17 denotes a parasitic capacitance element of the transistor 17, Cclk1 denotes a parasitic capacitance element of the output terminal L and the first clock signal line CLK1, and Cclk2 denotes a parasitic capacitance element of the output terminal L and the second clock signal line CLK2 respectively. Reference numeral x in FIG. 27A denotes a width of the first wiring layer over which the active layer exist in the parasitic capacitance element Ctft17. Reference numeral y denotes a distance between the upper end of the first wiring layer and the lower end of the second wiring layer in the parasitic capacitance elements Cclk1 and Cclk2. Here in order to increase y, in a region where the output terminal L crosses the first clock signal line CLK1 and the second clock signal line CLK2 in a cross-section taken along line b-b', active layers 124 and 125 may be formed.

Since the active layer and the second wiring layer are separately formed using different masks in FIG. 26, a region provided with an active layer is not necessarily formed in the second wiring layer other than a transistor area therein. Further, as with the region where the output terminal L crosses the first clock signal line CLK1 and the second clock signal line CLK2 as in FIG. 26, an active layer may be formed in second wiring layer other than the transistor area.

Further, in FIG. 26, a power supply line Vss, a first clock signal line CLK1, a second clock signal line CLK2 are each formed from a wiring layer and the active layer, and they may be provided in substantially parallel to the direction where the circuits 10 extend (shown as 10ext). Thus, in the case of providing a plurality of circuits 10, the length of leading the wiring is increased and wiring resistance is increased accordingly, and thus, malfunctions and increase in power consumption due to voltage drop of the power supply line can be prevented. Further, malfunctions caused by distortion of a signal waveform, reduction in the range of voltage where the circuit operates normally can be suppressed.

The power supply line Vss, the first clock signal line CLK1, and the second clock signal line CLK2 may be provided outside elements forming the circuit 10. Further, the power supply line Vss may be provided opposite to the first clock signal line CLK1 and the second clock signal line CLK2. Thus, the power supply line Vss can be prevented from crossing the first clock signal line CLK1 and the second clock signal line CLK2; thus, the power supply line can be prevented from being affected by noise from the clock signal line, and malfunctions can be reduced.

In FIG. 26, the channel length direction of the transistor 11 (shown as Ch1) and the channel length direction of the transistor 12 (shown as Ch2) may be substantially perpendicular.

With this structure, the area of a substrate occupied by the transistors 11 and 12 can be minimized, and circuit scale can be reduced.

Further, the channel length directions of the transistors 13 and 16 (shown as Ch1) may be substantially parallel to each other; they may share either one source electrode or one drain electrode. Thus, the area of a substrate which is occupied by the transistors 13 and 16 can be minimized and circuit scale can be reduced. Further, channel length directions of the transistors 15 and 17 (shown as Ch2) may be substantially parallel to each other, and they may share either one source electrode or one drain electrode. Thus, the area of a substrate occupied by the transistors 15 and 17 can be minimized, and circuit scale can be reduced.

Next, description will be given of a top view of the circuits 10 of the case where the shapes of the transistors 13 and 17 are devised to maintaining the electric potential of the electrode SR at H level thereby fixing the electric potentials of the terminal P and the output terminal L with reference to FIG. 28. The circuit 10 shown in the top view of FIG. 28 is provided with transistors 11, 12, 13, 15, 16, and 17, a capacitor element 14, the terminal P, the electrode SR, and the output terminal L as in FIG. 26, and connections are also similar; however, the shapes of the first wiring layer of the transistors 13 and 17 are different Thus, when the average of the of areas of the first wiring layer in the transistors 13 and 17 is made larger than the area of the first wiring layer in the transistor 12 of the circuit 10, the value of parasitic capacitance associated with the electrode SR can be made larger; thus, the electric potential of the electrode SR can be maintained at H level even after a reset operation, which is preferable.

Figure 28:
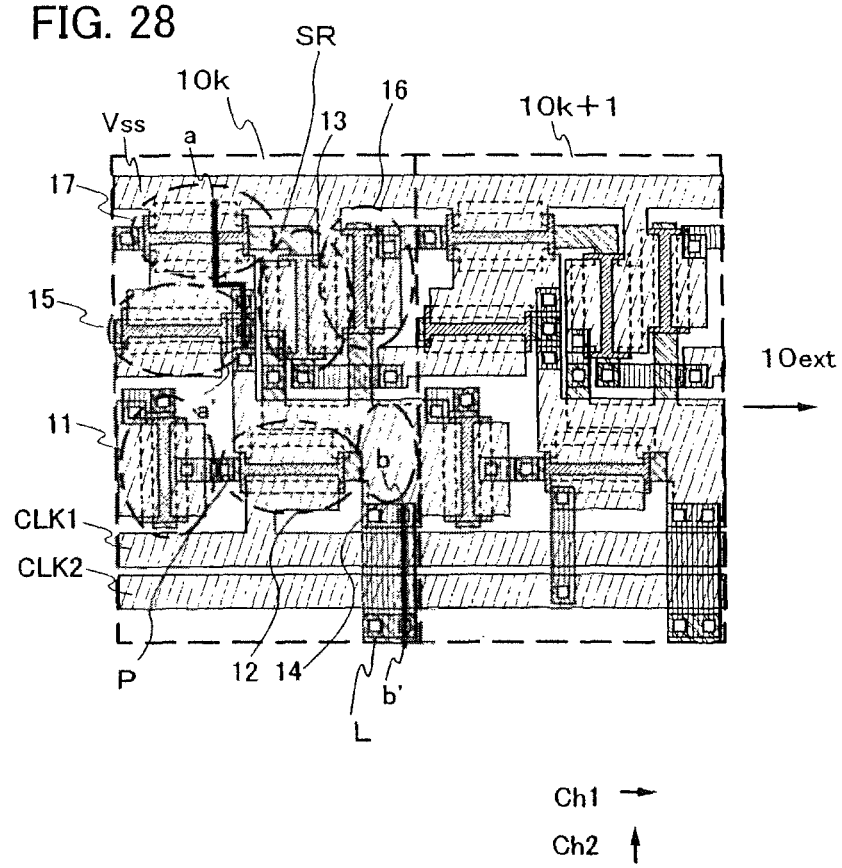
FIG. 28 is a top view of a shift register circuit of the present invention.

Further, as shown in FIG. 28, the electrode SR may be formed to be curved in the circuit 10 so as not to make the shape linear. Thus, the length of leading the electrode SR can be made longer than the pitch between the circuit 10 of the kth stage (shown as 10k) and the circuit 10 of the (k+1)th stage (shown as 10k+1). Accordingly, the value of parasitic capacitance associated with the electrode SR can be increased, so that the electric potential of the electrode SR can be maintained at H level even after a reset operation, which is preferable.

Further, the circuits 10 shown in the top view of FIG. 28 have a different structure of the region where the output terminal L crosses the clock signal line from one in FIG. 26. In the circuits 10 shown in FIG. 28, in the region where the output terminal L crosses the clock signal line, the output terminal L is formed with the third wiring layer, and the clock signal line can be formed with the second wiring.

Figure 29A:
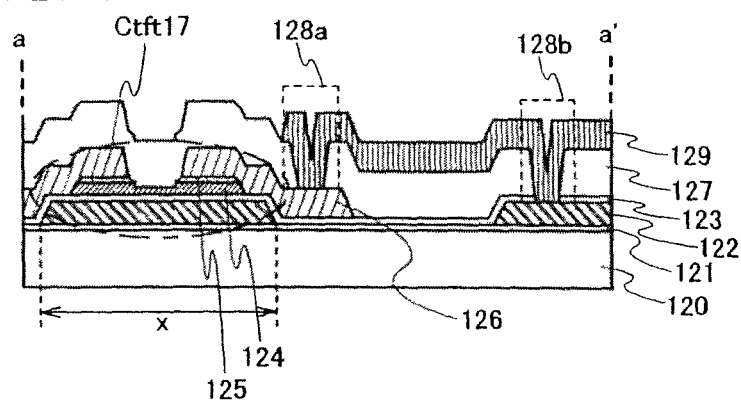
FIGS. 29A and 29B are cross-sectional views of a shift register circuit of the present invention.
Figure 29B:
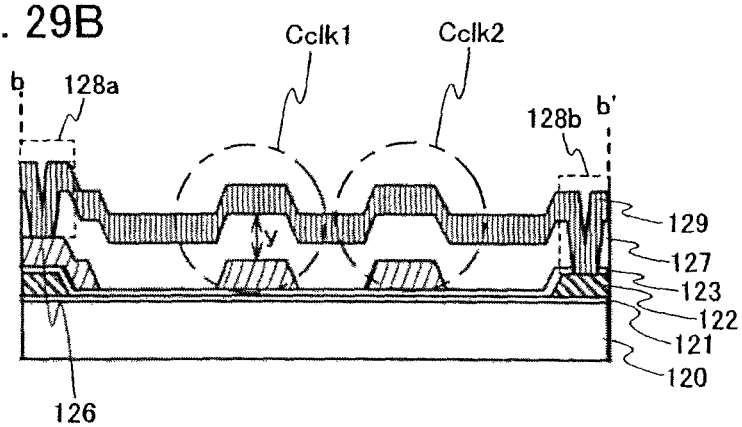

Next, cross-sectional views taken along lines a-a' and b-b' in FIG. 28 of the case of using a thin film transistor as a transistor will be described with reference to FIGS. 29A and 29B. A structure shown in FIGS. 29A and 29B is provided with a substrate 120, a base film 121, a first wiring layer 122, an insulating film 123, active layers 124 and 125, a second wiring layer 126, an interlayer film 127, and a third wiring layer 129 as the structure shown in FIGS. 27A and 27B. Further, the structure shown in FIGS. 29A and 29B is provided with a contact 128a which connect the third wiring layer 129 and the second wiring layer 126, and a contact 128b which connects the third wiring layer 129 and the first wiring layer 122.

Note that, in FIG. 29A, Reference numeral Ctft17 denotes a parasitic capacitance element of the transistor 17, Cclk1 denotes a parasitic capacitance element of the output terminal L and the first clock signal line CLK1, and Cclk2 denotes a parasitic capacitance element of the output terminal L and the second clock signal line CLK2 respectively. Reference numeral x in FIG. 29A denotes a width of the first wiring layer over which the active layer or the second wiring layer exist in the parasitic capacitance element Ctft17. Reference numeral y denotes a distance between the upper end of the first wiring layer and the lower end of the second wiring layer in the parasitic capacitance elements Cclk1 and Cclk2.

Here, the capacitance value of the parasitic capacitance element Ctft17 becomes larger as x is larger. Meanwhile, the capacitance values of the parasitic capacitance elements Cclk1 and Cclk2 become smaller as y is larger. When the capacitance value of the parasitic capacitance element Ctft17 is increased by making x larger as shown in FIG. 29A, parasitic capacitance value associated with the electrode SR can be increased; thus, the electric potential of the electrode SR can be maintained at H level sufficiently. Further, when the capacitance values of the parasitic capacitance elements Cclk1 and Cclk2 is reduced by making y larger as in FIG. 29B, change in the electric potential of the output terminal L due to change in the electric potentials of the first clock signal line CLK1 and the second clock signal line CLK2 through the parasitic capacitance elements Cclk1 and Cclk2, can be reduced. Note that thereupon, an active layer and a first wiring layer are not necessarily formed below the first clock signal line CLK1 and the second clock signal line CLK2. Further, the first clock signal line CLK1 and the second clock signal line CLK2 may be formed with the first wiring layer.

Next, description will be given of a top view of the case where cross capacitance of the clock signal line and the output terminal L is eliminated so that the output terminal L is not affected by change in the electric potential of the clock signal line as possible with reference to FIG. 30. The circuit 10 shown in the top view of FIG. 30 is provided with transistors 11, 12, 13, 15, 16, and 17, a capacitor element 14, a terminal P, an electrode SR, and an output terminal L as in FIG. 26 and FIG. 28, and the connections are also similar; however, the arrangement of the first clock signal line CLK1, the second clock signal line CLK2, and the transistors 11 and 12 is different form FIG. 26 and FIG. 28.

Figure 30:
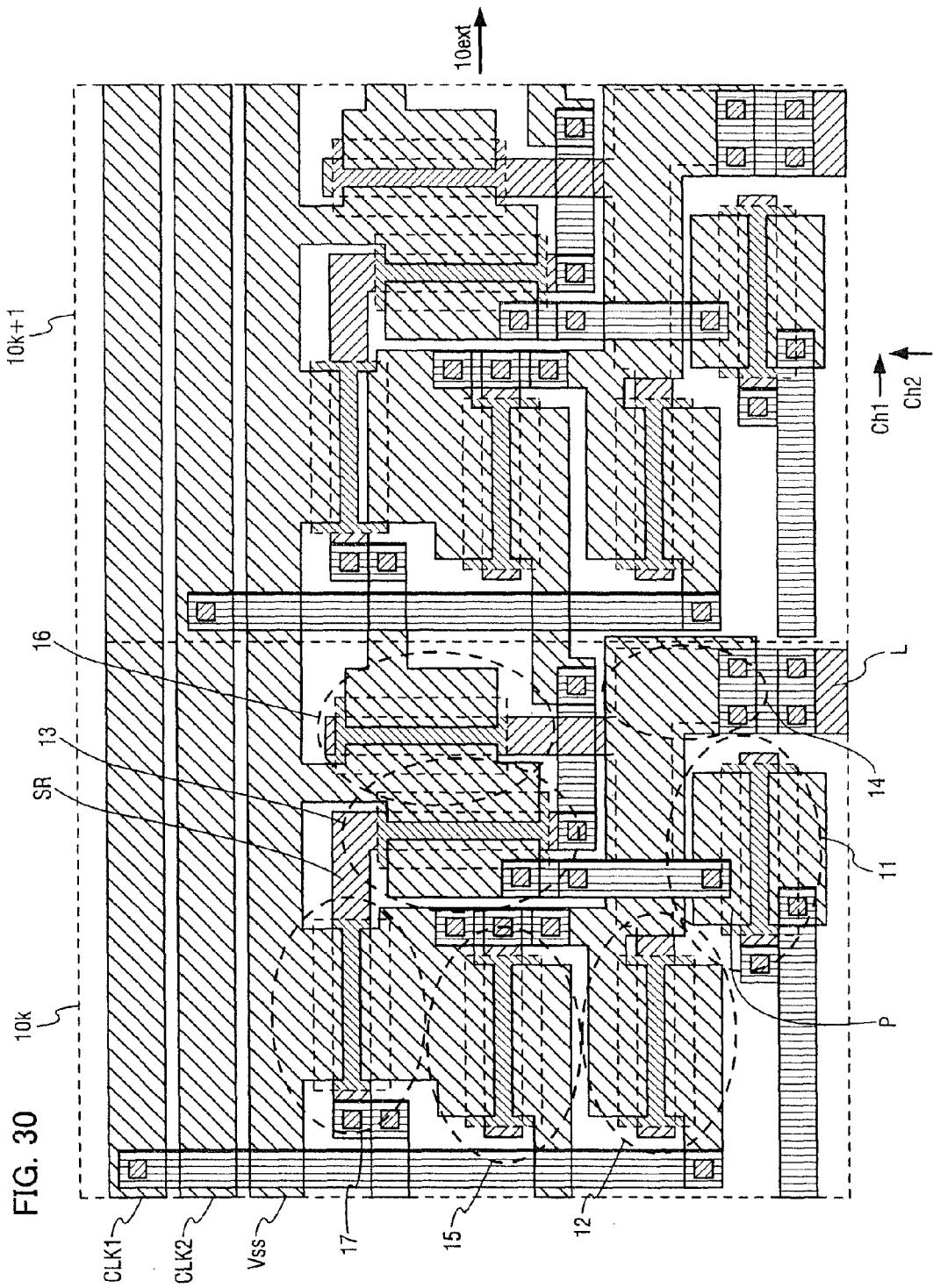
FIG. 30 is a top view of a shift register circuit of the present invention.

In FIG. 30, the power supply line Vss, the first clock signal line CLK1, and the second clock signal line CLK2 are formed from the second wiring layer, and may be provided in substantially parallel to the direction where the circuits 10 extend (shown as 10ext). Thus, in the case of providing a plurality of circuits 10, the length of leading the wiring is increased and wiring resistance is increased accordingly, and thus, malfunctions and increase in power consumption due to voltage drop of the power supply line can be prevented. Further, malfunctions caused by distortion of a signal waveform, reduction in the range of voltage where the circuit operates normally can be suppressed.

The power supply line Vss, the first clock signal line CLK1, and the second clock signal line CLK2 may be provided outside elements forming the circuit 10. Further, the power supply line Vss, and the first clock signal line CLK1 and the second clock signal line CLK2 may be provided on the same side which is opposite to the side where the output terminal L is provided, with respect to the first transistor, the third transistor, the second transistor, and the fourth transistor. Thus, the output terminal L can be prevented from crossing the first clock signal line CLK1 and the second clock signal line CLK2; thus, the power supply line can be prevented from being affected by noise from the clock signal line, and malfunctions can be reduced.

Further, the channel length direction of the transistor 11 (shown as Ch1) and the channel length direction of the transistor 12 (shown as Ch2) may be substantially parallel. With this structure, the area of a substrate occupied by the transistors 11 and 12 can be minimized, and circuit scale can be reduced and generation of a region where the output terminal L crosses the first clock signal line CLK1 and the second clock signal line CLK2 can be prevented as well.

Embodiment Mode 5

In this embodiment mode, configuration examples of a display panel using a shift register circuit of the present invention, described through Embodiment Modes 1 through 4, and a whole display device using the shift register circuit of the present invention will be described. Note that in this specification, a display panel refers to a device for displaying still images or moving images, which has a region in which pixels are arrayed (a pixel area) over a substrate such as a glass substrate, a plastic substrate, a quartz substrate, a silicon substrate. Further, a display device refers to a systematized device for displaying images on the display panel, which has a circuit for converting electric signals inputted from the external to data signals separately controlling the optical states of the pixels, a driver circuit for dividing the data signals by time and writing them into the pixels, or the like. Further, the display device may include a circuit for processing the data signals thereby optimizing images to be displayed on the display panel, or the like.

A shift register circuit of the present invention may be used as a part of a driver circuit forming a display device. Further, various method can be used for mounting a shift register circuit of the present invention to a display device, considering productivity, manufacturing cost, reliability, and the like. Here, examples of methods for mounting a shift register circuit of the present invention to a display device will be described with reference to FIGS. 31A to 31E.

Figure 31A:
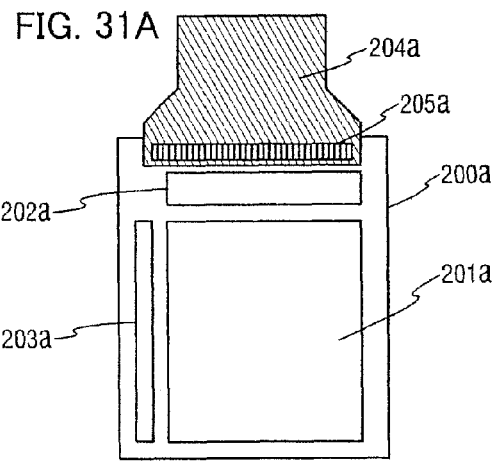
FIGS. 31A to 31E illustrate display panels using shift register circuits of the present invention.

FIG. 31A illustrates a display panel of the case where a data line driver and a scan line driver that are a peripheral driver circuits are integrated with a substrate provided with a pixel area. A display panel 200*a* shown in FIG. 31A includes a pixel area 201*a*, a data line driver 202*a*, a scan line driver 203*a*, and a connection wiring substrate 204*a*. The pixel area 201*a* is a region in which pixels are arrayed; the pixel array may be a striped type or a delta type. Further, the pixel area 201*a* may include data signal lines which are wirings for writing data signals separately controlling the optical states into the pixels. Further, the pixel area 201*a* may include scan lines which are wirings for selecting pixel columns to which the data signals for separately controlling the optical state.

The data line driver 202*a* illustrates a circuit for controlling the electrical states of the data signal lines in accordance with the images to be displayed on the pixel area 201*a*. The data line driver 202*a* may have a shift register circuit of the present invention so as to control a plurality of signal data lines by dividing them by the time division.

A scan line driver 203*a* is a circuit for controlling the electrical states of scan lines which are wirings for selecting pixel columns to which the data signals for separately controlling the optical state. The scan line driver 203*a* may have a shift register circuit of the present invention for sequentially sequential scanning of a plurality of scan lines, selecting pixel columns to which the data signals for separately controlling the optical state, and writhing the data signals into the pixels, thereby displaying images on the pixel area 201*a*.

The connection wiring substrate 204*a* is a substrate provided with a wiring for connecting the display panel 200*a* to an external circuit for driving the display panel 200*a*. When a connection wiring substrate 204*a* is formed from a flexible substrate of polyimide or the like, it is easier to mount the display panel 200*a* in a housing having a movable portion. Further, when the housing having the display panel 200*a* is strongly shocked, if the connection wiring substrate 204*a* is flexible, the shock is absorbed by the connection wiring substrate 204*a*; thus, a risk of disconnection by peel-off of the connection portion 205*a*.

In the display panel 200*a* shown in FIG. 31A, the data line driver 202*a* and the scan line driver 203*a* are integrated with the substrate provided with the pixel area 201*a*; thus, manufacturing cost can be reduced, and impact resistance can be increased because the number of connection points is small.

Figure 31B:
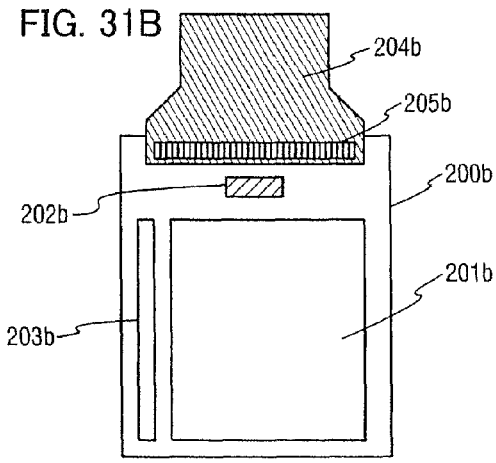

FIG. 31B illustrates a display panel of the case where a scan line driver that is a peripheral driver circuit is integrated with a substrate provided with the pixel area, and the data line driver is provided as an IC manufactured on a single crystalline substrate over the substrate and connected thereto (the method is also referred to as COG). A display panel 200*b* shown in FIG. 31B includes a pixel area 201*b*, a data line driver 202*b*, a scan line driver 203*b*, and a connection wiring substrate 204*b*.

The pixel area 201*b* is a region in which pixels are arrayed; the pixel array may be a striped type or a delta type. Further, the pixel area 201*b* may include data signal lines which are wirings for writing data signals separately controlling the optical states into the pixels. Further, the pixel area 201*b* may include scan lines which are wirings for selecting pixel columns to which the data signals for separately controlling the optical state. The data line driver 202*b* illustrates a circuit for controlling the electrical states of the data signal lines in accordance with the images to be displayed on the pixel area 201*b*. The data line driver 202*b* may have a shift register circuit of the present invention so as to control a plurality of signal data lines by dividing them by the time division.

A scan line driver 203*b* is a circuit for controlling the electrical states of scan lines which are wirings for selecting pixel columns to which the data signals for separately controlling the optical state. The scan line driver 203*b* may have a shift register circuit of the present invention for sequentially sequential scanning of a plurality of scan lines, selecting pixel columns to which the data signals for separately controlling the optical state, and writing the data signals into the pixels, thereby displaying images on the pixel area 201*b*.

The connection wiring substrate 204*b* is a substrate provided with a wiring for connecting the display panel 200*b* to an external circuit for driving the display panel 200*b*. When a connection wiring substrate 204*b* is formed from a flexible substrate of polyimide or the like, it is easier to mount the display panel 200*b* in a housing having a movable portion. Further, when the housing having the display panel 200*b* is strongly shocked, if the connection wiring substrate 204*b* is flexible, the shock is absorbed by the connection wiring substrate 204*b*; thus, a risk of disconnection by peel-off of the connection portion 205*b*.

In the display panel 200*b* shown in FIG. 31B, the scan line driver 203*b* is integrated with the substrate provided with the pixel area 201*b*; thus, manufacturing cost can be reduced, and impact resistance can be increased because the number of connection points is small. Further, since an IC manufactured using a single crystal substrate is mounted as the data line driver 202*b*, the display panel can be manufactured with significantly little variation in the transistor characteristics; thus, yield of display devices can be improved. Further, since operating voltage can be reduced, power consumption can be reduced.

Figure 31C:
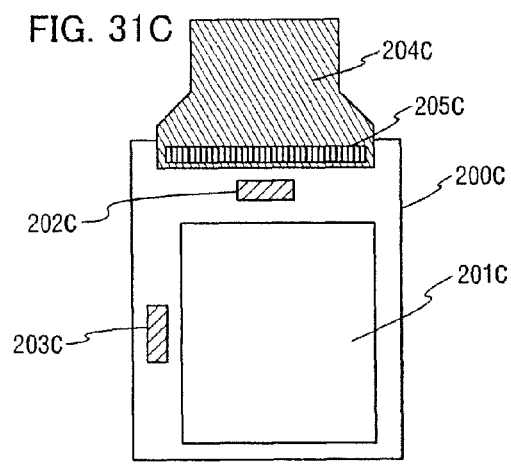

FIG. 31C illustrates a display panel of the case where a data line driver and a scan line driver that are a peripheral driver circuits are manufactured as an IC on a single crystal substrate over a substrate provided with the pixel area, thereby achieving COG A display panel 200c shown in FIG. 31C includes a pixel area 201c, a data line driver 202c, a scan line driver 203c, and a connection wiring substrate 204c.

The pixel area 201c is a region in which pixels are arrayed; the pixel array may be a striped type or a delta type. Further, the pixel area 201c may include data signal lines which are wirings for writing data signals separately controlling the optical states into the pixels. Further, the pixel area 201c may include scan lines which are wirings for selecting pixel columns to which the data signals for separately controlling the optical state.

The data line driver 202c illustrates a circuit for controlling the electrical states of the data signal lines in accordance with the images to be displayed on the pixel area 201c. The data line driver 202c may have a shift register circuit of the present invention so as to control a plurality of signal data lines by dividing them by the time division.

A scan line driver 203c is a circuit for controlling the electrical states of scan lines which are wirings for selecting pixel columns to which the data signals for separately controlling the optical state. The scan line driver 203c may have a shift register circuit of the present invention for sequentially sequential scanning of a plurality of scan lines, selecting pixel columns to which the data signals for separately controlling the optical state, and writhing the data signals into the pixels, thereby displaying images on the pixel area 201c.

The connection wiring substrate 204c is a substrate provided with a wiring for connecting the display panel 200c to an external circuit for driving the display panel 200c. When a connection wiring substrate 204c is formed from a flexible substrate of polyimide or the like, it is easier to mount the display panel 200c in a housing having a movable portion. Further, when the housing having the display panel 200c is strongly shocked, if the connection wiring substrate 204c is flexible, the shock is absorbed by the connection wiring substrate 204c; thus, a risk of disconnection by peel-off of the connection portion 205c.

Further, since the display panel shown in FIG. 31C is mounted as an IC manufactured using a single crystal substrate is mounted as the data line driver 202c and the scan line driver 203c, the display panel can be manufactured with significantly little variation in the transistor characteristics; thus, yield of display devices can be improved. Further, since operating voltage can be reduced, power consumption can be reduced.

Figure 31D:
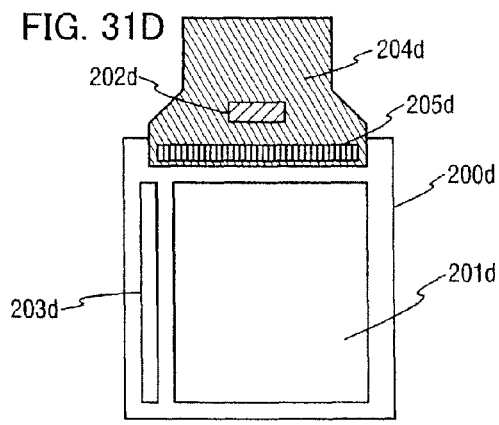

FIG. 31D illustrates a display panel of the case where a scan line driver that is a peripheral driver circuit is integrated with a flexible substrate provided with the pixel area, and the data line driver is provided as an IC manufactured on a single crystalline substrate over the flexible substrate and connected thereto (the method is also referred to as TAB). A display panel 200d shown in FIG. 31D includes a pixel area 201d, a data line driver 202d, a scan line driver 203d, and a connection wiring substrate 204d.

The pixel area 201d is a region in which pixels are arrayed; the pixel array may be a striped type or a delta type. Further, the pixel area 201d may include data signal lines which are wirings for writing data signals separately controlling the optical states into the pixels. Further, the pixel area 201d may include scan lines which are wirings for selecting pixel columns to which the data signals for separately controlling the optical state.

The data line driver 202d illustrates a circuit for controlling the electrical states of the data signal lines in accordance with the images to be displayed on the pixel area 201d. The data line driver 202d may have a shift register circuit of the present invention so as to control a plurality of signal data lines by dividing them by the time division.

A scan line driver 203d is a circuit for controlling the electrical states of scan lines which are wirings for selecting pixel columns to which the data signals for separately controlling the optical state. The scan line driver 203d may have a shift register circuit of the present invention for sequentially sequential scanning of a plurality of scan lines, selecting pixel columns to which the data signals for separately controlling the optical state, and writhing the data signals into the pixels, thereby displaying images on the pixel area 201d.

The connection wiring substrate 204d is a substrate provided with a wiring for connecting the display panel 200d to an external circuit for driving the display panel 200d. When a connection wiring substrate 204d is formed from a flexible substrate of polyimide or the like, it is easier to mount the display panel 200d in a housing having a movable portion. Further, when the housing having the display panel 200d is strongly shocked, if the connection wiring substrate 204d is flexible, the shock is absorbed by the connection wiring substrate 204d; thus, a risk of disconnection by peel-off of the connection portion 205d.

In the display panel 200d shown in FIG. 31D, the scan line driver 203d is integrated with the substrate provided with the pixel area 201d; thus, manufacturing cost can be reduced, and impact resistance can be increased because the number of connection points is small. Further, since an IC manufactured using a single crystal substrate is mounted as the data line driver 202d, the display panel can be manufactured with significantly little variation in the transistor characteristics; thus, yield of display devices can be improved. Further, since operating voltage can be reduced, power consumption can be reduced. Further, since the data line driver 202d is connected onto the connection wiring substrate 204d, the region in the display panel 200d other than the pixel area 201d (also referred to as a frame) can be reduced, thereby the display device can have higher added value. Further, if the connection wiring substrate 204d is flexible, when the housing having the display panel 200d is strongly shocked, the shock on the data line driver 204d is absorbed by the connection wiring substrate 204d; thus, a risk of disconnection by peel-off of the data line driver 202d from the connection wiring substrate 204d.

Figure 31E:
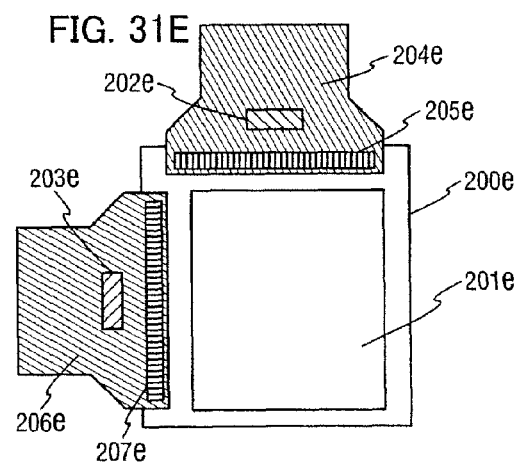

FIG. 31E illustrates a display panel of the case where a data line driver and a scan line driver that are peripheral driver circuits are manufactured as ICs on a single crystalline substrate on a substrate provided with the pixel area by TAB. A display panel 200e shown in FIG. 31E includes a pixel area 201e, a data line driver 202e, a scan line driver 203e, and a connection wiring substrate 204e.

The pixel area 201e is a region in which pixels are arrayed; the pixel array may be a striped type or a delta type. Further, the pixel area 201e may include data signal lines which are wirings for writing data signals separately controlling the optical states into the pixels. Further, the pixel area 201e may include scan lines which are wirings for selecting pixel columns to which the data signals for separately controlling the optical state.

The data line driver 202e illustrates a circuit for controlling the electrical states of the data signal lines in accordance with the images to be displayed on the pixel area 201e. The data line driver 202e may have a shift register circuit of the present invention so as to control a plurality of signal data lines by dividing them by the time division.

A scan line driver 203e is a circuit for controlling the electrical states of scan lines which are wirings for selecting pixel columns to which the data signals for separately controlling the optical state. The scan line driver 203e may have a shift register circuit of the present invention for sequentially sequential scanning of a plurality of scan lines, selecting pixel columns to which the data signals for separately controlling the optical state, and writhing the data signals into the pixels, thereby displaying images on the pixel area 201e.

The connection wiring substrate 204e is a substrate provided with a wiring for connecting the display panel 200e to an external circuit for driving the display panel 200e. When a connection wiring substrate 204e is formed from a flexible substrate of polyimide or the like, it is easier to mount the display panel 200e in a housing having a movable portion. Further, when the housing having the display panel 200e is strongly shocked, if the connection wiring substrate 204e is flexible, the shock is absorbed by the connection wiring substrate 204e; thus, a risk of disconnection by peel-off of the connection portion 205e.

Since an IC manufactured using a single crystal substrate is mounted as the data line driver 202e and the scan line driver 203e in the display panel 200e shown in FIG. 31E, the display panel can be manufactured with significantly little variation in the transistor characteristics; thus, yield of display devices can be improved. Further, since operating voltage can be reduced, power consumption can be reduced. Further, since the data line driver 202e is connected onto the connection wiring substrate 204e, the frame of the display panel 200e can be reduced, thereby the display device can have higher added value. Further, if the connection wiring substrate 204e is flexible, when the housing having the display panel 200e is strongly shocked, the shock on the data line driver 204e is absorbed by the connection wiring substrate 204e; thus, a risk of disconnection by peel-off of the data line driver 202e and the scan line driver 203e from the connection wiring substrate 204e.

Thus, a transistor of the invention may be any kinds of transistors and formed over any kinds of substrates. A shift register circuit if the present invention may be formed over a glass substrate, a plastic substrate, a single crystal substrate, an SO1 substrate, or any other substrates. A part of the shift register circuit of the present invention may be formed over one substrate while another part of the shift register circuit of the present invention may be formed over another substrate. That is, all the shift register circuits of the present invention are not required to be formed over the same substrate.

Figure 32:
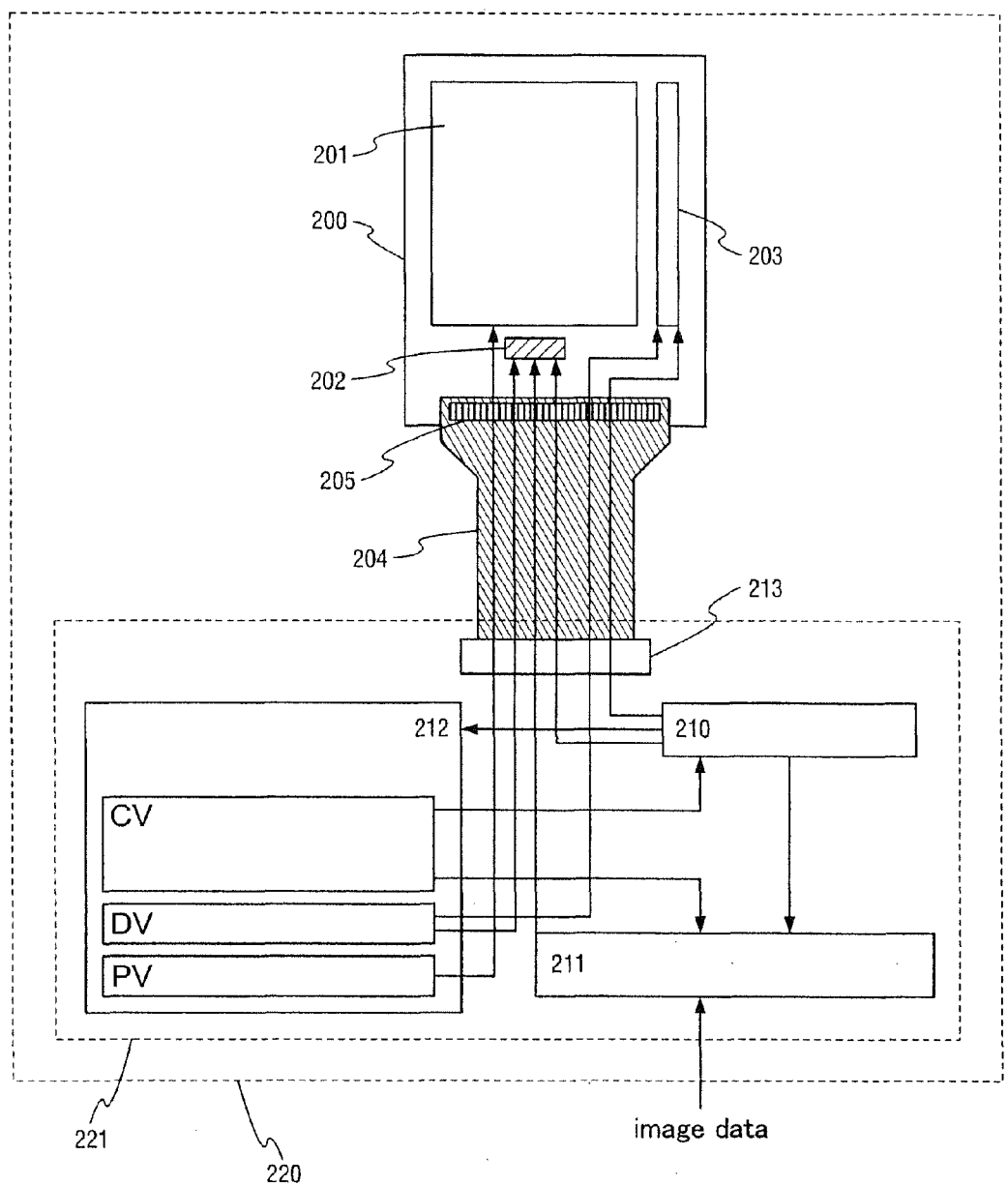
FIG. 32 illustrates a display device using a shift register circuit of the present invention.

Next, a configuration example of a display device including a shift register circuit of the present invention will be described with reference to FIG. 32. A display device 220 shown in FIG. 32 is provided with the display panel 200, the external driver circuit 221, and the connection wiring substrate 204 shown in FIG. 31A to 31E.

The display panel 200 has a pixel area 201, a data line driver 202, and a scan line driver 203. Since the display panel 200 has been described above, the details will not be described here. However, naturally, display device 220 shown in FIG. 32, the data line driver 202 and the scan line driver 203 can be mounted by various methods.

The external driver circuit 221 includes a control circuit 210, an image data conversion circuit 211, and a power circuit 212. Further, the power circuit 212 may be provided with a power supply CV for a control/image data conversion circuit, a power supply DV for drivers, a power supply PV for a pixel circuit. Note that, the power supply PV for a pixel circuit is not required to be provided in the power circuit 212 depending on the configuration of the pixel area 201.

The connection wiring substrate 204 may be electrically connected to the display panel 200 through a connection portion 205, and may be electrically connected to the external driver circuit 221 through a connector 213.

Figure 33:
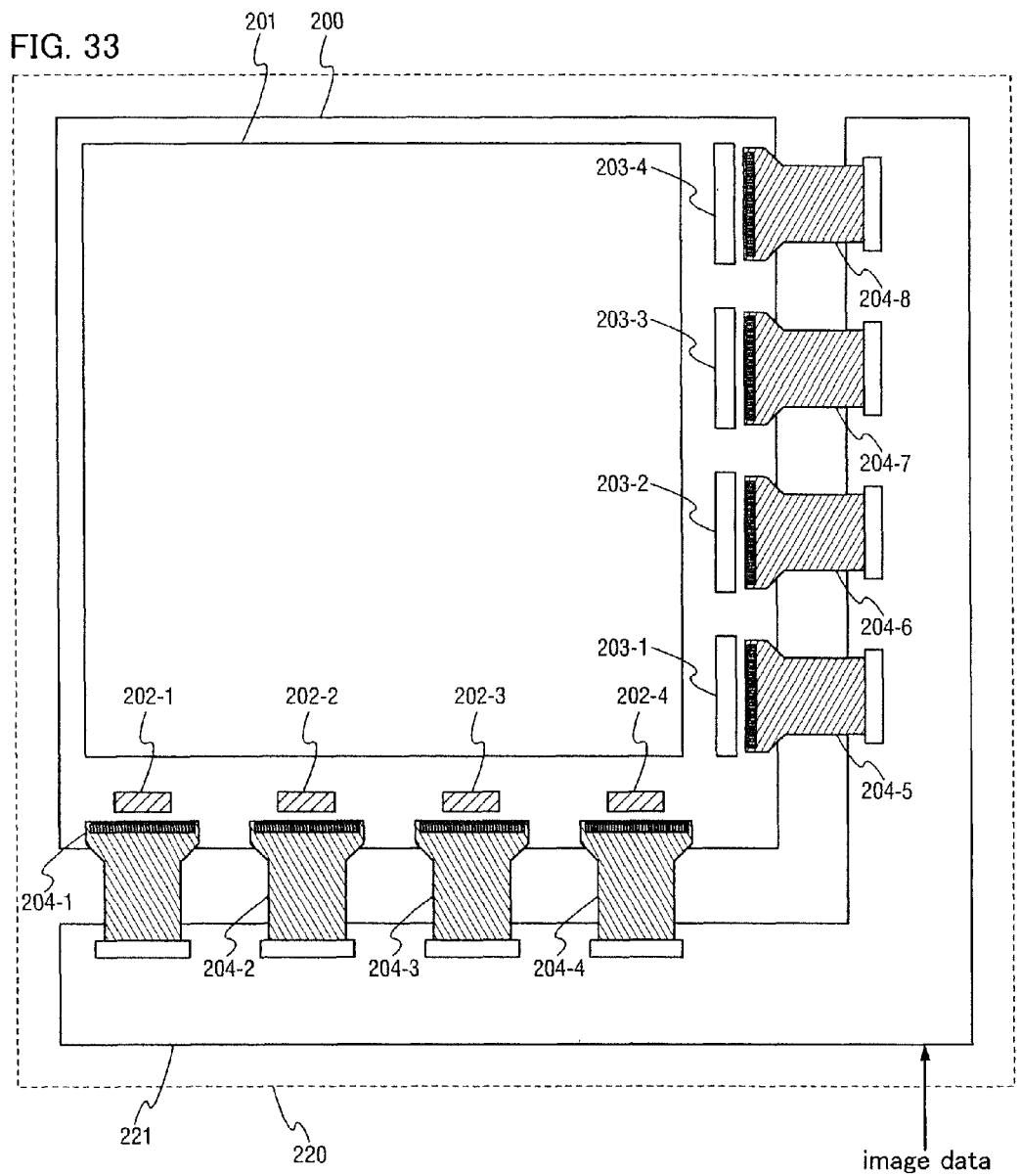
FIG. 33 illustrates a display device using a shift register circuit of the present invention.

Further, in order to correspond to a display panel having a large pixel area 201, as shown in FIG. 33, a plurality of data line drivers 202 (202-1, 202-2, 202-3, and 202-4), a plurality of scan line drivers 203 (203-1, 203-2, 203-3, and 203-4), a plurality of connection wiring substrates 204 (204-1, 204-2, 204-3, 204-4, 204-5, 204-6, 204-7, and 204-8) may be used for one display panel 200 and one pixel area 201. Here, in FIG. 33, the case of using four data line drivers 202 and four scan line drivers 203 is shown as an example; however, the numbers of the data line drivers 202 and the scan line drivers 203 are not limited in particular, and any number may be used. When the numbers of the data line drivers 202 and the scan line drivers 203 are smaller, the numbers of ICs and connection points; thus, reliability can be improved and manufacturing cost can be reduced. When the number of the data line drivers 202 and the scan line drivers 203 are large, performance required for each driver is lowered, so that yield can be improved.

Note that the number of the connection wiring substrates 204 is preferably two or more and the division number of the data line drivers 202 and the scan line drivers 203 or less. When the number of the connection wiring substrates 204 is larger than the division number of the drivers, the number of the contact points increases; thus, when the number of the contact points is increased, defects of breakage at the contact points increases.

In FIG. 32, the control circuit 210 is connected to the image data conversion circuit 211 and the power circuit 212. Further, the control circuit 210 is connected to the data line driver 202 and the scan line driver 203 through the connector 213, the connection wiring substrate 204, and the connection portion 205. Further, the image data conversion circuit 211 is connected to an input terminal which inputs image data. Further, the image data conversion circuit 211 is connected to the data line driver 202 through the connector 213, the connection wiring substrate 204, and the connection portion 205.

Further, the power circuit 212 supplies power for each circuit, and the power supply CV for control/image data conversion circuit in the power circuit 212 is connected to the control circuit 210 and the image data conversion circuit 211 the power supply DV for drivers is connected to the data line driver 202 and the scan line driver 203 through the connector 213, the connection wiring substrate 204, and the connection portion 205; the power supply PV for a pixel circuit is connected to the pixel area 201 through the connector 213, the connection wiring substrate 204, and the connection portion 205.

The voltage supplied to the control circuit 210 and the image data conversion circuit 211 from the power supply CV is preferably as low as possible since they control circuit 210 and the image data conversion circuit 211 conduct the logic operations, and thus, it is desirably about 3 V. Further, the voltage supplied from the power supply DV for drivers is preferably as low as possible in order to reduce power consumption. For example, when the ICs are used for the data line driver 202 and the scan line driver 203, the voltage is desirably about 3 V. Further, the data line driver 202 and the scan line driver 203 is integrated with the display panel 200, voltage having an amplitude of about twice to three times as high as the threshold voltage of the transistor is desirably supplied. Thus, the circuit can be operated securely while suppressing increase in power consumption.

The control circuit 210 may have a configuration such that an operation of generating clocks to be supplied to data line driver 202 and the scan line driver 95, an operation of generating and supplying timing pulses, or the like are conducted. In addition, the control circuit 210 may have a configuration such that an operation of generating clocks to be supplied to the image data conversion circuit, an operation of generating timing pulses outputting converted image data to the data line driver 202, or the like are conducted. The power circuit 212 may have a configuration such that an operation of stopping supply of voltage to each circuit when the image data conversion circuit 211, the data line driver 202, and the scan line driver 203, for example, are not required to be operated, thereby reducing power consumption.

When image data is inputted to the image data conversion circuit 211, the image data conversion circuit 211 converts the image data into data which can be inputted to the data line driver 202 in accordance with the timing at which a signal is supplied from the control circuit 210, and then, outputs the data to the data line driver circuit 202. Specifically, a configuration may be used in which image data input with an analog signal is converted into a digital signal with the image conversion circuit 211, and then, image data of the digital signal is output to the data line driver 202.

The data line driver 202 may have a configuration such as to operate the shift register of the present invention in accordance with a clock signal and a timing pulse supplied from the control circuit 210; take in the image data inputted to the data line driver 202 with time division; and output a data voltage or a data current with an analog value to a plurality of the data lines in accordance with the data which has been taken. Updating of the data voltage or the data current output to the data lines may be conducted by a latch pulse supplied from the control circuit 210. Further, in order to reset the shift register circuit of the present invention, a signal for the reset operation may be inputted. Further, in order to apply reverse bias to the transistors in the shift register circuit of the present invention, a signal for applying reverse bias can be inputted.

In accordance with the updating of the data voltage or the data current output to the data lines, the scan line driver 203 operates the shift register of the present invention in response to a clock signal and a timing pulse supplied from the control circuit 210 to scan scan lines 29 sequentially. Here, in order to reset the shift register circuit of the present invention, a signal for the reset operation may be inputted. Further, in order to apply reverse bias to the transistors in the shift register circuit of the present invention, a signal for applying reverse bias can be inputted.

Note that examples of disposing the scan line driver 203 on one side are illustrated in FIG. 32 and FIG. 33; however, the scan line driver 203 may be disposed on each side instead of one side. In the case of disposing the scan line driver 203 on each side, left-right balance of the display device is achieved when mounted on an electronic device, so that it is advantageous in increasing the degree of freedom for arrangement.

Embodiment Mode 6

In this embodiment mode, electronic devices which can be realized by using a shift register circuit of the present invention will be described with reference to FIGS. 34A to 34H.

The present invention can be applied to various electronic devices. Specifically the present invention can be applied to display devices of electronic devices. As such electronic devices, a camera such as a video camera and a digital camera; a goggle type display; a navigation system; an audio reproducing device (car audio, an audio component, or the like); a computer; a game machine; a portable information terminal (a mobile computer, a cellular phone, a portable game machine, an electronic book, or the like); an image reproducing device including a recording medium (specifically, a device capable of reproducing the content of a recording medium such as a digital versatile disc (DVD) and having a display device that can display the image of the data); and the like can be listed.

Figure 34A:
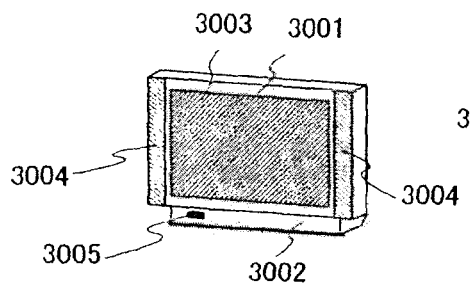
FIGS. 34A to 34H illustrate electronic devices using shift register circuits of the present invention.

FIG. 34A shows a television receiver machine including a housing 3001, a supporting stand 3002, a display area 3003, speaker units 3004, a video input terminal 3005, and the like. A display device of the present invention can be applied to the display area 3003. For example, since a large display area is demanded for a television receiver, a display device shown in FIG. 33. Note that display devices include, among others, all light emitting devices used for displaying information, for example, for a personal computer, for TV broadcast reception, or for advertisement display. A display device using a shift register circuit of the present invention can be used for the display area 3003, thereby obtaining a highly reliable electronic device, which hardly malfunctions even when subjected to noise such as external electromagnetic waves, and in which reverse bias application can be operated.

Figure 34B:
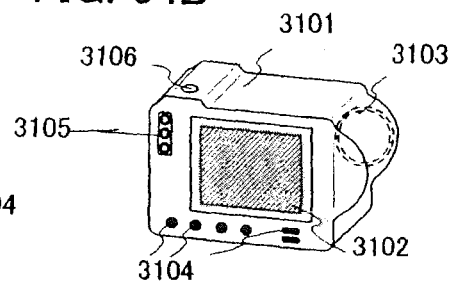

FIG. 34B shows a digital camera including a main body 3101, a display area 3102, an image receiving portion 3103, operation keys 3104, an external connection port 3105, a shutter 3106, and the like. A display device using a shift register circuit of the present invention can be used for the display area 3102, thereby obtaining a highly reliable digital camera, which hardly malfunctions even when subjected to noise such as external electromagnetic waves, and in which reverse bias application can be operated.

Figure 34C:
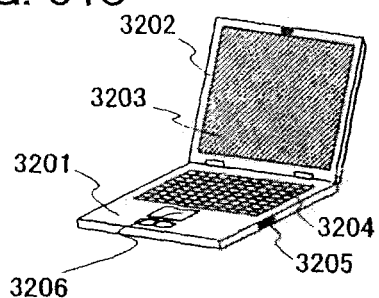

FIG. 34C shows a computer including a main body 3201, a housing 3202, a display area 3203, a keyboard 3204, an external connection port 3205, a pointing mouse 3206, and the like. A display device using a shift register circuit of the present invention can be used for the display area 3203, thereby obtaining a highly reliable computer, which hardly malfunctions even when subjected to noise such as external electromagnetic waves, and in which reverse bias application can be operated.

Figure 34D:
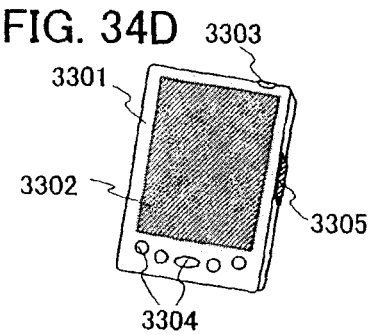

FIG. 34D shows a mobile computer including a main body 3301, a display area 3302, a switch 3303, operation keys 3304, an infrared port 3305, and the like. A display device using a shift register circuit of the present invention can be used for the display area 3302, thereby obtaining a highly reliable mobile computer, which hardly malfunctions even when subjected to noise such as external electromagnetic waves, and in which reverse bias application can be operated.

Figure 34E:
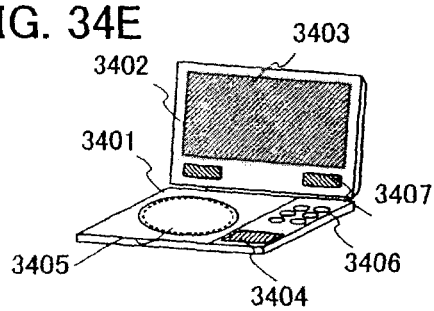

FIG. 34E shows a mobile image reproduction device equipped with a recording medium (DVD, and the like) (specifically, a DVD reproduction device) including a main body 3401, a housing 3402, a display area A 3403, a display area B 3404, a recording-medium reader portion 3405, an operation key 3406, a speaker unit 3407, and the like. The display area A 3403 mainly displays image information, while the display area B 3404 mainly displays text information. A display device using a shift register circuit of the present invention can be used for the display area A3403 and the display area B3404, thereby obtaining a highly reliable image reproduction device, which hardly malfunctions even when subjected to noise such as external electromagnetic waves, and in which reverse bias application can be operated.

Figure 34F:
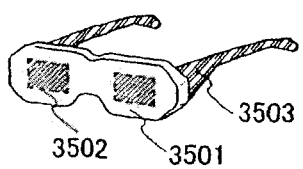

FIG. 34F shows a goggle type display including a main body 3501, a display area 3502, and an arm portion 3503. The goggle type display can be manufactured by applying a display device described in any one of the above embodiment modes to the display area 3502. A display device using a shift register circuit of the present invention can be used for the display area 3502, thereby obtaining a highly reliable goggle type display, which hardly malfunctions even when subjected to noise such as external electromagnetic waves, and in which reverse bias application can be operated.

Figure 34G:
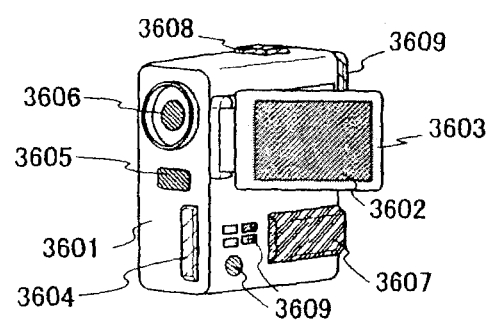

FIG. 34G shows a video camera including a main body 3601, a display area 3602, a housing 3603, an external connection port 3604, a remote controller receiving portion 3605, an image receiving portion 3606, a battery 3607, an audio input portion 3608, operation keys 3609, and the like. A display device using a shift register circuit of the present invention can be used for the display area 3602, thereby obtaining a highly reliable video camera, which hardly malfunctions even when subjected to noise such as external video camera, and in which reverse bias application can be operated.

Figure 34H:
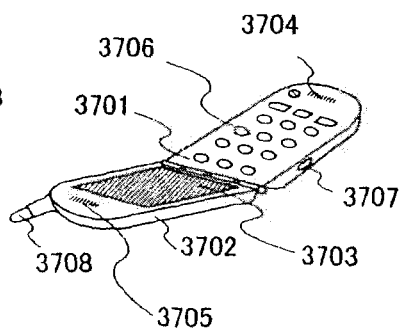

FIG. 34H shows a cellular phone including a main body 3701, a housing 3702, a display area 3703, an audio input portion 3704, an audio output portion 3705, an operation key 3706, an external connection port 3707, an antenna 3708, and the like. A display device using a shift register circuit of the present invention can be used for the display area 3703, thereby obtaining a highly reliable cellular phone, which hardly malfunctions even when subjected to noise such as external cellular phone, and in which reverse bias application can be operated.

Thus, the present invention can be applied to electronic devices in all fields.

This application is based on Japanese Patent Application serial no. 2005-378262 filed in Japan Patent Office on Dec. 28, 2005, the entire contents of which are hereby incorporated by reference.

What is claimed is:

1. A display device comprising:
   a pixel;
   a driving circuit; and
   an input terminal,
   wherein an output terminal of the driving circuit is directly connected to the pixel,
   wherein the driving circuit comprises:
      a first transistor comprising a first gate electrode, a first source electrode and a first drain electrode,
      a second transistor comprising a second gate electrode, a second source electrode and a second drain electrode,
      a third transistor comprising a third gate electrode, a third source electrode and a third drain electrode,
      a fourth transistor comprising a fourth gate electrode, a fourth source electrode and a fourth drain electrode,
      a fifth transistor comprising a fifth gate electrode, a fifth source electrode and a fifth drain electrode,
      a sixth transistor comprising a sixth gate electrode, a sixth source electrode and a sixth drain electrode, and
      a capacitor,
   wherein one of the first source electrode and the first drain electrode of the first transistor is directly connected to the capacitor and the output terminal,
   wherein one of the second source electrode and the second drain electrode of the second transistor is directly connected to the capacitor, the output terminal and the one of the first source electrode and the first drain electrode of the first transistor,
   wherein one of the third source electrode and the third drain electrode of the third transistor is directly connected to the capacitor and the first gate electrode of the first transistor, the other of the third source electrode and the third drain electrode of the third transistor is directly connected to a terminal, and the third gate electrode of the third transistor is directly connected to the second gate electrode of the second transistor,
   wherein one of the fourth source electrode and the fourth drain electrode of the fourth transistor is directly connected to the capacitor and the first gate electrode of the first transistor,
   wherein the fifth gate electrode of the fifth transistor is directly connected to the one of the first source electrode and the first drain electrode of the first transistor, the output terminal and the capacitor, and
   wherein one of the sixth source electrode and the sixth drain electrode of the sixth transistor is directly connected to the other of the second source electrode and the second drain electrode of the second transistor.

2. The display device according to claim 1, wherein the fourth transistor is a rectifying element.

3. The display device according to claim 1, wherein the fourth gate electrode of the fourth transistor is directly connected to the input terminal and the other of the fourth source electrode and the fourth drain electrode of the fourth transistor.

4. The display device according to claim 1, wherein the one of the sixth source electrode and the sixth drain electrode of the sixth transistor are directly connected to the other of the third source electrode and the third drain electrode of the third transistor.

5. The display device according to claim 1, wherein the sixth gate electrode of the sixth transistor is directly connected to the first gate electrode of the first transistor and the capacitor.

6. A display device comprising:
   a pixel;
   a driving circuit; and
   an input terminal,
   wherein an output terminal of the driving circuit is directly connected to the pixel,
   wherein the driving circuit comprises:
      a first transistor comprising a first gate electrode, a first source electrode and a first drain electrode,
      a second transistor comprising a second gate electrode, a second source electrode and a second drain electrode,
      a third transistor comprising a third gate electrode, a third source electrode and a third drain electrode,
      a fourth transistor comprising a fourth gate electrode, a fourth source electrode and a fourth drain electrode,
      a fifth transistor comprising a fifth gate electrode, a fifth source electrode and a fifth drain electrode,
      a sixth transistor comprising a sixth gate electrode, a sixth source electrode and a sixth drain electrode, and
      a capacitor,
   wherein one of the first source electrode and the first drain electrode of the first transistor is directly connected to the capacitor and the output terminal,
   wherein one of the second source electrode and the second drain electrode of the second transistor is directly connected to the capacitor, the output terminal and the one of the first source electrode and the first drain electrode of the first transistor,
   wherein one of the third source electrode and the third drain electrode of the third transistor is directly connected to the capacitor and the first gate electrode of the first transistor, the other of the third source electrode and the third drain electrode of the third transistor is directly connected to an terminal, and the third gate electrode of the third transistor is directly connected to the second gate electrode of the second transistor, wherein one of the fourth source electrode and the fourth drain electrode of the fourth transistor is directly connected to the capacitor and the first gate electrode of the first transistor, wherein the fifth gate electrode of the fifth transistor is directly connected to the one of the first source electrode and the first drain electrode of the first transistor, the output terminal and the capacitor, wherein one of the sixth source electrode and the sixth drain electrode of the sixth transistor is directly connected to the other of the second source electrode and the second drain electrode of the second transistor, and wherein the one of the fifth source electrode and the fifth drain electrode of the fifth transistor is electrically connected to the output terminal.

7. The display device according to claim 6, wherein the fourth transistor is a rectifying element.

8. The display device according to claim 6, wherein the fourth gate electrode of the fourth transistor is directly connected to the input terminal and the other of the fourth source electrode and the fourth drain electrode of the fourth transistor.

9. The display device according to claim 6, wherein the one of the sixth source electrode and the sixth drain electrode of the sixth transistor are directly connected to the other of the sixth source electrode and the sixth drain electrode of the third transistor.

10. The display device according to claim 6, wherein the sixth gate electrode of the sixth transistor is directly connected to the first gate electrode of the first transistor and the capacitor.

11. The display device according to claim 6, wherein one of the fifth source electrode and the fifth drain electrode of the fifth transistor is directly connected to the output terminal.

12. An electronic device comprising:
 a display device comprising:
 a pixel; and
 a driving circuit;
 an input terminal,
 wherein an output terminal of the driving circuit is directly connected to the pixel,
 wherein the driving circuit comprises:
 a first transistor comprising a first gate electrode, a first source electrode and a first drain electrode,
 a second transistor comprising a second gate electrode, a second source electrode and a second drain electrode,
 a third transistor comprising a third gate electrode, a third source electrode and a third drain electrode,
 a fourth transistor comprising a fourth gate electrode, a fourth source electrode and a fourth drain electrode,
 a fifth transistor comprising a fifth gate electrode, a fifth source electrode and a fifth drain electrode,
 a sixth transistor comprising a sixth gate electrode, a sixth source electrode and a sixth drain electrode, and
 a capacitor,
 wherein one of the first source electrode and the first drain electrode of the first transistor is directly connected to the capacitor and the output terminal,
 wherein one of the second source electrode and the second drain electrode of the second transistor is directly connected to the capacitor, the output terminal and the one of the first source electrode and the first drain electrode of the first transistor,
 wherein one of the third source electrode and the third drain electrode of the third transistor is directly connected to the capacitor and the first gate electrode of the first transistor, the other of the third source electrode and the third drain electrode of the third transistor is directly connected to an terminal, and the third gate electrode of the third transistor is directly connected to the second gate electrode of the second transistor,
 wherein one of the fourth source electrode and the fourth drain electrode of the fourth transistor is directly connected to the capacitor and the first gate electrode of the first transistor, wherein the fifth gate electrode of the fifth transistor is directly connected to the one of the first source electrode and the first drain electrode of the first transistor, the output terminal and the capacitor, and
 wherein one of the sixth source electrode and the sixth drain electrode of the sixth transistor is directly connected to the other of the second source electrode and the second drain electrode of the second transistor.

13. The electronic device according to claim 12, wherein the one of the fifth source electrode and the fifth drain electrode of the fifth transistor is electrically connected to the output terminal.

* * * * *